(12) United States Patent
Deng et al.

(10) Patent No.: US 12,448,354 B2
(45) Date of Patent: Oct. 21, 2025

(54) ORGANIC COMPOUND AND APPLICATION THEREOF

(71) Applicants:Wuhan Tianma Microelectronics Co., Ltd., Wuhan (CN); Wuhan Tianma Microelectronics Co., Ltd. Shanghai Branch, Shanghai (CN)

(72) Inventors: Dongyang Deng, Wuhan (CN); YIng Liu, Wuhan (CN)

(73) Assignees: Wuhan Tianma Microelecronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 790 days.

(21) Appl. No.: 17/849,488

(22) Filed: Jun. 24, 2022

(65) Prior Publication Data
US 2022/0359834 A1    Nov. 10, 2022

(30) Foreign Application Priority Data

Jan. 28, 2022   (CN) .......................... 202210107870.3

(51) Int. Cl.
| | | |
|---|---|---|
| *H01L 51/54* | (2006.01) | |
| *C07C 255/51* | (2006.01) | |
| *C07D 213/06* | (2006.01) | |
| *C07D 215/06* | (2006.01) | |
| *C07D 239/26* | (2006.01) | |
| *C07D 239/74* | (2006.01) | |
| *C07D 241/42* | (2006.01) | |
| *C07D 251/24* | (2006.01) | |
| *C07D 403/10* | (2006.01) | |
| *C07D 471/04* | (2006.01) | |
| *H10K 85/60* | (2023.01) | |
| *H10K 50/11* | (2023.01) | |
| *H10K 50/16* | (2023.01) | |
| *H10K 50/18* | (2023.01) | |

(52) U.S. Cl.
CPC .......... *C07D 213/06* (2013.01); *C07C 255/51* (2013.01); *C07D 215/06* (2013.01); *C07D 239/26* (2013.01); *C07D 239/74* (2013.01); *C07D 241/42* (2013.01); *C07D 251/24* (2013.01); *C07D 403/10* (2013.01); *C07D 471/04* (2013.01); *H10K 85/624* (2023.02); *H10K 85/654* (2023.02); *H10K 85/6572* (2023.02); *H10K 50/11* (2023.02); *H10K 50/16* (2023.02); *H10K 50/18* (2023.02)

(58) Field of Classification Search
None
See application file for complete search history.

(56) References Cited

U.S. PATENT DOCUMENTS

2020/0317646 A1 * 10/2020 He .......................... C09K 11/06

FOREIGN PATENT DOCUMENTS

| CN | 102030619 A | 4/2011 |
|---|---|---|
| WO | 2017047993 A1 | 3/2017 |

* cited by examiner

*Primary Examiner* — Andrew K Bohaty
(74) *Attorney, Agent, or Firm* — KDW Firm PLLC

(57) ABSTRACT

Provided are an organic compound and an application thereof. The organic compound has a structure represented by Formula I. Through the design of a molecular structure, the organic compound has suitable HOMO and LUMO energy levels, high singlet energy level, good optoelectronic performance, a high glass transition temperature and good thermal stability, easily forms a good amorphous film, and is suitable for the machining and use of an OLED device. The organic compound, when used in the OLED device, may be used as a light-emitting layer material, an electron transport material or a hole blocking material and especially suitable for use as a host material of the light-emitting layer and can effectively improve the luminescence efficiency of the device, improve the device stability, extend lifetime, and reduce an operating voltage and energy consumption so that the OLED device has significantly improved performance such as luminescence efficiency, lifetime and energy consumption.

18 Claims, 1 Drawing Sheet

ORGANIC COMPOUND AND APPLICATION THEREOF

CROSS-REFERENCE TO RELATED APPLICATION(S)

This application claims priority to Chinese Patent Application No. 202210107870.3 filed Jan. 28, 2022, the disclosure of which is incorporated herein by reference in its entirety.

TECHNICAL FIELD

The present disclosure belongs to the technical field of organic electroluminescent materials and specifically relates to an organic compound and an application thereof.

BACKGROUND

Compared with traditional inorganic electroluminescence technology, organic electroluminescence (OLE) technology, as a new generation of display technology, has the advantages of ultra-thinness, self-luminescence, a wide viewing angle, a fast response, high luminescence efficiency, good temperature adaptability, a simple manufacturing process, a low driving voltage, low energy consumption and the like and has been widely applied to flat-panel display, flexible display, solid-state lighting, in-vehicle display and other industries.

The core of the organic electroluminescence technology lies in organic electroluminescent materials. The organic electroluminescent materials can be divided into electrofluorescence and electrophosphorescence according to a luminescence mechanism, where the electrofluorescence is the radiative decay and transition of singlet excitons while the electrophosphorescence is light emitted during the radiative decay of triplet excitons to a ground state. According to the theory of spin quantum statistics, singlet excitons and triplet excitons are formed at a ratio of 1:3. An electrofluorescent material has an internal quantum efficiency lower than or equal to 25% and an external quantum efficiency which is generally lower than 5%. An electrophosphorescent material has an internal quantum efficiency of 100% in theory and an external quantum efficiency which can reach 20%. In 1998, Prof. Ma Yuguang of Jilin University and Prof. Forrest of Princeton University, USA, reported that an osmium complex and a platinum complex were doped as dyes into a light-emitting layer separately. They have successfully discovered and explained the phenomenon of phosphorescent electroluminescence for the first time and pioneered the application of the prepared phosphorescent material to an organic electroluminescent device (an organic light-emitting diode (OLED) device).

Since a phosphorescent heavy metal material has a relatively long lifetime which can reach the level of μs, the phosphorescent heavy metal material may cause triplet-triplet annihilation and concentration quenching at a high current density, resulting in the degradation of device performance. Therefore, the phosphorescent heavy metal material is generally doped into a suitable host material to form a host-guest doping system, so as to optimize energy transfer and maximize luminescence efficiency and a lifetime. In the current research, the commercialization of heavy metal doping materials is mature and it is difficult to develop alternative doping materials. Therefore, it is a common idea among researchers to focus on the development of high-performance host materials.

With the continuous development of display technology, higher requirements are imposed on the optoelectronic properties of OLED devices. However, the host materials currently used still have many disadvantages in terms of luminescence performance, stability, service life and machinability and can hardly meet the performance requirements of high-performance OLED devices. Therefore, it is an urgent problem to be solved in the art to develop more types of organic electroluminescent materials having higher performance.

SUMMARY

To develop more types of organic electroluminescent materials having higher performance, a first aspect of the present disclosure is to provide an organic compound. The organic compound has a structure represented by Formula I:

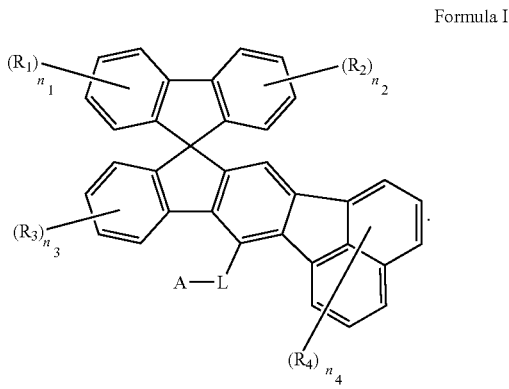

Formula I

In Formula I, L is selected from any one of a single bond, substituted or unsubstituted C6 to C30 arylene, or substituted or unsubstituted C3 to C30 heteroarylene.

In Formula I, A is selected from any one of substituted or unsubstituted C6 to C30 aryl, substituted or unsubstituted C3 to C30 heteroaryl, substituted or unsubstituted C6 to C30 arylketonyl, substituted or unsubstituted C6 to C30 arylsulfonyl, or substituted or unsubstituted C6 to C30 arylboryl.

In Formula I, $R_1$, $R_2$, $R_3$ and $R_4$ are each independently selected from any one of halogen, cyano, substituted or unsubstituted C1 to C30 linear or branched alkyl, substituted or unsubstituted C3 to C30 cycloalkyl, substituted or unsubstituted C1 to C30 alkoxy, substituted or unsubstituted C6 to C30 aryl, substituted or unsubstituted C3 to C30 heteroaryl, or substituted or unsubstituted C6 to C30 arylamino.

In Formula I, $n_1$, $n_2$ and $n_3$ are each independently selected from an integer from 0 to 4, for example, may be 0, 1, 2, 3 or 4.

In Formula I, $n_4$ is selected from an integer from 0 to 6, for example, may be 0, 1, 2, 3, 4, 5 or 6.

The organic compound provided by the present disclosure has the structure represented by Formula I. Through the special design of a molecular structure, the organic compound has suitable HOMO and LUMO energy levels, a relatively high singlet energy level, good optoelectronic performance, a relatively high glass transition temperature and good thermal stability, easily forms a good amorphous film, and is suitable for the machining and use of an OLED device. The organic compound, when used in the OLED device, may be used as a material of a light-emitting layer, an electron transport material or a hole blocking material and especially suitable for use as a host material of the light-emitting layer and can match an energy level of a material of an adjacent layer, effectively transport electrons, and confine holes and excitons in a light-emitting region, which is conducive to widening the light-emitting region, improving the luminescence efficiency and lifetime of the device, and reducing the voltage and energy consumption of the device.

In the present disclosure, the halogen may be F, Cl, Br or I.

In the present disclosure, C6 to C30 may each be C6, C8, C9, C10, C12, C13, C14, C15, C16, C18, C20, C22, C24, C26 or C28, etc.

In the present disclosure, C3 to C30 may each be C3, C4, C5, C6, C8, C9, C10, C12, C13, C14, C15, C16, C18, C20, C22, C24, C26 or C28, etc.

In the present disclosure, C1 to C30 may each be C1, C2, C3, C4, C5, C6, C8, C9, C10, C12, C13, C14, C15, C16, C18, C20, C22, C24, C26 or C28, etc.

A second aspect of the present disclosure is to provide an OLED device. The OLED device includes an anode, a cathode and an organic thin film layer disposed between the anode and the cathode, wherein the organic thin film layer includes at least one of the organic compounds as described for the first aspect.

A third aspect of the present disclosure is to provide a display panel. The display panel includes the OLED device as described for the second aspect.

A fourth aspect of the present disclosure is to provide an electronic apparatus. The electronic apparatus includes at least one of the OLED device as described for the second aspect or the display panel as described for the third aspect.

Figure 1:
FIG. 1 is a structure diagram of an OLED device according to an embodiment of the present disclosure.

REFERENCE LIST 110 anode
120 first organic thin film layer
121 first hole transport layer
122 second hole transport layer
130 light-emitting layer
140 second organic thin film layer
141 first electron transport layer
142 second electron transport layer
150 cathode
160 substrate
170 capping layer

DETAILED DESCRIPTION

Technical solutions of the present disclosure are further described below through embodiments. It is to be understood by those skilled in the art that the embodiments described herein are used for a better understanding of the present disclosure and are not to be construed as specific limitations to the present disclosure.

In an embodiment, the present disclosure provides an organic compound, wherein the organic compound has a structure represented by Formula I:

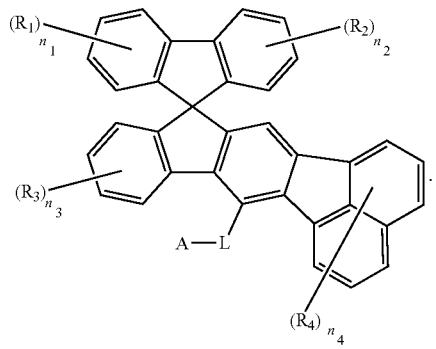

Formula I

In Formula I, L is selected from any one of a single bond, substituted or unsubstituted C6 to C30 arylene, or substituted or unsubstituted C3 to C30 heteroarylene; when L is a single bond, it indicates that the group A is directly joined to the skeletal structure by the single bond.

In Formula I, A is selected from any one of substituted or unsubstituted C6 to C30 aryl, substituted or unsubstituted C3 to C30 heteroaryl, substituted or unsubstituted C6 to C30 arylketonyl, substituted or unsubstituted C6 to C30 arylsulfonyl, or substituted or unsubstituted C6 to C30 arylboryl.

In Formula I, $R_1$, $R_2$, $R_3$ and $R_4$ are each independently selected from any one of halogen, cyano, substituted or unsubstituted C1 to C30 linear or branched alkyl, substituted or unsubstituted C3 to C30 cycloalkyl, substituted or unsubstituted C1 to C30 alkoxy, substituted or unsubstituted C6 to C30 aryl, substituted or unsubstituted C3 to C30 heteroaryl, or substituted or unsubstituted C6 to C30 arylamino.

In Formula I, $n_1$, $n_2$ and $n_3$ are each independently selected from an integer from 0 to 4, for example, may be 0, 1, 2, 3 or 4.

In Formula I, $n_4$ is selected from an integer from 0 to 6, for example, may be 0, 1, 2, 3, 4, 5 or 6.

The organic compound provided by the present disclosure has the structure represented by Formula I and uses a spiro-containing macrocyclic structure as the central skeleton collocated with the group A (where A is joined to the central skeleton by L which is used as Linker) and optionally compounded with $R_1$, $R_2$, $R_3$ and $R_4$ so that the organic compound has suitable HOMO and LUMO energy levels, a relatively high singlet energy level ($E_S$>2.75 eV) and good optoelectronic performance. The organic compound, when used in an OLED device, may be used as a material of a light-emitting layer, an electron transport material or a hole blocking material and especially suitable for use as a host material of the light-emitting layer and can match an energy level of a material of an adjacent layer, effectively transport electrons, and confine holes and excitons in a light-emitting region, which is conducive to widening the light-emitting region, improving the luminescence efficiency of the OLED device, significantly extend a service life, and reducing an operating voltage and energy consumption.

Specifically, through the design of a molecular structure, the organic compound has a relatively deep LUMO energy level which is conducive to the smooth injection of electrons, thereby reducing the operating voltage of the device; the organic compound has a suitable HOMO energy level and can block holes and confine the holes in the light-emitting region so that the holes are recombined with electrons, which is conducive to widening a light-emitting recombination region and improving the luminescence efficiency of the device. Moreover, the organic compound has good thermal stability and film formability and easily forms a good amorphous film, which is conducive to improving the stability of the device and extending the lifetime of the device.

In the present disclosure, the halogen may be F, Cl, Br or I.

In the present disclosure, the expression of Ca to Cb means that the number of carbon atoms in the group is a to b. Unless otherwise specified, the number of carbon atoms does not include the number of carbon atoms in a substituent.

In the present disclosure, C6 to C30 may each be C6, C8, C9, C10, C12, C13, C14, C15, C16, C18, C20, C22, C24, C26 or C28, etc.

In the present disclosure, the description of a chemical element includes the concept of isotopes with the same chemical property. For example, hydrogen (H) includes $^1$H (protium), $^2$H (deuterium, D) and $^3$H (tritium, T), etc.; carbon (C) includes $^{12}$C and $^{13}$C, etc.

In the present disclosure, C3 to C30 may each be C3, C4, C5, C6, C8, C9, C10, C12, C13, C14, C15, C16, C18, C20, C22, C24, C26 or C28, etc.

In the present disclosure, C1 to C30 may each be C1, C2, C3, C4, C5, C6, C8, C9, C10, C12, C13, C14, C15, C16, C18, C20, C22, C24, C26 or C28, etc.

Specifically, the C6 to C30 aryl may be C6, C8, C9, C10, C12, C13, C14, C15, C16, C18, C20, C22, C24, C26 or C28 aryl or other aryl groups. The C6 to C30 aryl exemplarily includes, but is not limited to, phenyl, biphenyl, terphenyl, naphthyl, anthryl, phenanthryl, indenyl, fluorenyl and its derivatives (such as 9,9-dimethylfluorenyl, 9,9-diethylfluorenyl, 9,9-diphenylfluorenyl, 9,9-dinaphthylfluorenyl, spirobifluorenyl and benzofluorenyl), fluoranthenyl, triphenylene, pyrenyl, perylenyl, chrysenyl or naphthacenyl, etc.

The C3 to C30 heteroaryl may be C3, C4, C5, C6, C8, C9, C10, C12, C13, C14, C15, C16, C18, C20, C22, C24, C26 or C28 heteroaryl and other heteroaryl groups, wherein a heteroatom in the heteroaryl group includes O, S, N, P or B, etc. The C3 to C30 heteroaryl exemplarily includes, but is not limited to, furyl, thienyl, pyrrolyl, pyridyl, pyrazinyl, pyridazinyl, pyrimidinyl, triazinyl, quinolinyl, isoquinolinyl, quinazolinyl, quinoxalinyl, cinnolinyl, o-phenanthrolinyl, imidazolyl, thiazolyl, oxazolyl, benzimidazolyl, benzothiazolyl, benzoxazolyl, benzofuryl, benzothienyl, indolyl, dibenzofuryl, dibenzothienyl, carbazolyl and its derivatives (such as N-phenylcarbazolyl, N-naphthylcarbazolyl, benzocarbazolyl, dibenzocarbazolyl, indolocarbazolyl and azacarbazolyl) and the like.

A specific example of the C6 to C30 (for example, C6, C9, C10, C12, C14, C16, C18, C20, C22, C24, C26 or C28, etc.) arylene in the present disclosure may be a divalent group obtained after one hydrogen atom is removed from the preceding aryl group. A specific example of the C3 to C30 (for example, C3, C4, C5, C6, C9, C10, C12, C14, C16, C18, C20, C22, C24, C26 or C28, etc.) heteroarylene may be a divalent group obtained after one hydrogen atom is removed from the preceding heteroaryl group.

In the present disclosure, specific examples of the C6 to C30 (for example, C6, C9, C10, C12, C14, C16, C18, C20, C22, C24, C26 or C28, etc.) arylketonyl are monovalent groups formed by joined

to the aryl groups listed above. Specific examples of the C6 to C30 (for example, C6, C9, C10, C12, C14, C16, C18, C20, C22, C24, C26 or C28, etc.) arylsulfonyl are monovalent groups formed by joining

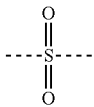

to the aryl groups listed above. The dashed line represents a linkage site of group.

In the present disclosure, specific examples of the C6 to C30 (for example, C6, C9, C10, C12, C14, C16, C18, C20, C22, C24, C26 or C28, etc.) arylboryl are monovalent groups formed by substituting at least one H in —BH$_3$ with the aryl groups listed above. Specific examples of the C6 to C30 (for example, C6, C9, C10, C12, C14, C16, C18, C20, C22, C24, C26 or C28, etc.) arylamino are monovalent groups formed by substituting at least one H in —NH$_3$ with the aryl groups listed above.

In the present disclosure, the C1 to C30 linear or branched alkyl may be C1, C2, C3, C4, C5, C6, C8, C9, C10, C12, C13, C14, C15, C16, C18, C20, C22, C24, C26 or C28 linear or branched alkyl or other linear or branched alkyl groups. The C1 to C30 linear or branched alkyl exemplarily includes, but is not limited to, methyl, ethyl, n-propyl, isopropyl, n-butyl, isobutyl, tert-butyl, n-pentyl, isopentyl, neopentyl, n-hexyl, n-octyl, n-heptyl, n-nonyl and n-decyl, etc.

Specific examples of the C1 to C30 (for example, C1, C2, C3, C4, C5, C6, C8, C9, C10, C12, C13, C14, C15, C16, C18, C20, C22, C24, C26 or C28, etc.) alkoxy are monovalent groups formed by joining O to the linear or branched alkyl groups listed above.

In the present disclosure, the C3 to C30 cycloalkyl may be C3, C4, C5, C6, C8, C9, C10, C12, C13, C14, C15, C16, C18, C20, C22, C24, C26 or C28 cycloalkyl or other cycloalkyl group. The C3 to C30 cycloalkyl exemplarily includes, but is not limited to, cyclopropyl, cyclobutyl, cyclopentyl, cyclohexyl and adamantyl, etc.

In the present disclosure, $n_1$, $n_2$, $n_3$ and $n_4$ represent the number of substituents $R_1$, $R_2$, $R_3$ and $R_4$, respectively; when each of $n_1$, $n_2$, $n_3$ and $n_4$ is an integer greater than or equal to 2, multiple (at least two) substituents are the same group or different groups.

In the present disclosure, the "substituted or unsubstituted" group may include one substituent or multiple substituents. In the presence of multiple (at least two) substituents, the multiple (at least two) substituents are the same group or different groups; where the substituent may be joined at any position of the group where the substituent can be joined. The same expressions involved below all have the same meanings.

In an embodiment, the substituted substituents in L, A, $R_1$, $R_2$, $R_3$ and $R_4$ are each independently selected from at least one of halogen, cyano, unsubstituted or R'-substituted C1 to C10 (for example, C1, C2, C3, C4, C5, C6, C7, C8, C9 or C10) linear or branched alkyl, C3 to C10 (for example, C3, C4, C5, C6, C7, C8, C9 or C10) cycloalkyl, unsubstituted or R'-substituted C1 to C10 (for example, C1, C2, C3, C4, C5, C6, C7, C8, C9 or C10) alkoxy, unsubstituted or R'-substituted C6 to C20 (for example, C6, C9, C10, C12, C14, C16 or C18, etc.) aryl, unsubstituted or R'-substituted C3 to C20 (for example, C3, C4, C5, C6, C9, C10, C12, C14, C16 or C18, etc.) heteroaryl, or unsubstituted or R'-substituted C6 to C20 (for example, C6, C9, C10, C12, C14, C16 or C18, etc.) arylamino; and wherein, R' is selected from at least one of halogen, cyano, C1 to C6 (for example, C1, C2, C3, C4, C5 or C6) linear or branched alkyl, C6 to C12 (for example, C6, C9, C10 or C12, etc.) aryl or C3 to C12 (for example, C3, C4, C5, C6, C9, C10 or C12, etc.) heteroaryl.

In an embodiment, L is selected from any one of a single bond, substituted or unsubstituted C6 to C20 (for example, C6, C9, C10, C12, C14, C16 or C18, etc.) arylene, or substituted or unsubstituted C3 to C20 (for example, C3, C4, C5, C6, C9, C10, C12, C14, C16 or C18, etc.) heteroarylene; and wherein, the substituted substituents in L are each independently selected from at least one of cyano, unsubstituted or halogenated C1 to C6 (for example, C1, C2, C3, C4, C5 or C6) linear or branched alkyl, C6 to C12 (for example, C6, C9, C10 or C12, etc.) aryl or C3 to C12 (for example, C3, C4, C5, C6, C9, C10 or C12, etc.) heteroaryl.

In an embodiment, L is selected from any one of a single bond,

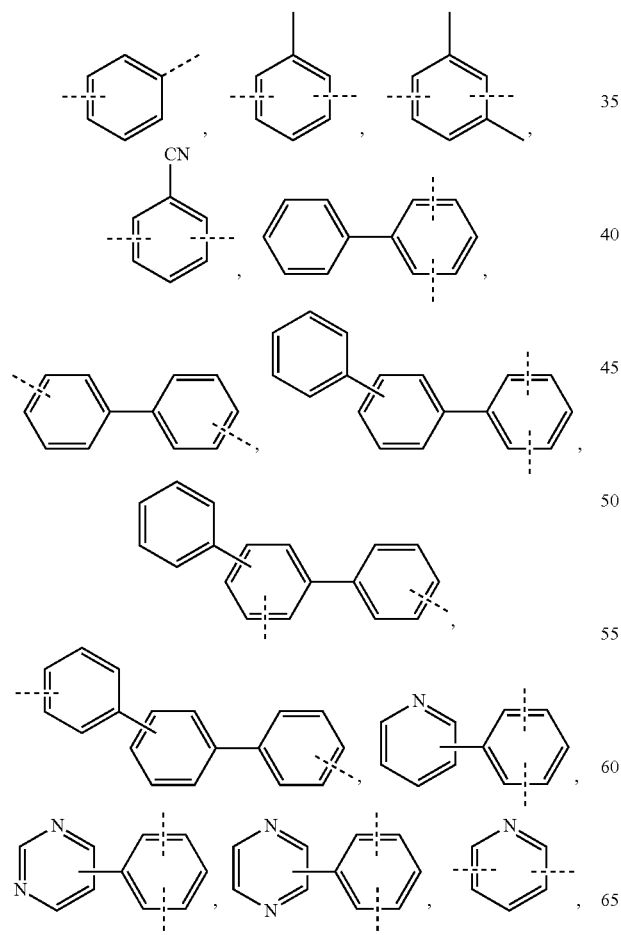

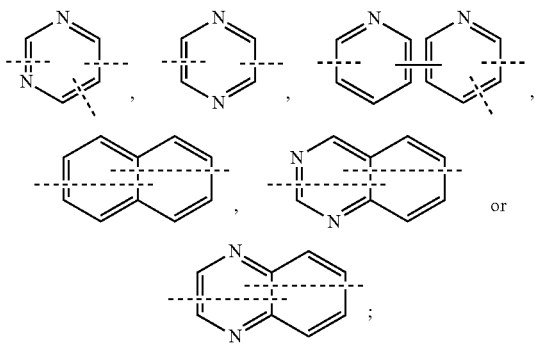

wherein the dashed line represents a linkage site of the group.

In an embodiment, A is selected from any one of the following groups:

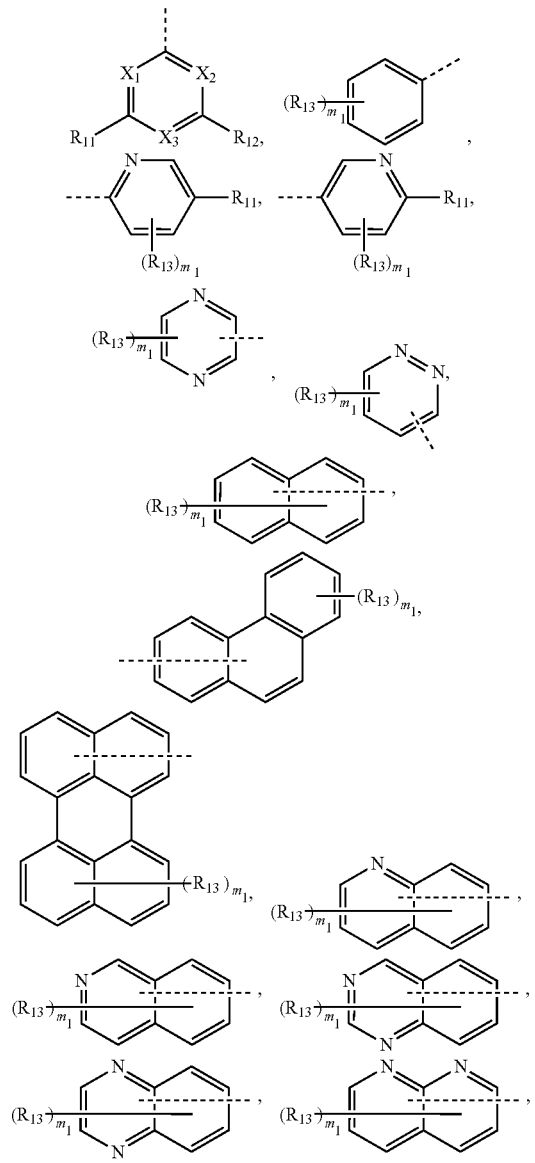

-continued

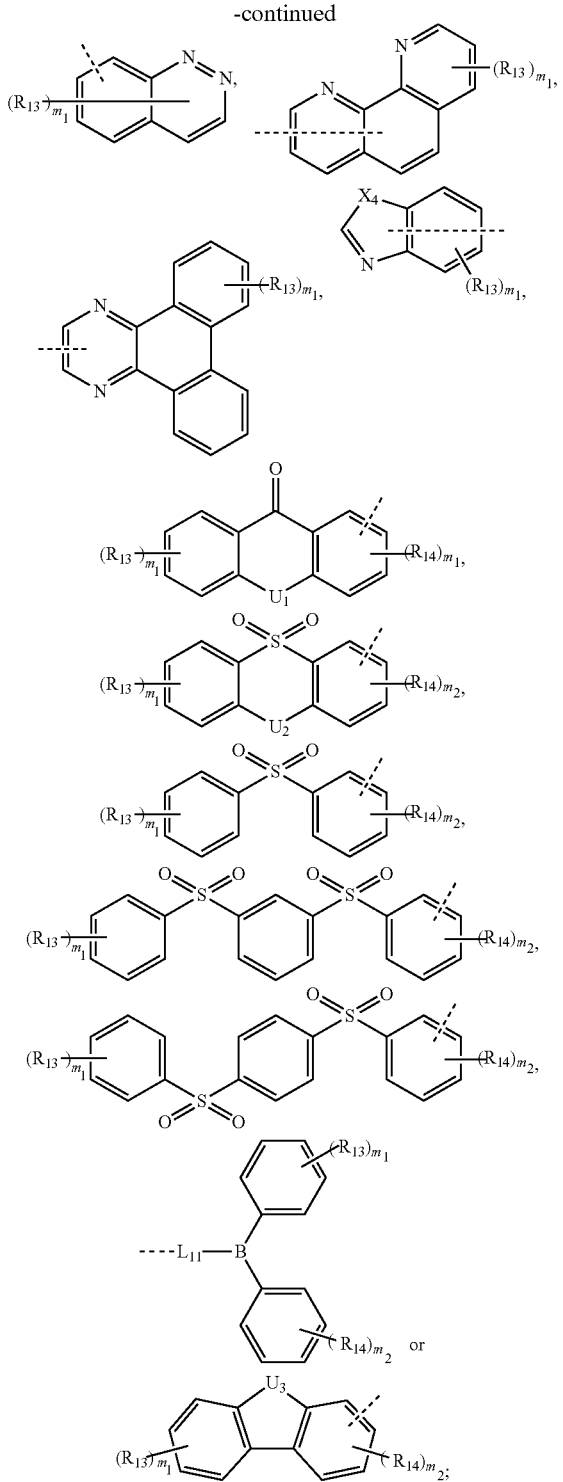

wherein, the dashed line represents a linkage site of the group;

wherein, $R_{11}$ and $R_{12}$ are each independently selected from any one of hydrogen, halogen, cyano, unsubstituted or R'-substituted C1 to C10 (for example, C1, C2, C3, C4, C5, C6, C7, C8, C9 or C10) linear or branched alkyl, C3 to C10 (for example, C3, C4, C5, C6, C7, C8, C9 or C10) cycloalkyl, unsubstituted or R'-substituted C1 to C10 (for example, C1, C2, C3, C4, C5, C6, C7, C8, C9 or C10) alkoxy, unsubstituted or R'-substituted C6 to C20 (for example, C6, C9, C10, C12, C14, C16 or C18, etc.) aryl, or unsubstituted or R'-substituted C3 to C20 (for example, C3, C4, C5, C6, C9, C10, C12, C14, C16 or C18, etc.) heteroaryl;

$R_{13}$ and $R_{14}$ are each independently selected from any one of halogen, cyano, unsubstituted or R'-substituted C1 to C10 (for example, C1, C2, C3, C4, C5, C6, C7, C8, C9 or C10) linear or branched alkyl, C3 to C10 (for example, C3, C4, C5, C6, C7, C8, C9 or C10) cycloalkyl, unsubstituted or R'-substituted C1 to C10 (for example, C1, C2, C3, C4, C5, C6, C7, C8, C9 or C10) alkoxy, unsubstituted or R'-substituted C6 to C20 (for example, C6, C9, C10, C12, C14, C16 or C18, etc.) aryl, or unsubstituted or R'-substituted C3 to C20 (for example, C3, C4, C5, C6, C9, C10, C12, C14, C16 or C18, etc.) heteroaryl;

R' is selected from at least one of halogen, cyano, C1 to C6 (for example, C1, C2, C3, C4, C5 or C6) linear or branched alkyl, C6 to C12 (for example, C6, C9, C10 or C12, etc.) aryl or C3 to C12 (for example, C3, C4, C5, C6, C9, C10 or C12, etc.) heteroaryl;

$U_1$ is

or $CR_{15}R_{16}$;

$U_2$ is $CR_{15}R_{16}$,

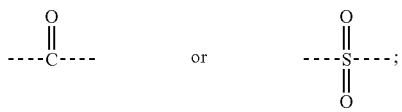

$U_3$ is O, S or $NR_{17}$;

$R_{15}$, $R_{16}$ and $R_{17}$ are each independently selected from any one of C1 to C10 (for example, C1, C2, C3, C4, C5, C6, C7, C8, C9 or C10) linear or branched alkyl, C6 to C20 (for example, C6, C9, C10, C12, C14, C16 or C18, etc.) aryl or C3 to C20 (for example, C3, C4, C5, C6, C9, C10, C12, C14, C16 or C18, etc.) heteroaryl;

$L_{11}$ is selected from any one of a single bond or C6 to C20 (for example, C6, C9, C10, C12, C14, C16 or C18, etc.) arylene; when $L_{11}$ is a single bond, it indicates that the atom B is directly joined to L in Formula I; and $m_1$ and $m_2$ are each independently selected from an integer from 0 to 3, for example, may be 0, 1, 2 or 3.

In an embodiment, $R_{11}$ and $R_{12}$ are each independently selected from any one of hydrogen, cyano, C1 to C6 (for example, C1, C2, C3, C4, C5 or C6) linear or branched alkyl, unsubstituted or R'-substituted phenyl, unsubstituted or R'-substituted naphthyl, unsubstituted or R'-substituted pyridyl, unsubstituted or R'-substituted pyrimidinyl, unsubstituted or R'-substituted pyrazinyl, unsubstituted or R'-substituted quinolinyl, unsubstituted or R'-substituted isoquinolinyl, unsubstituted or R'-substituted quinoxalinyl, or unsubstituted or R'-substituted quinazolinyl; wherein R' is selected from at least one of cyano, C1 to C6 (for example, C1, C2, C3, C4, C5 or C6) linear or branched alkyl, phenyl, pyridyl, pyrimidinyl or pyrazinyl.

In an embodiment, A is an electron withdrawing group and exemplarily includes, but is not limited to, C6 to C30 aryl containing a halogenated group and/or cyano, substituted or unsubstituted C3 to C30 heteroaryl containing N, substituted or unsubstituted C6 to C30 arylketonyl, substituted or unsubstituted C6 to C30 arylsulfonyl, or substituted or unsubstituted C6 to C30 arylboryl.

In another embodiment, A is an electron donating group and exemplarily includes, but is not limited to, carbazolyl and its derivatives (such as N-phenylcarbazolyl, N-naphthylcarbazolyl, benzocarbazolyl, dibenzocarbazolyl or indolocarbazolyl, etc.), dibenzofuryl, dibenzothienyl and the like.

In an embodiment, A is selected from any one of the following groups:

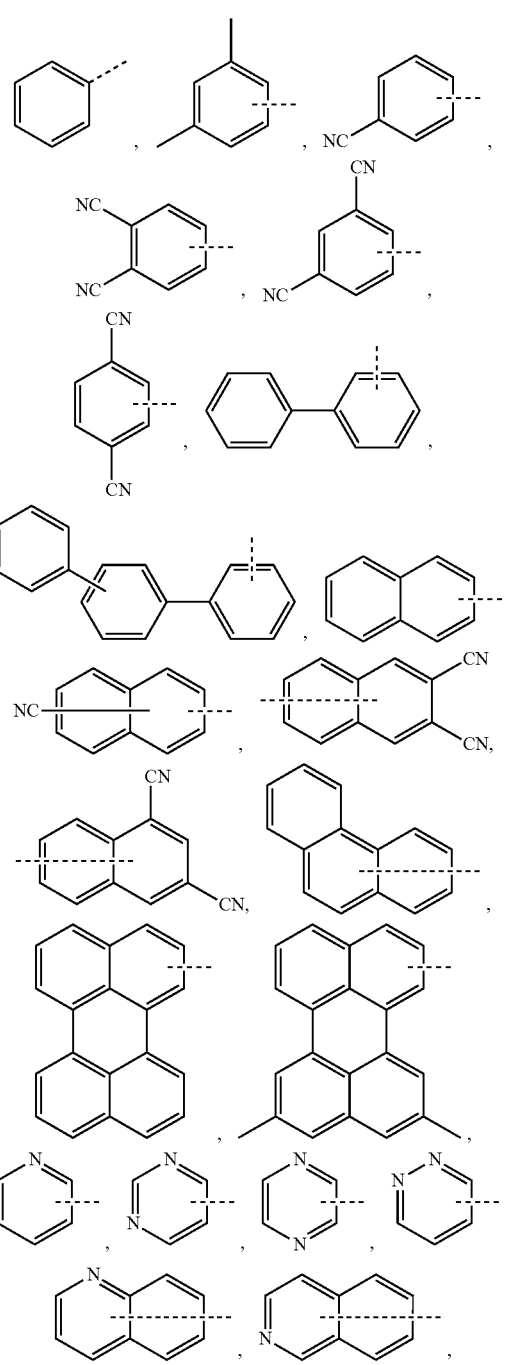

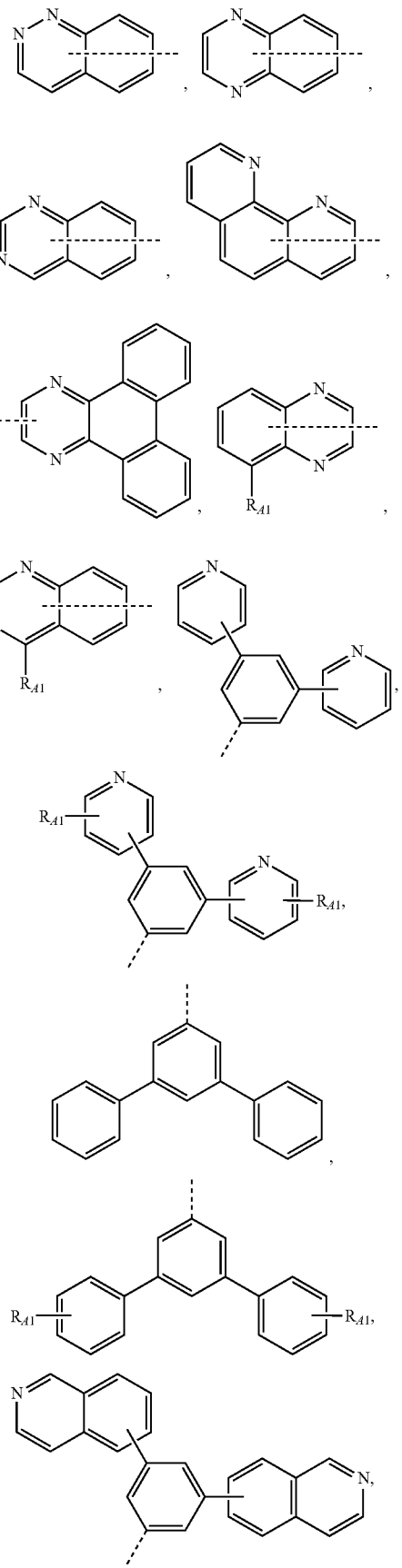

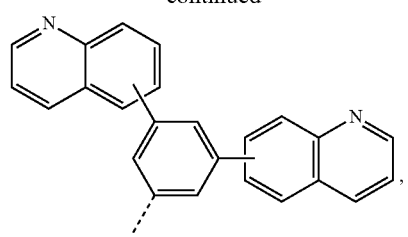
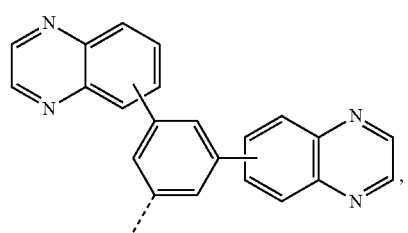
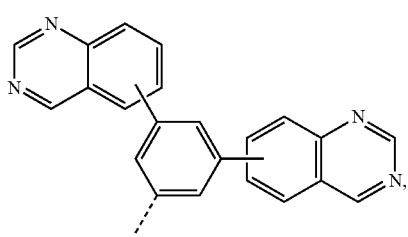
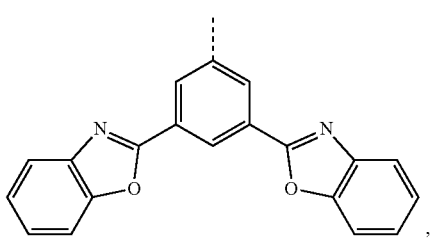
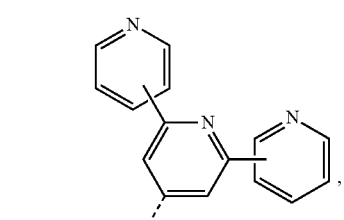
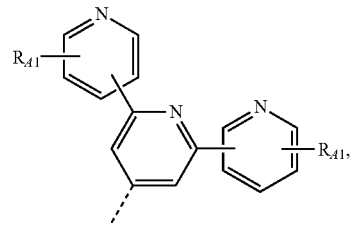
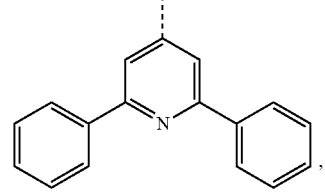
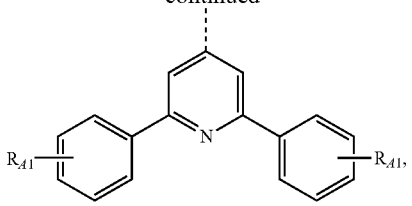
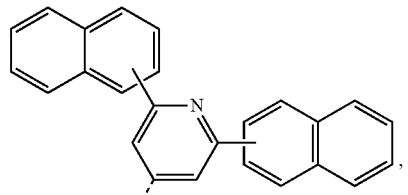
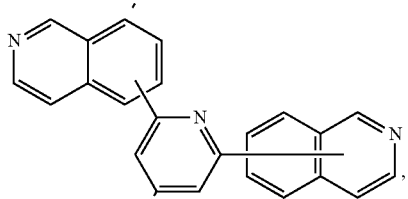
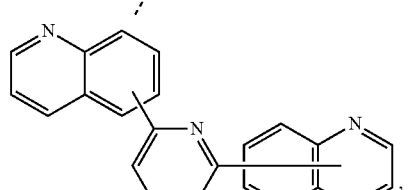
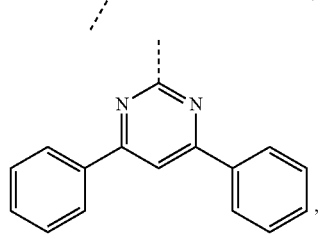
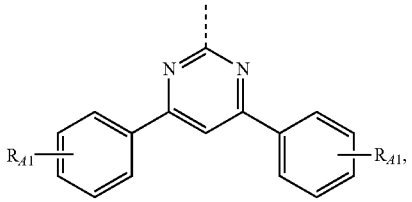
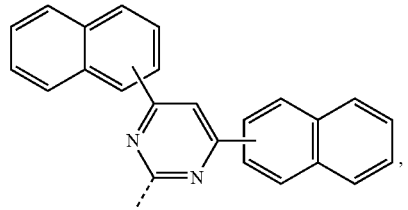
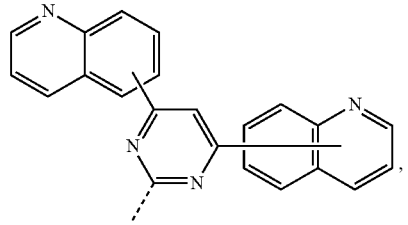

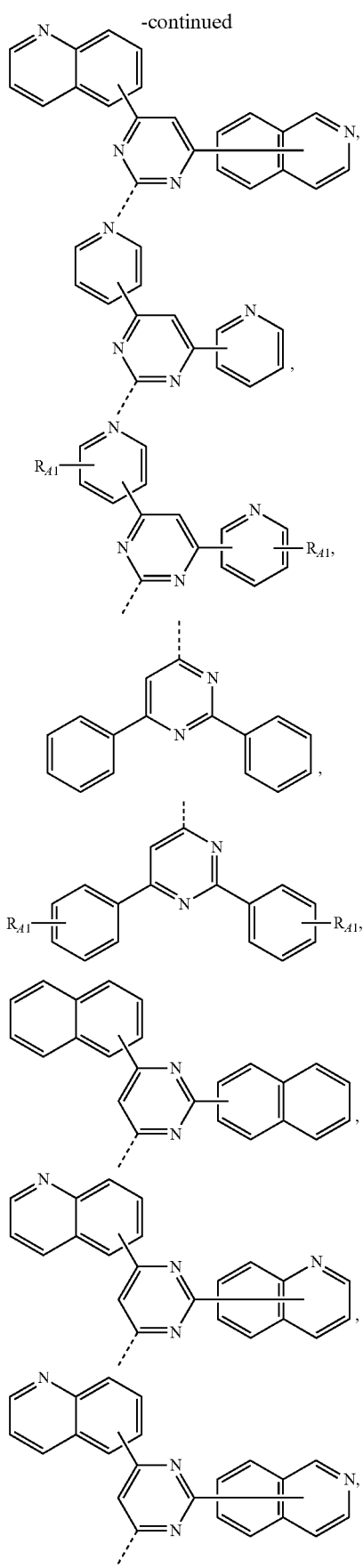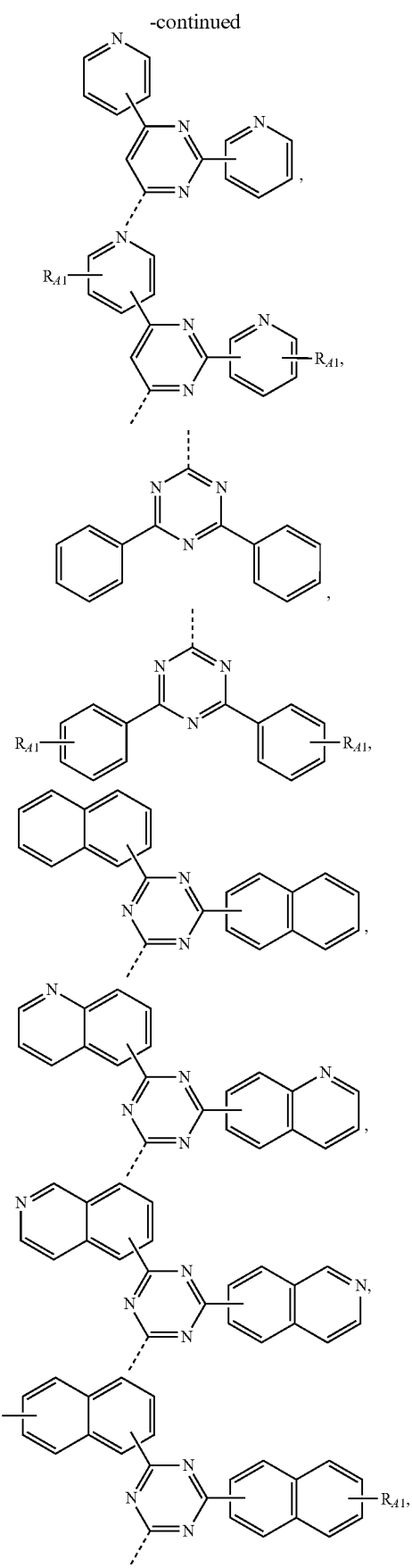

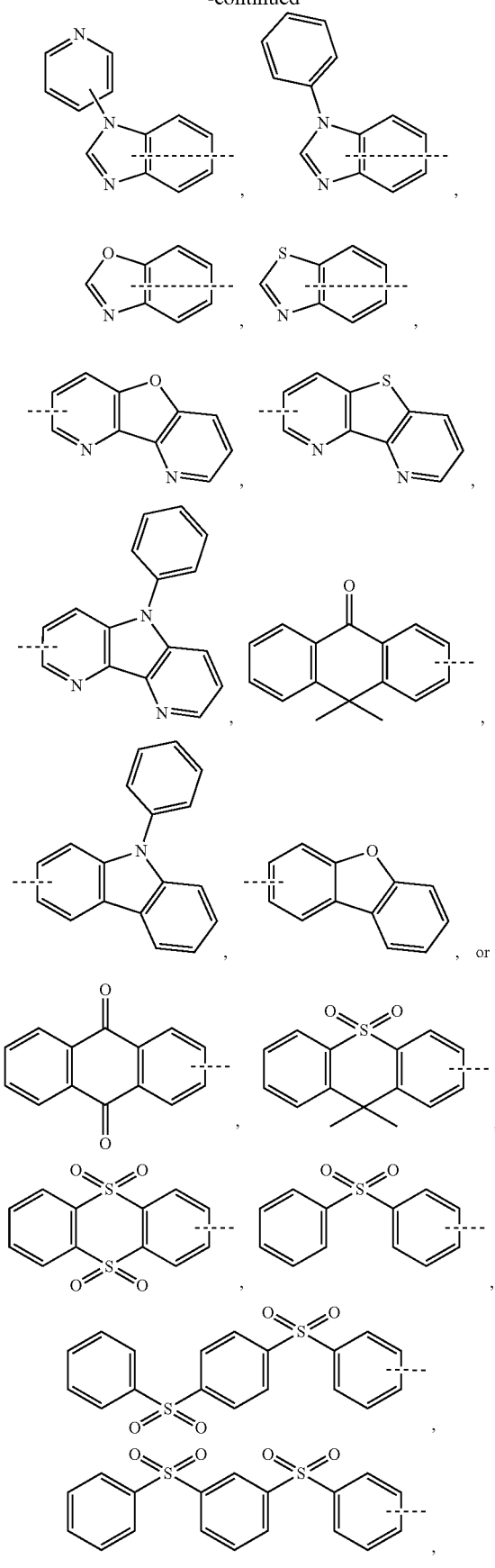

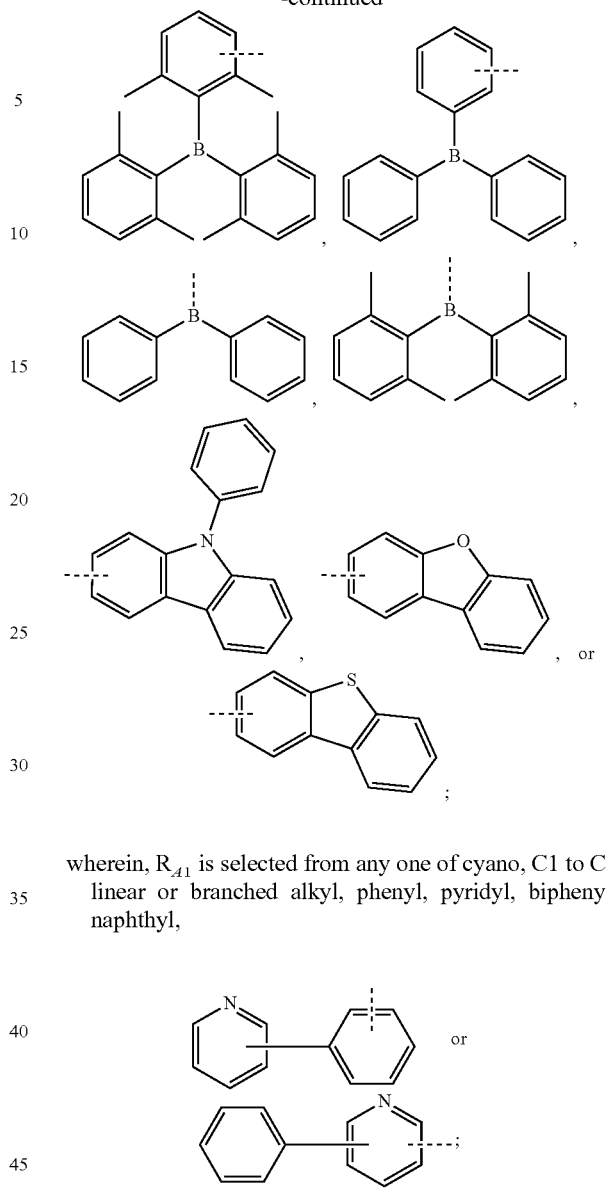

wherein, $R_{A1}$ is selected from any one of cyano, C1 to C6 linear or branched alkyl, phenyl, pyridyl, biphenyl, naphthyl,

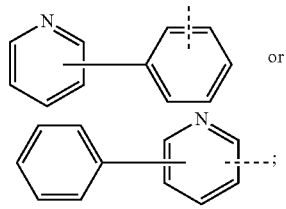

and the dashed line represents a linkage site of the group.

In an embodiment, $R_1$, $R_2$, $R_3$ and $R_4$ are each independently selected from any one of unsubstituted or halogenated C1 to C10 (for example, C1, C2, C3, C4, C5, C6, C7, C8, C9 or C10) linear or branched alkyl, C3 to C10 (for example, C3, C4, C5, C6, C7, C8, C9 or C10) cycloalkyl, unsubstituted or halogenated C1 to C10 (for example, C1, C2, C3, C4, C5, C6, C7, C8, C9 or C10) alkoxy, substituted or unsubstituted C6 to C20 (for example, C6, C9, C10, C12, C14, C16 or C18, etc.) aryl, substituted or unsubstituted C3 to C20 (for example, C3, C4, C5, C6, C9, C10, C12, C14, C16 or C18, etc.) heteroaryl, or substituted or unsubstituted C6 to C20 (for example, C6, C9, C10, C12, C14, C16 or C18, etc.) arylamino.

Substituents in the substituted aryl and the substituted heteroaryl are each independently selected from at least one of halogen, cyano or unsubstituted or halogenated C1 to C10 (for example, C1, C2, C3, C4, C5, C6, C7, C8, C9 or C10) linear or branched alkyl.

In an embodiment, $R_1$, $R_2$, $R_3$ and $R_4$ are each independently selected from any one of unsubstituted or halogenated C1 to C10 (for example, C1, C2, C3, C4, C5, C6, C7, C8, C9 or C10) linear or branched alkyl, C3 to C10 (for example, C3, C4, C5, C6, C7, C8, C9 or C10) cycloalkyl, unsubstituted or halogenated C1 to C10 (for example, C1, C2, C3, C4, C5, C6, C7, C8, C9 or C10) alkoxy, phenyl, naphthyl, biphenyl, pyridyl, carbazolyl or diphenylamino.

In an embodiment, $n_1$, $n_2$, $n_3$ and $n_4$ are each independently selected from an integer from 0 to 2, for example, 0, 1 or 2.

In an embodiment, the organic compound is selected from any one of the following compounds P1 to P163:

P1
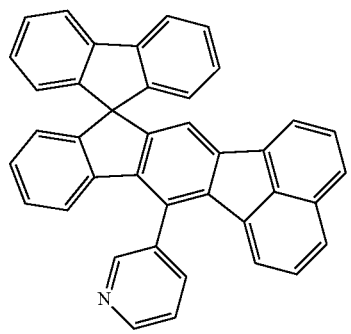

P2
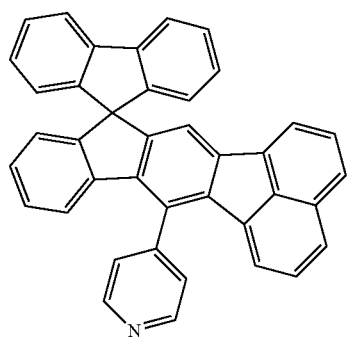

P3
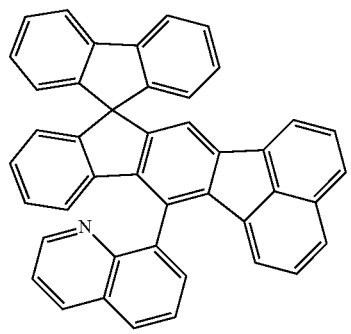

P4
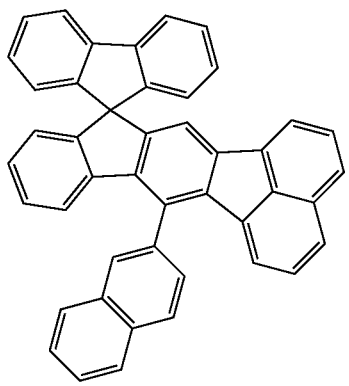

P5
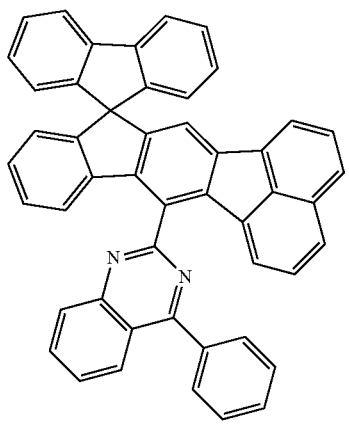

P6
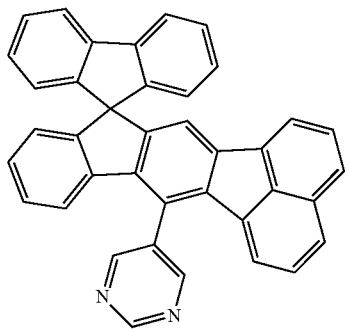

P7
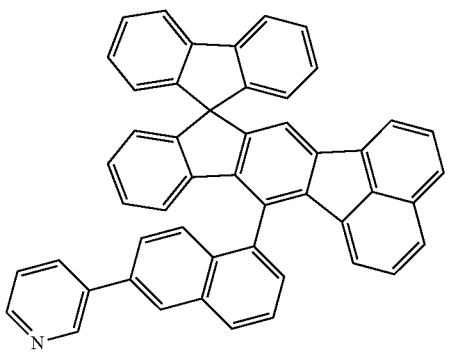

-continued
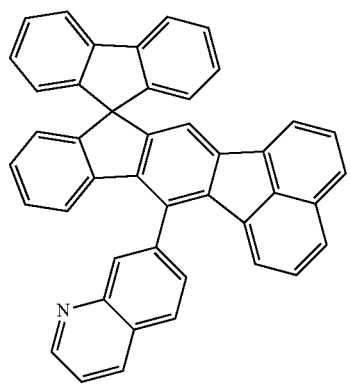
P8
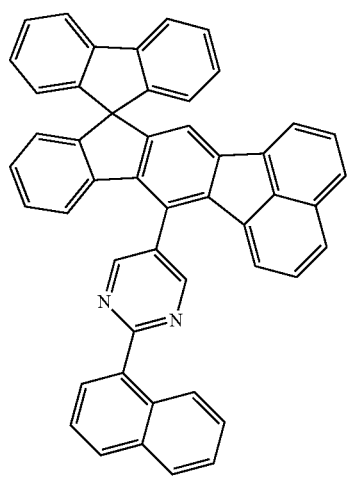
P9
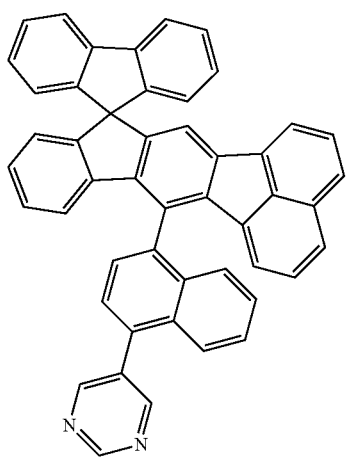
P10
-continued
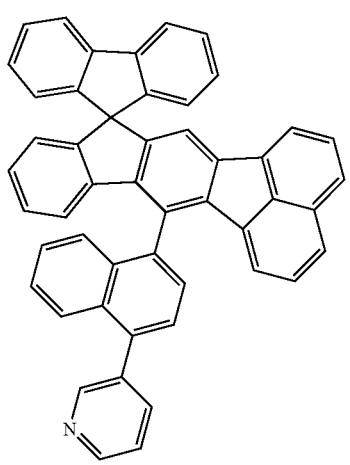
P11
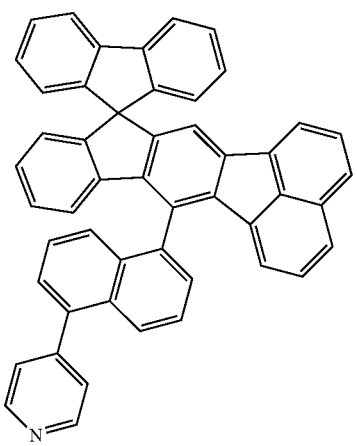
P12
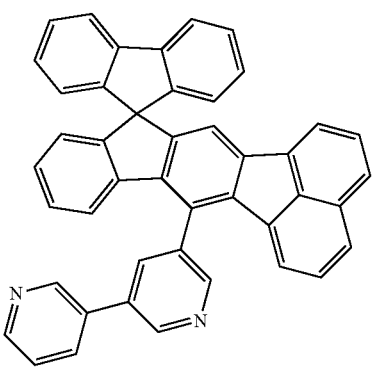
P13

P14
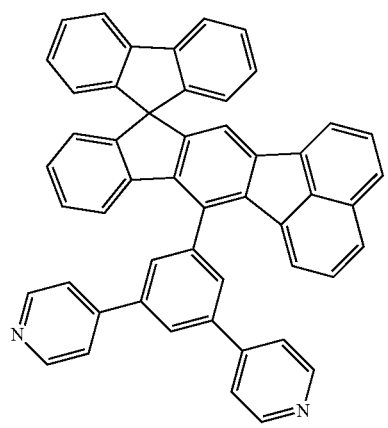
P15
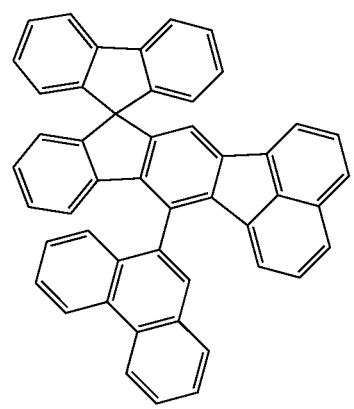
P16
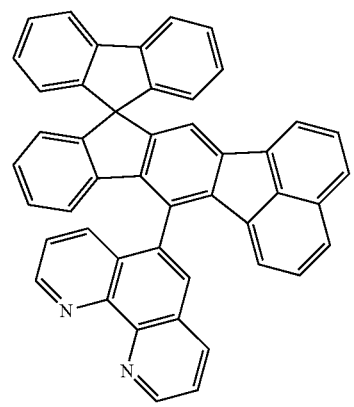
P17
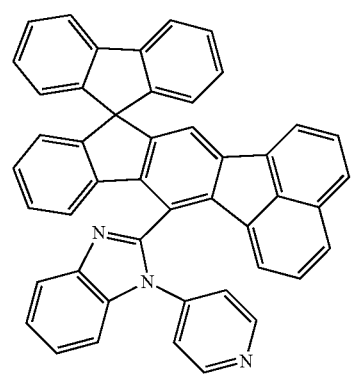
P18
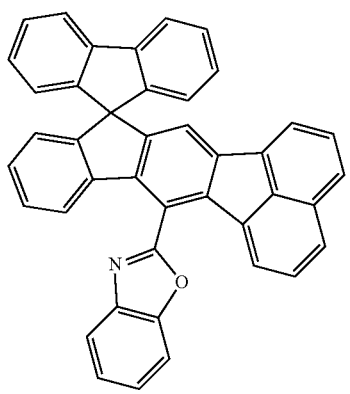
P19
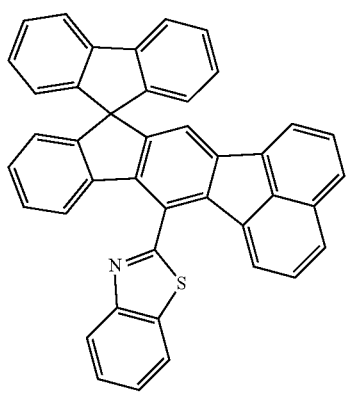
P20
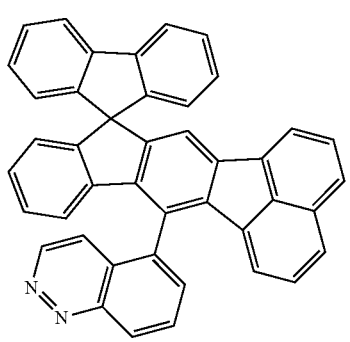
P21
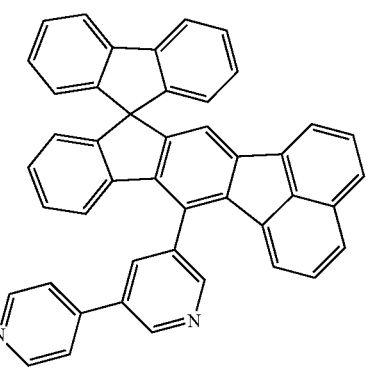

-continued
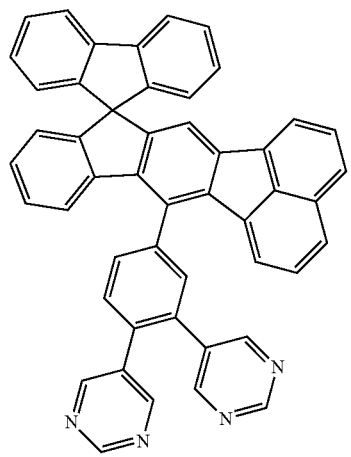
P22
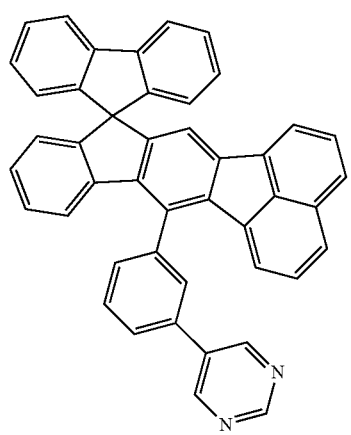
P23
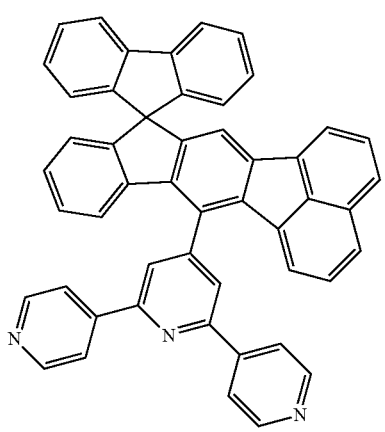
P24
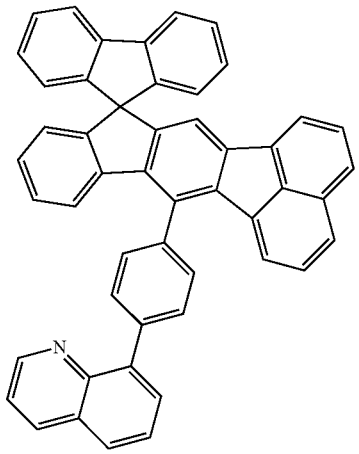
P25
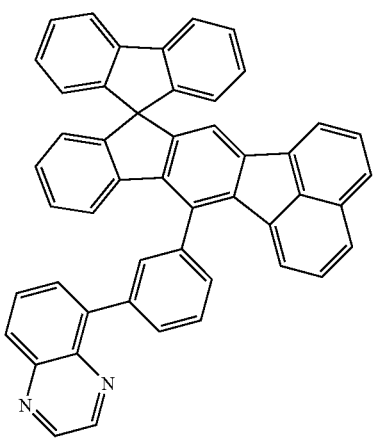
P26
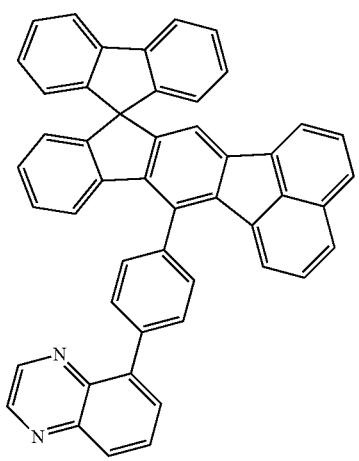
P27

P28
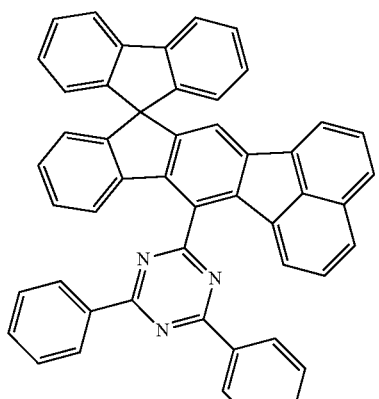
P29
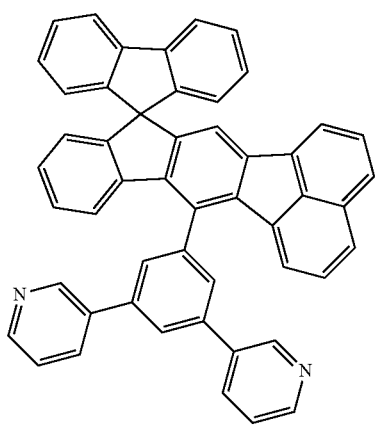
P30
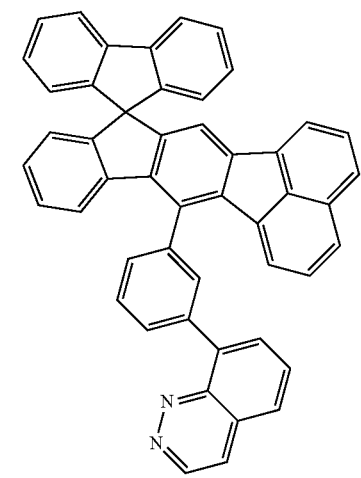
P31
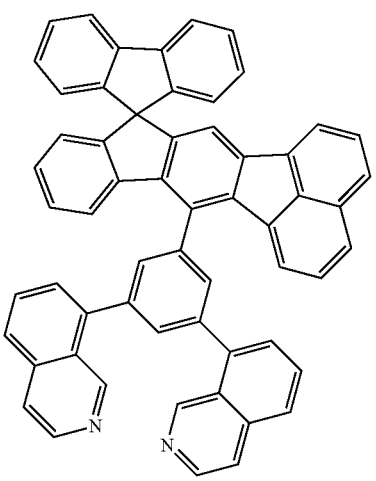
P32
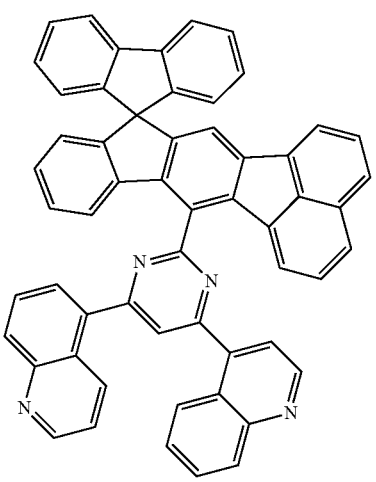
P33
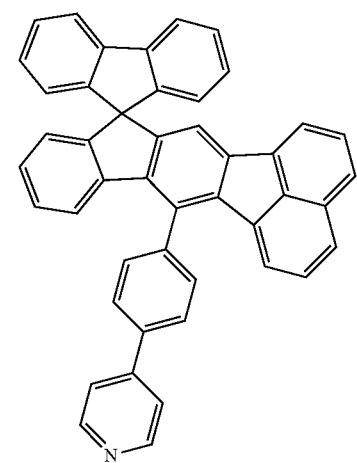

P34
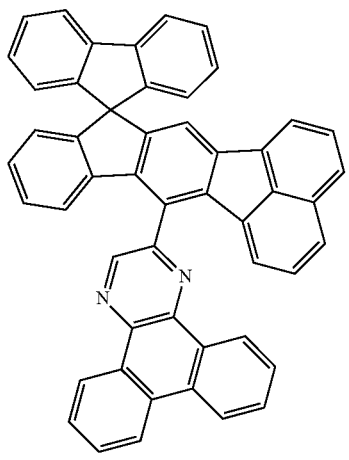
P37
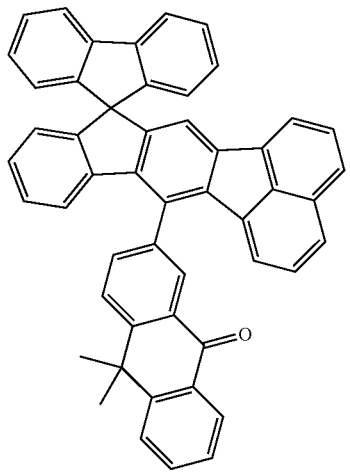
P35
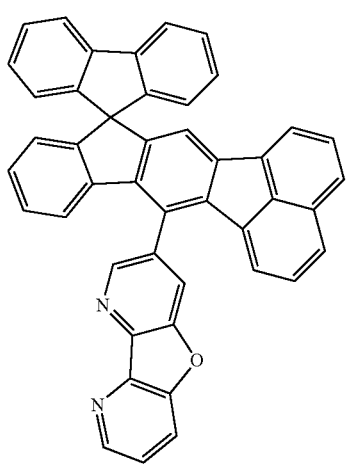
P38
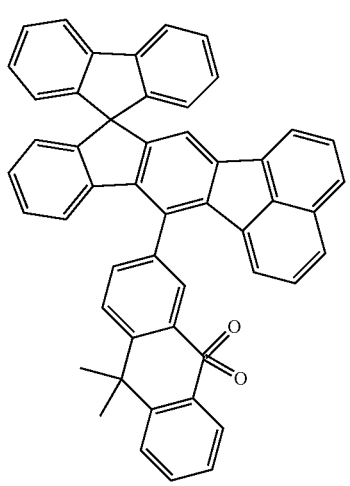
P36
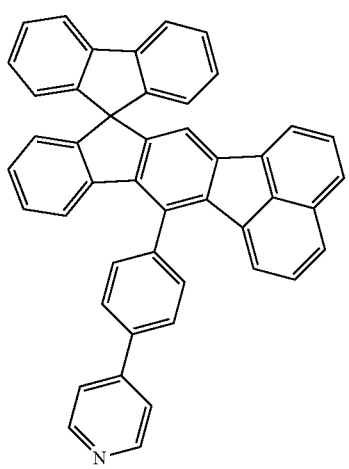
P39
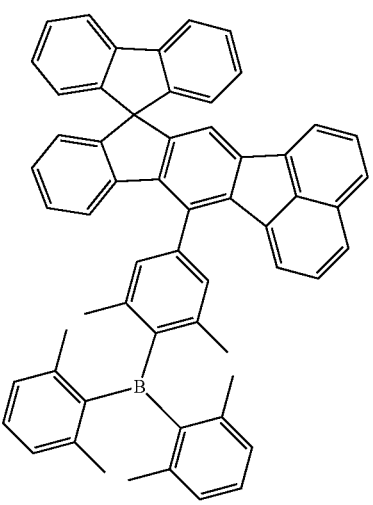

P40
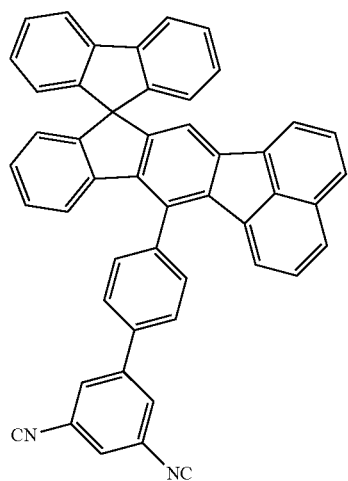
P41
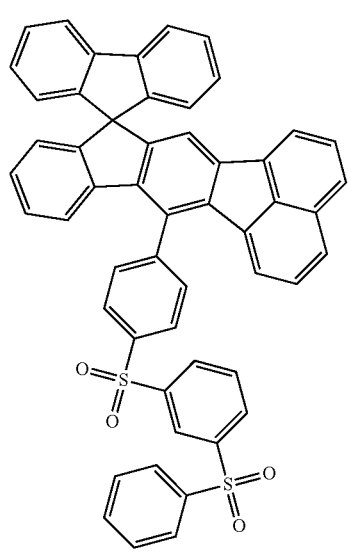
P42
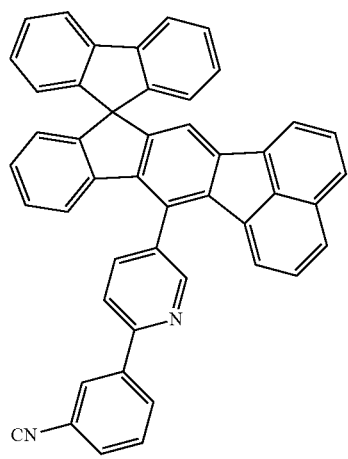
P43
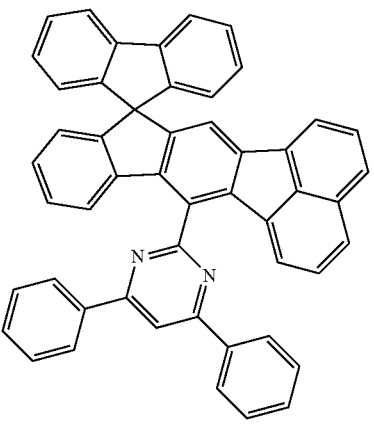
P44
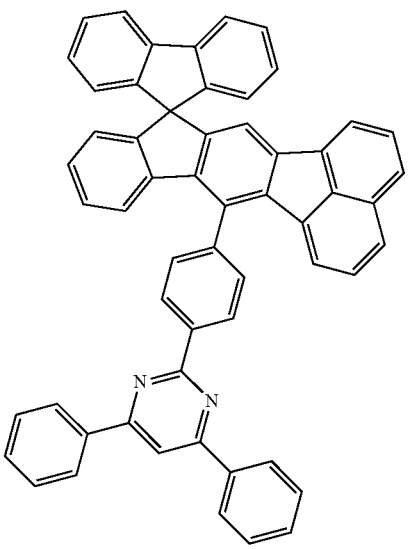
P45
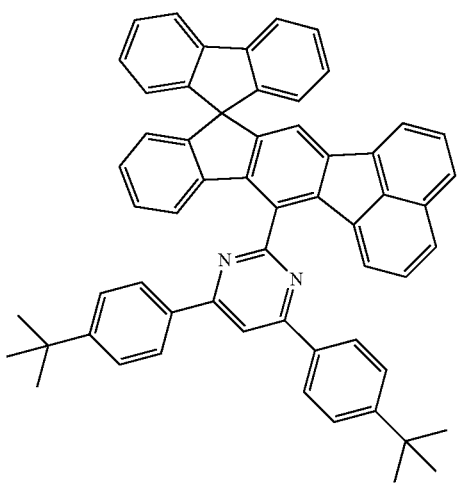

P46
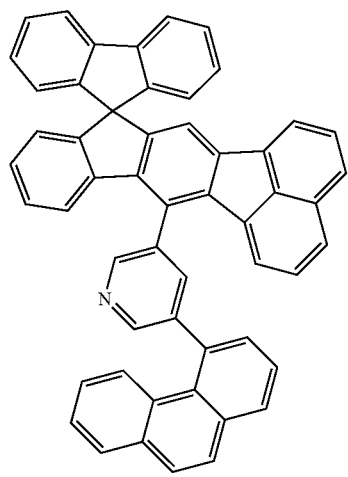
P47
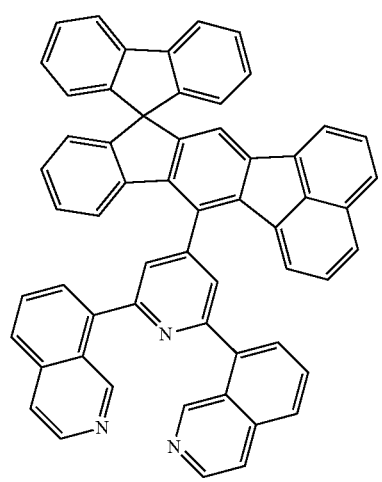
P48
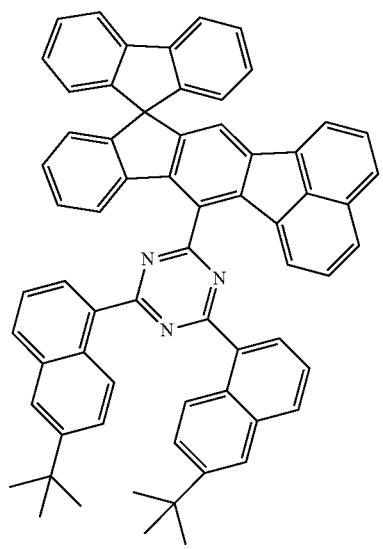
P49
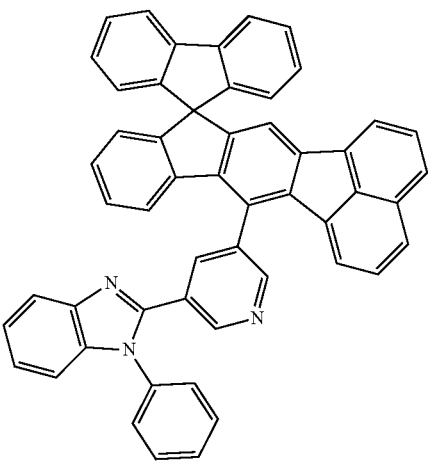
P50
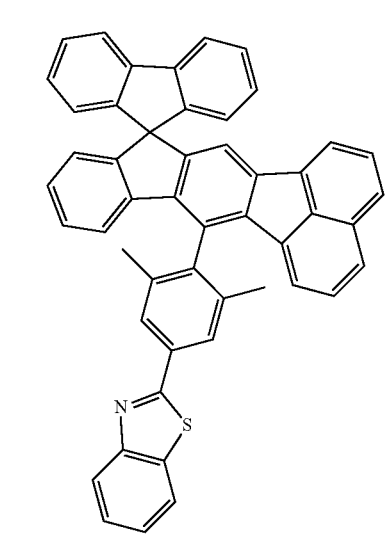
P51
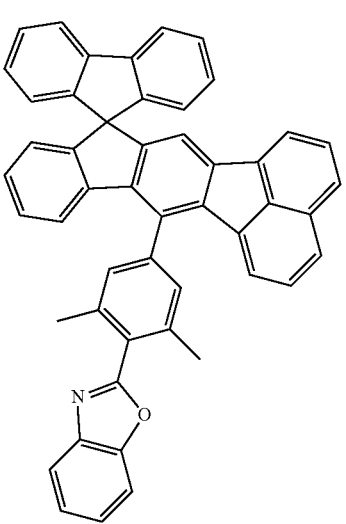

P52
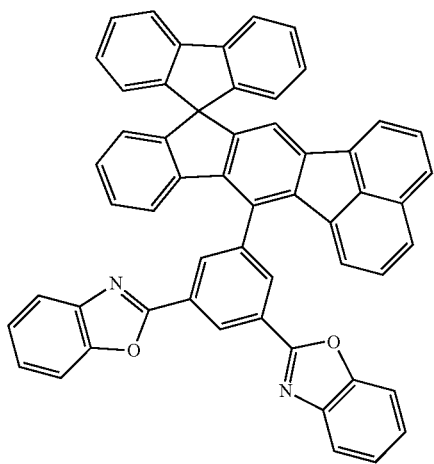
P53
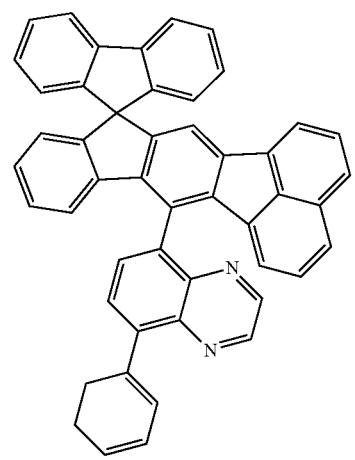
P54
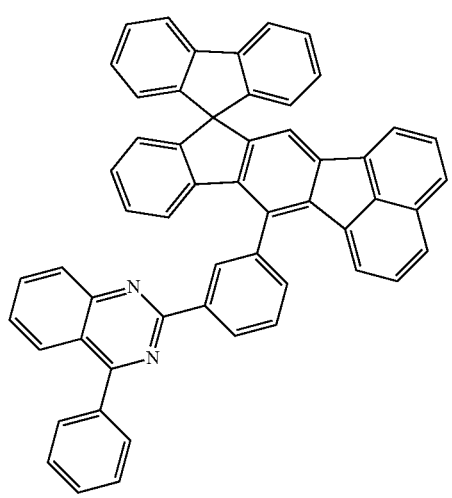
P55
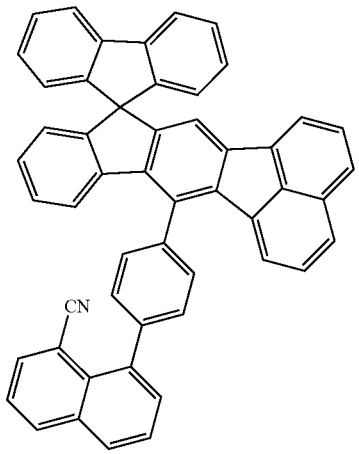
P56
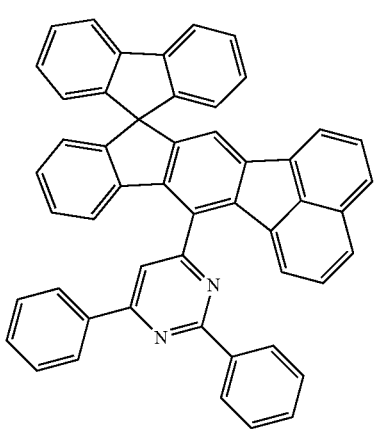
P57
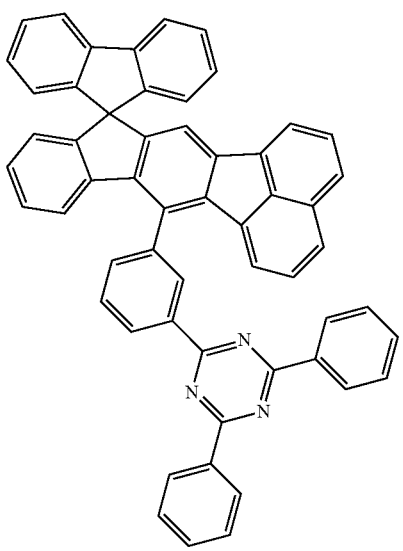

P58
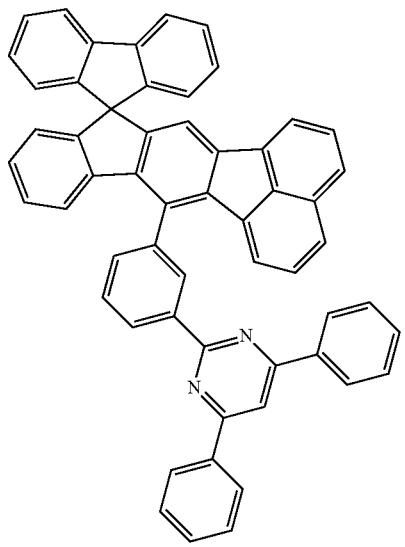
P59
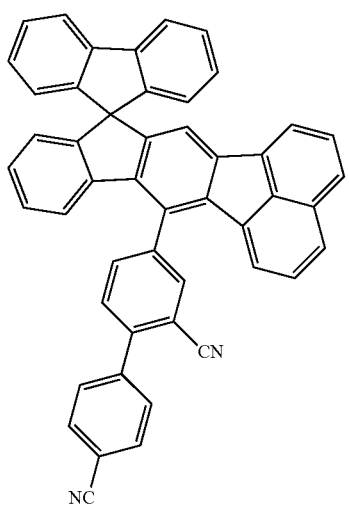
P60
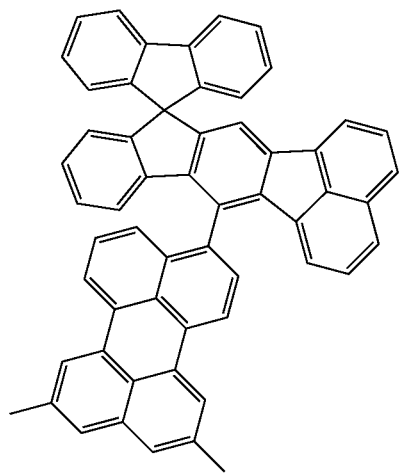
P61
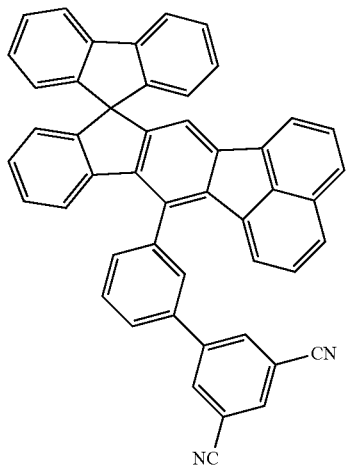
P62
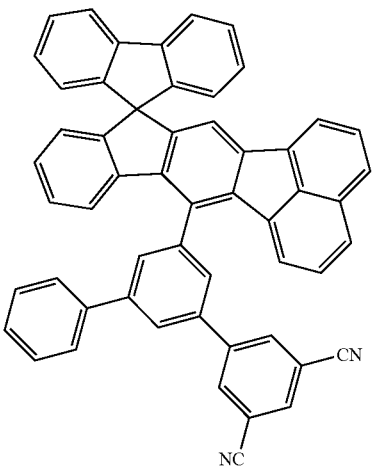
P63
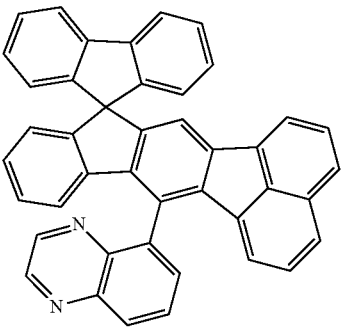

P64
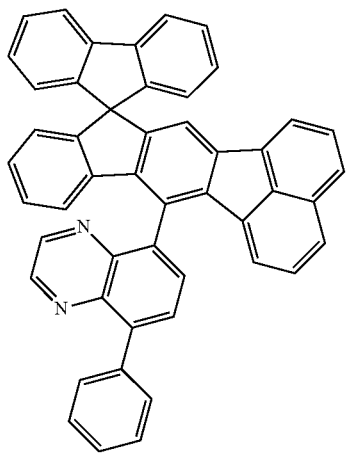
P65
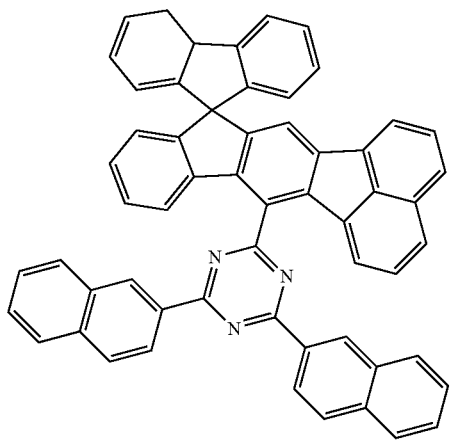
P66
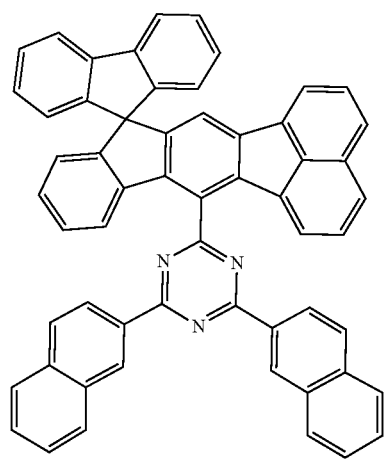
P67
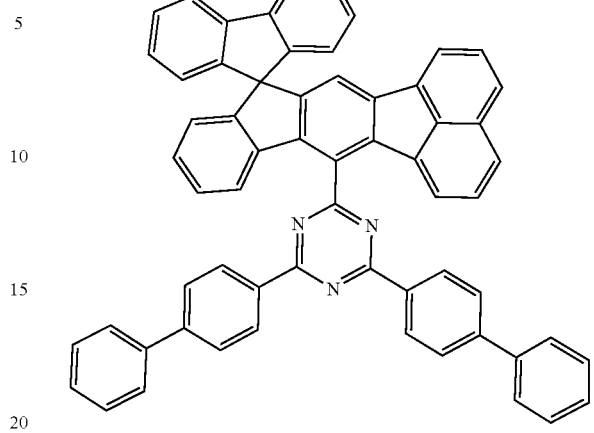
P68
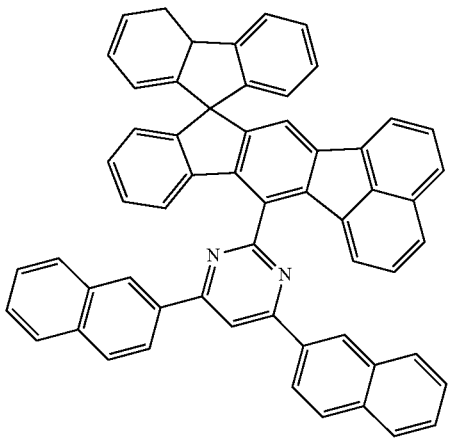
P69
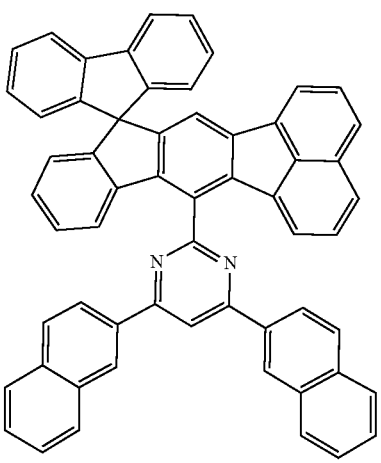

P70
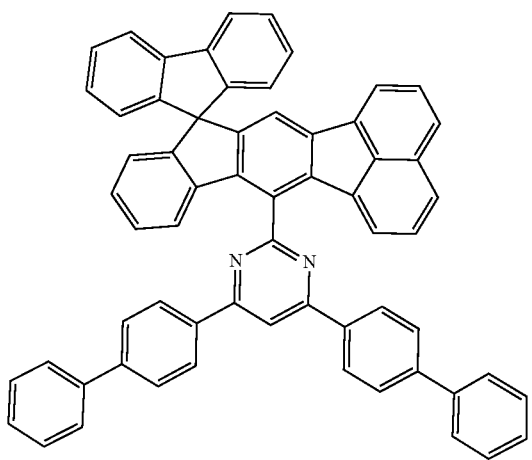
P71
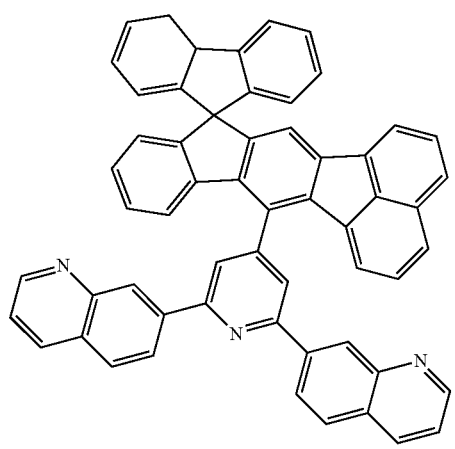
P72
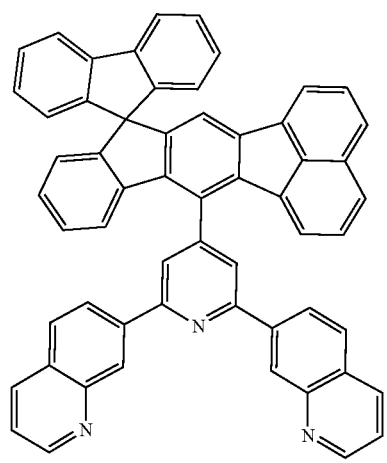
P73
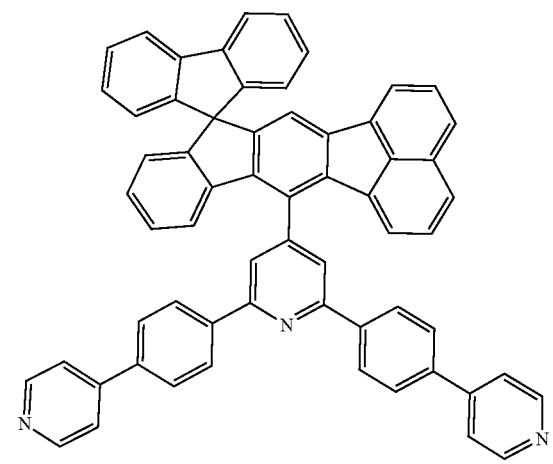
P74
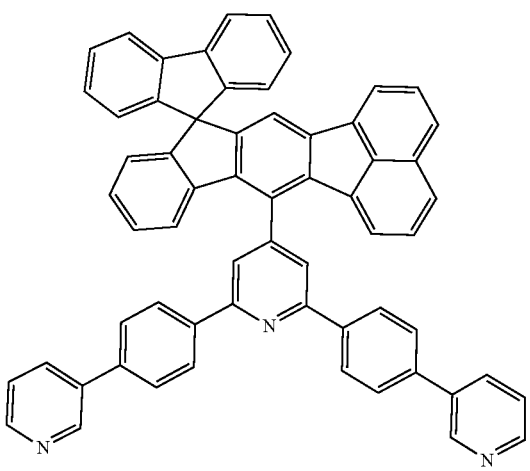
P75
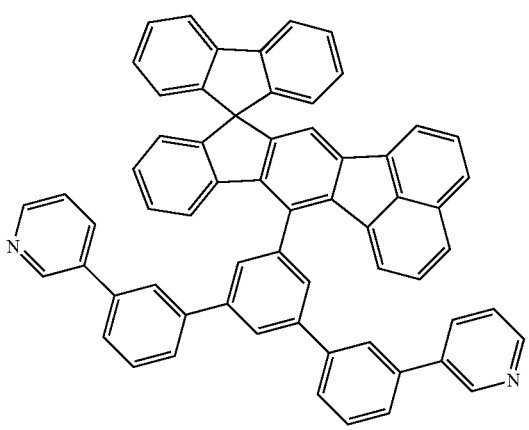

P76
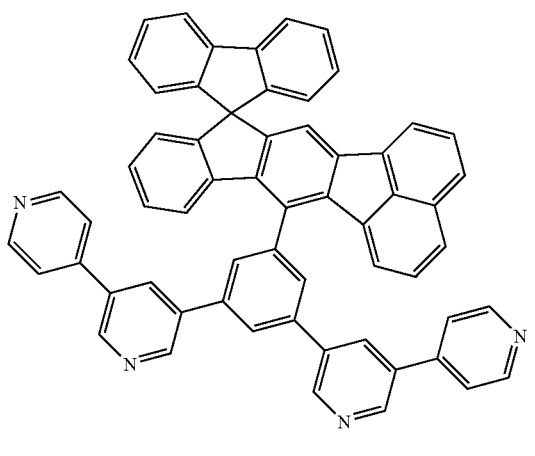
P77
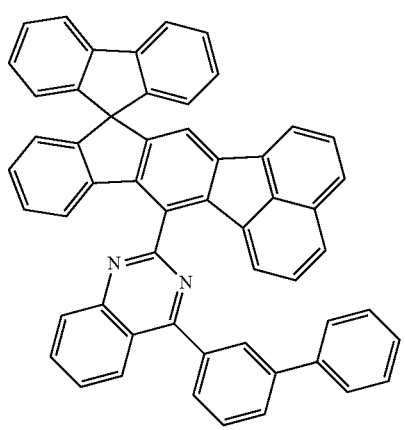
P78
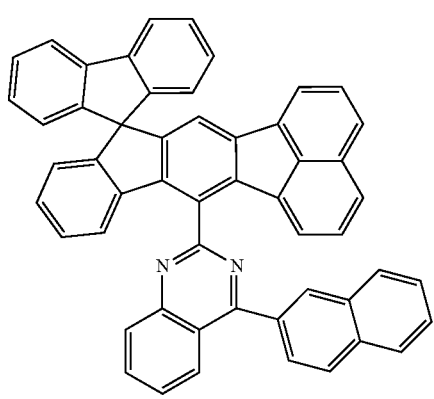
P79
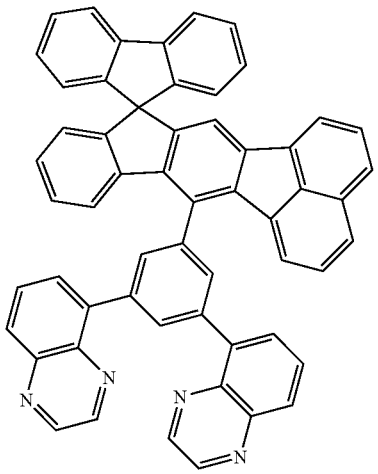
P80
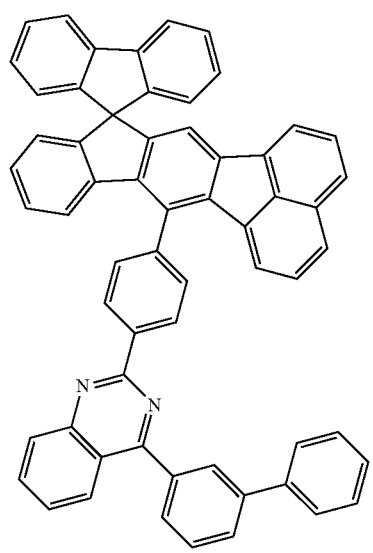
P81
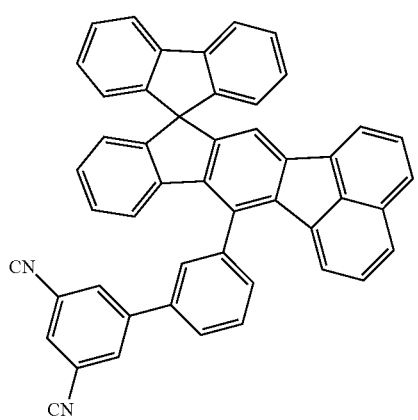

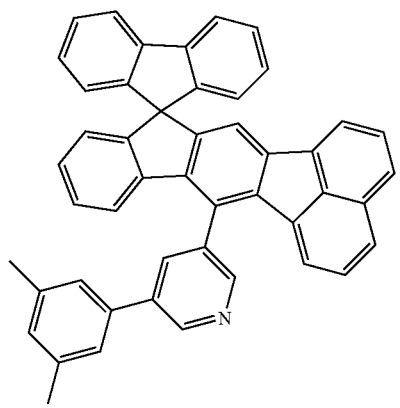
P82
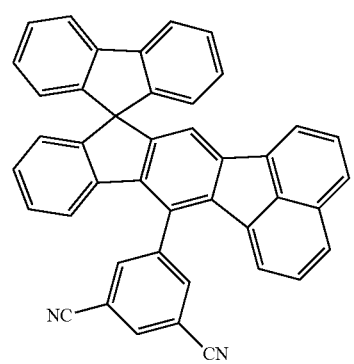
P83
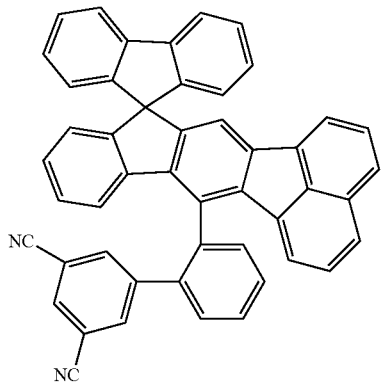
P84
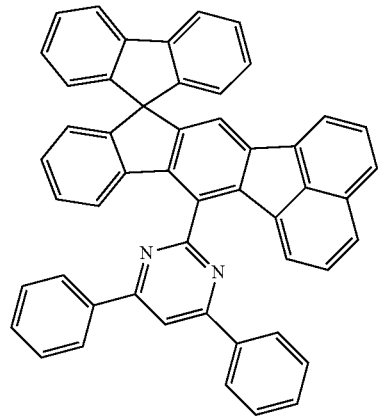
P85
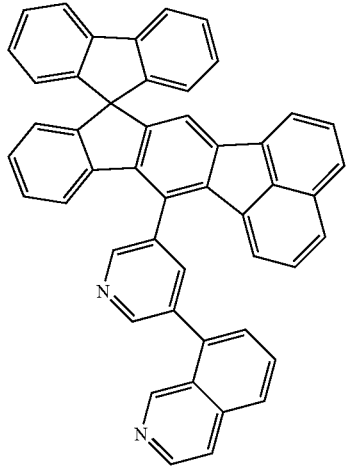
P86
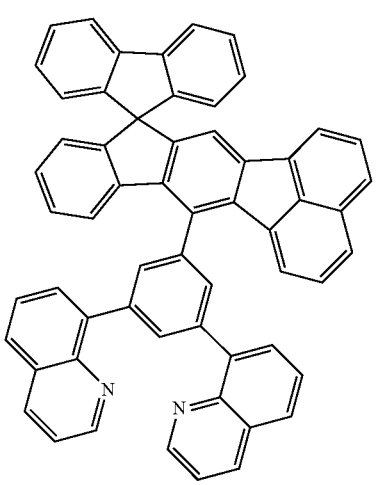
P87
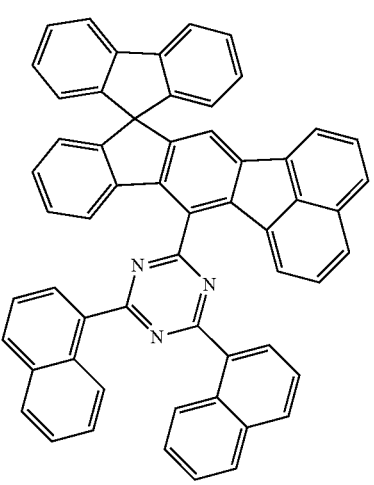
P88

P89
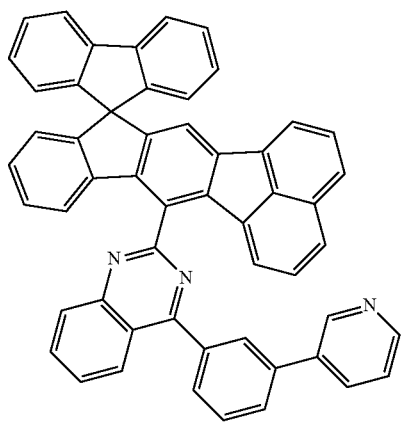
P90
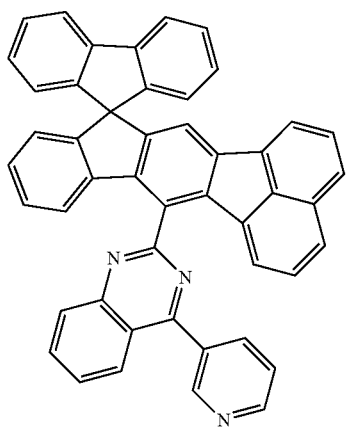
P91
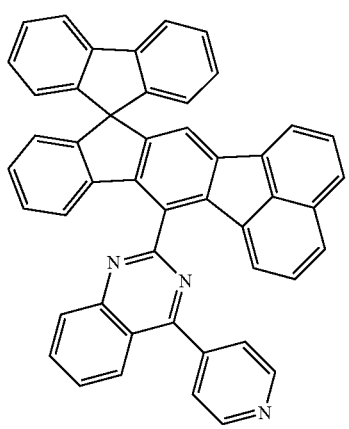
P92
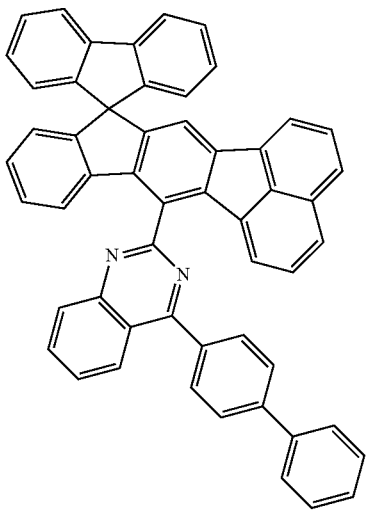
P93
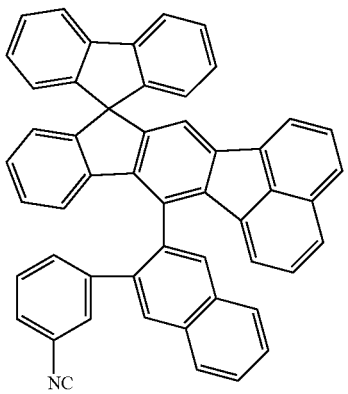
P94
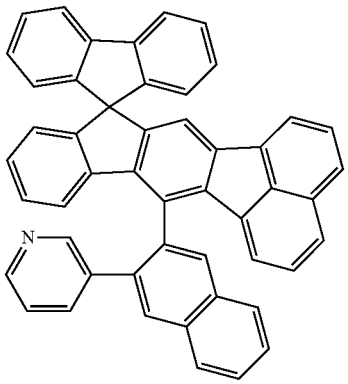

P95
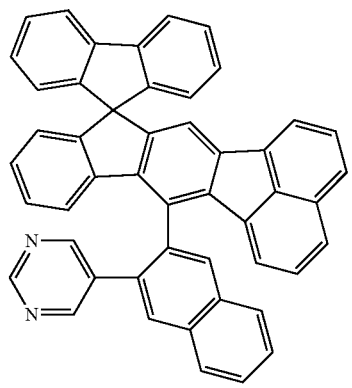
P96
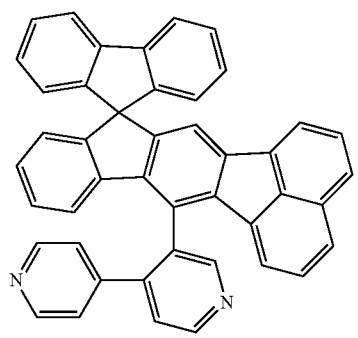
P97
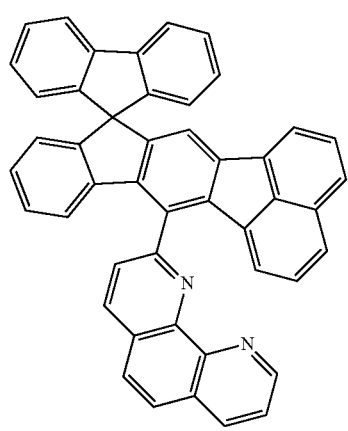
P98
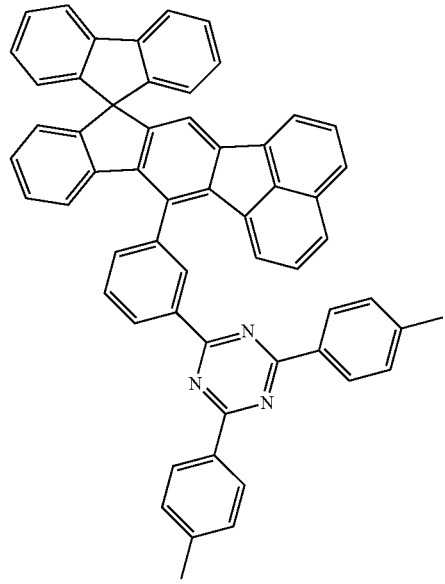
P99
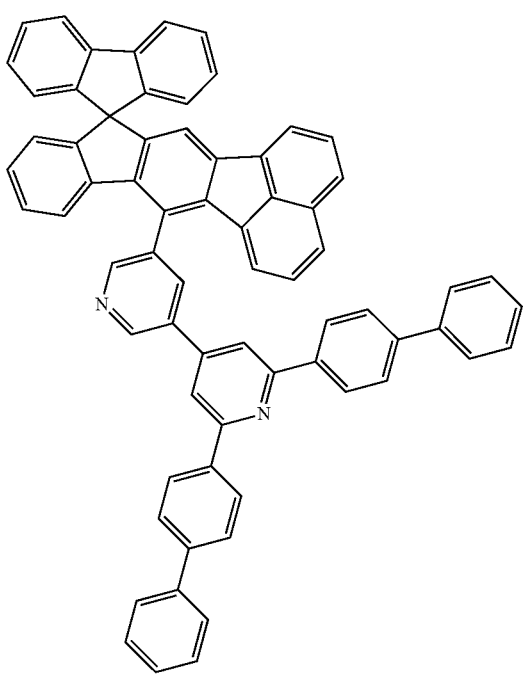

P100
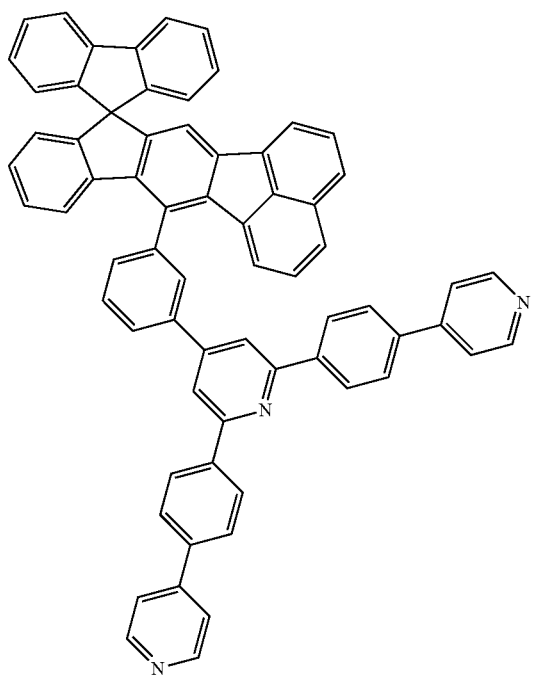
P101
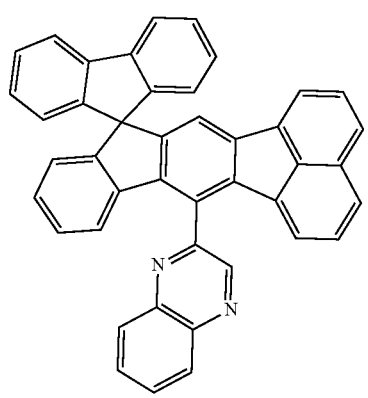
P102
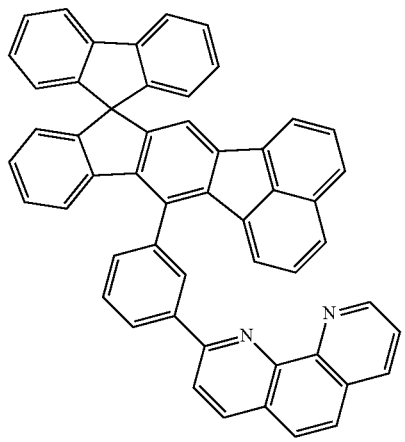
P103
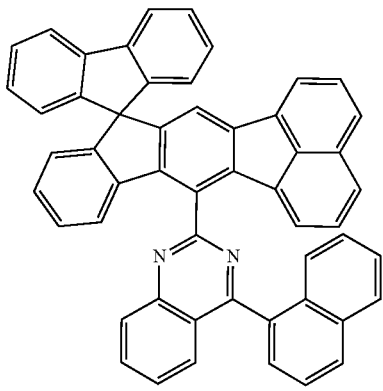
P104
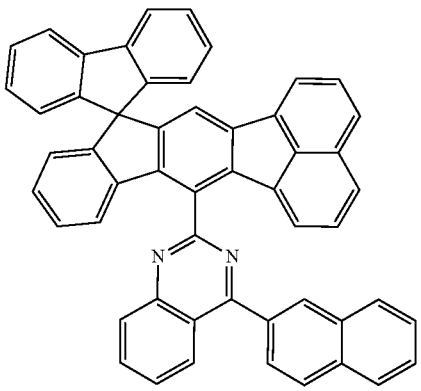
P105
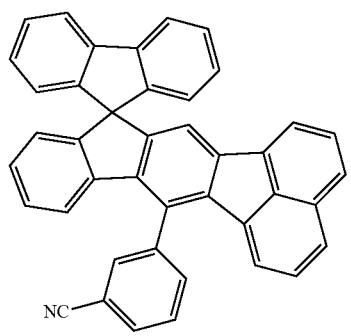
P106
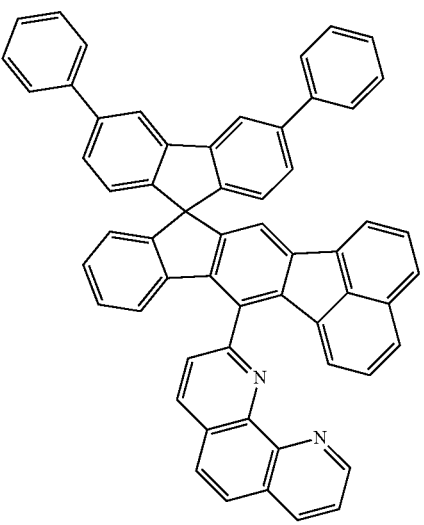

-continued
P107
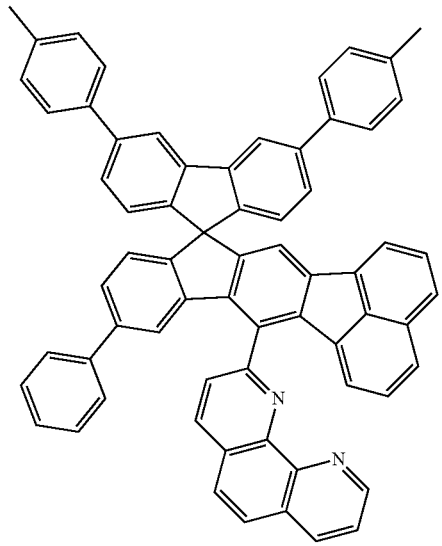
P108
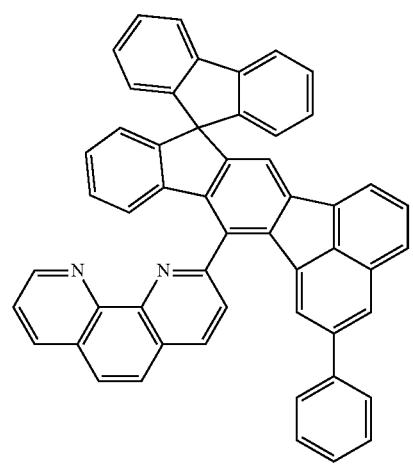
P109
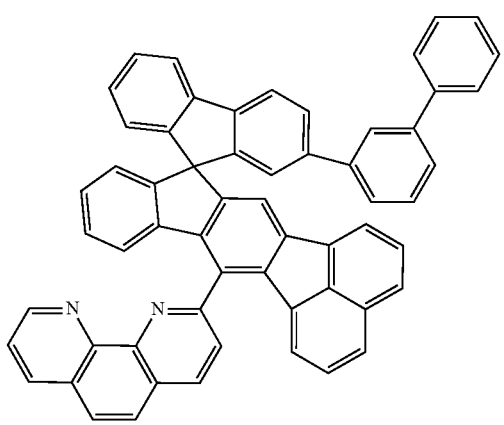
-continued
P110
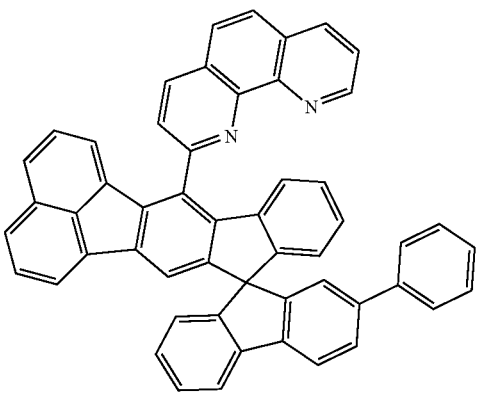
P111
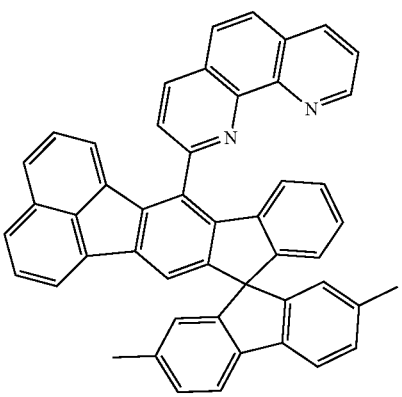
P112
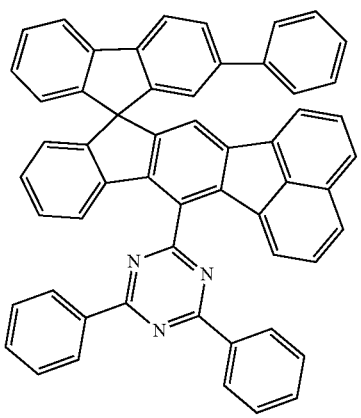
P113
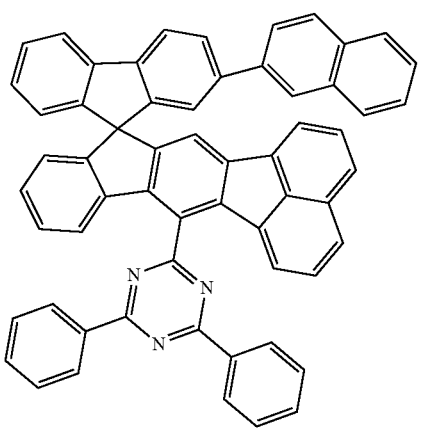

P114
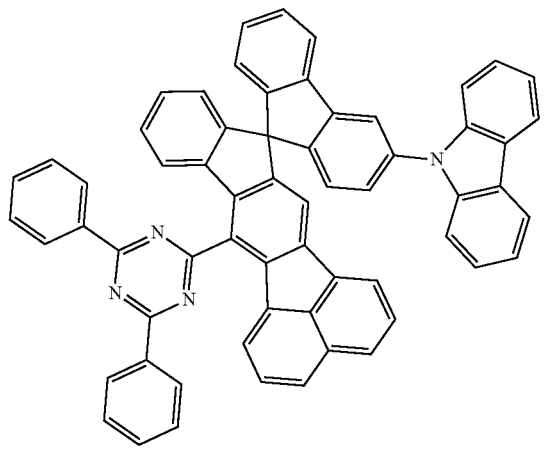
P117
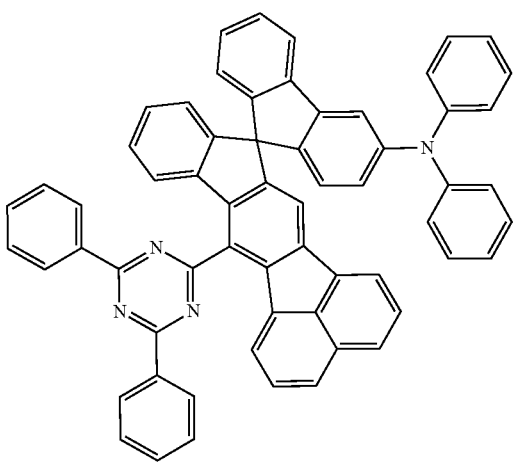
P115
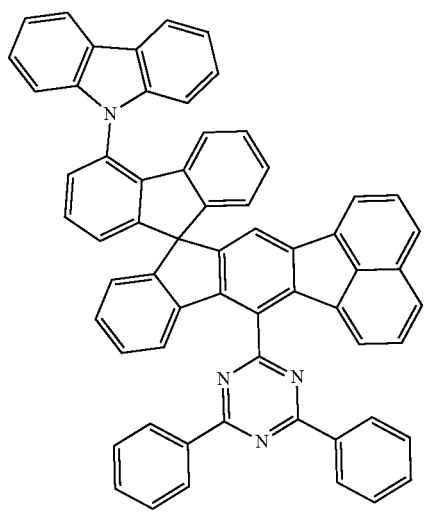
P118
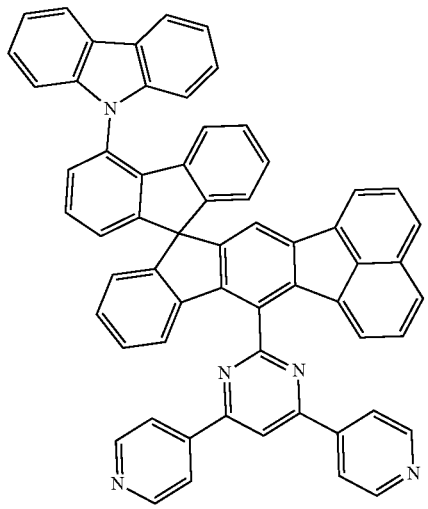
P116
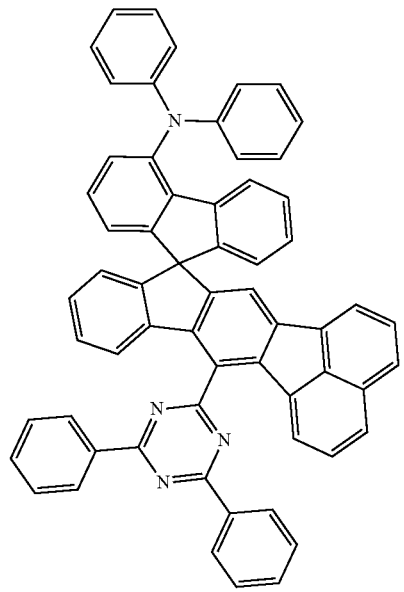
P119
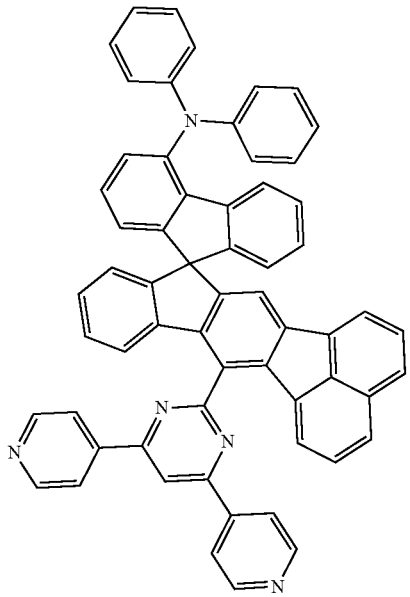

-continued
P120
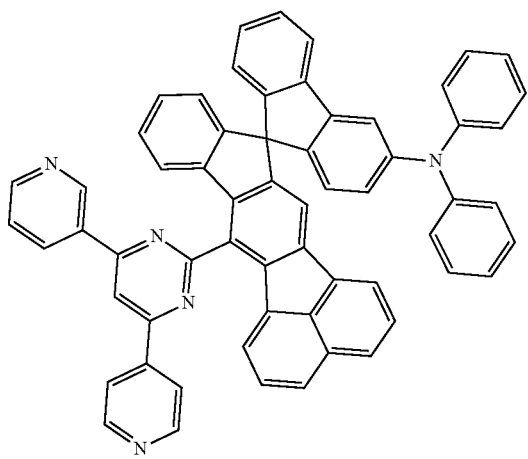
P121
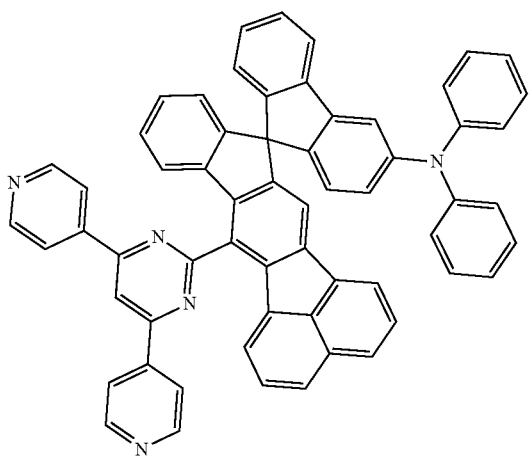
P122
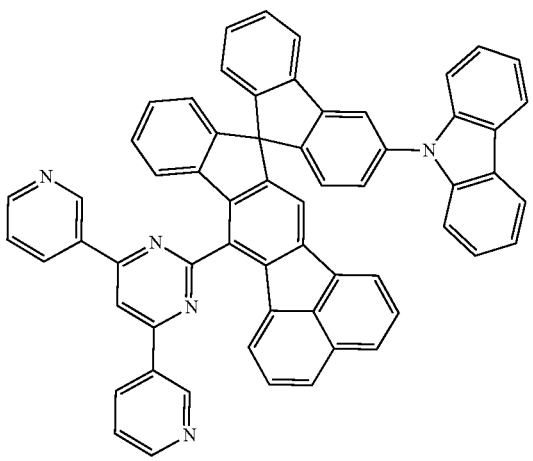
P123
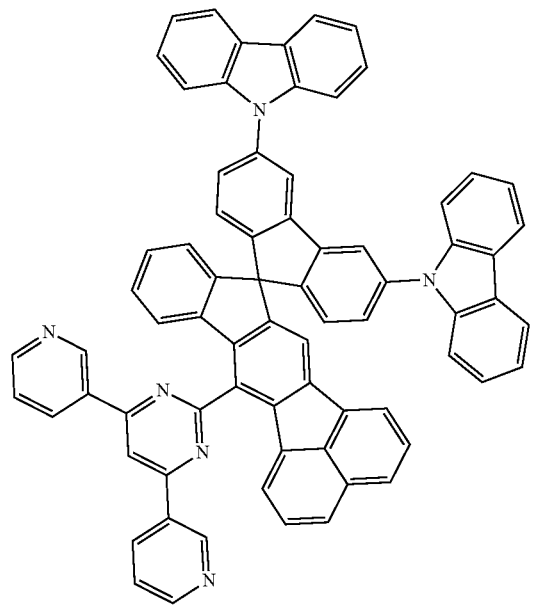
P124
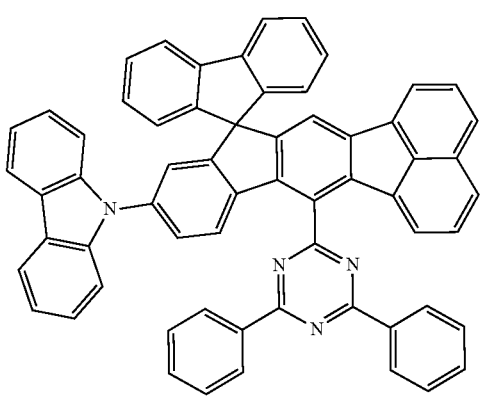
P125
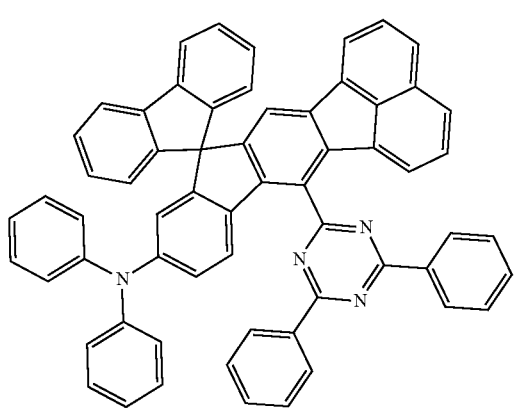

P126
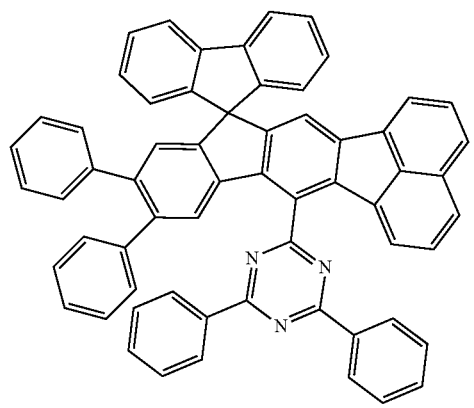
P127
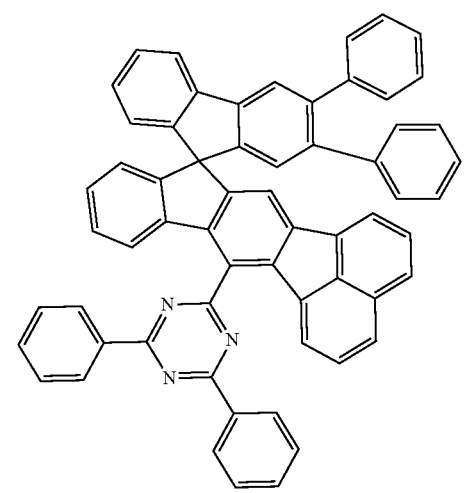
P128
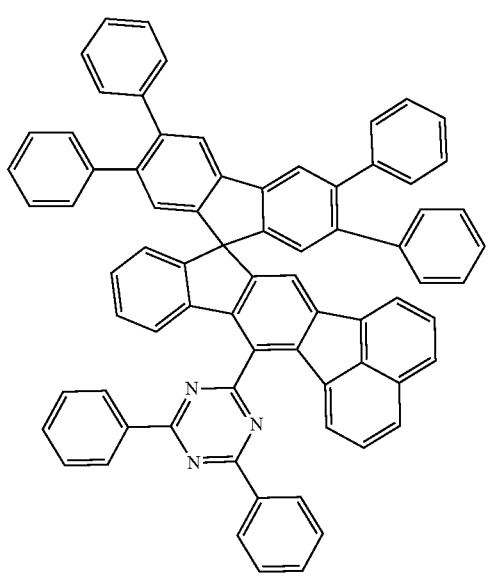
P129
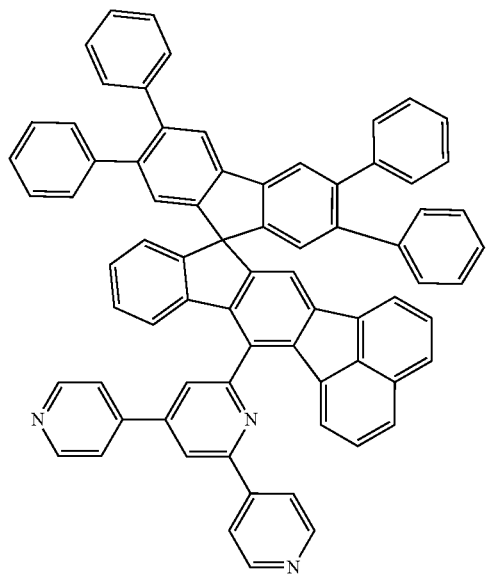
P130
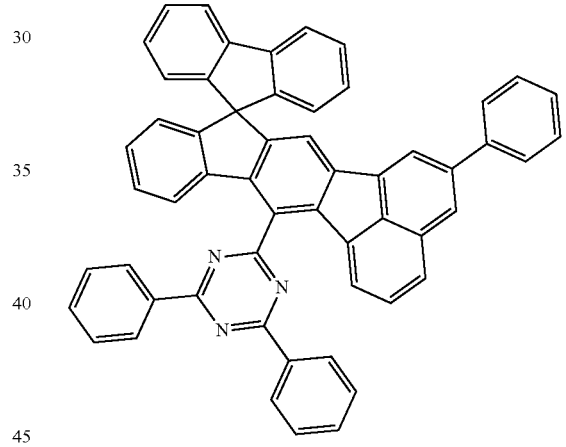
P131
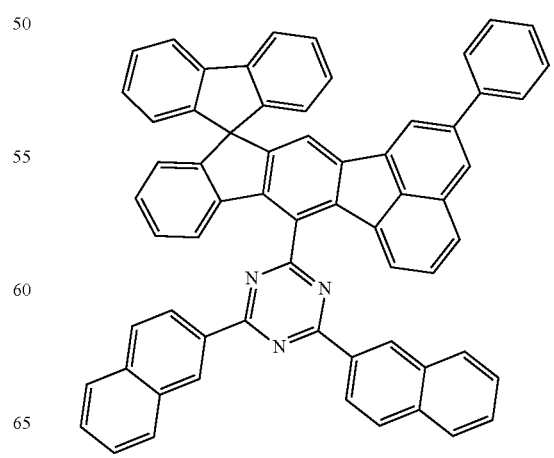

-continued
P132
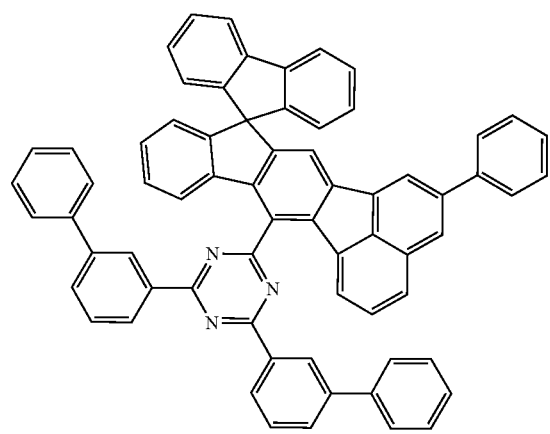
P133
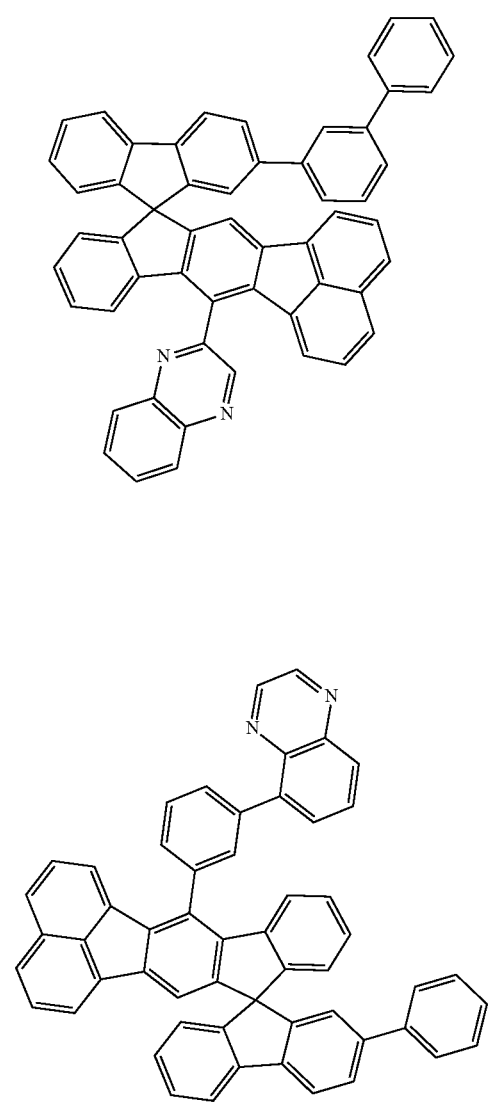
P134
-continued
P135
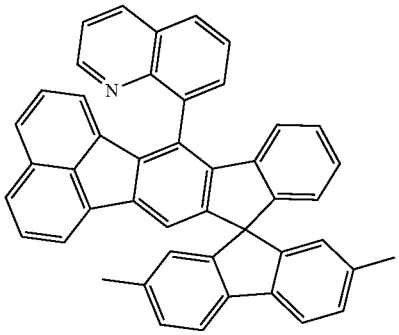
P136
P137
P138
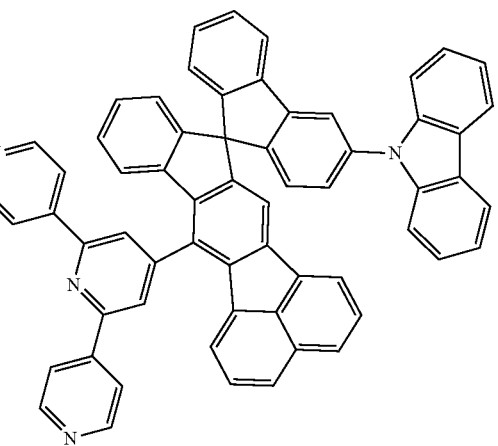

P139
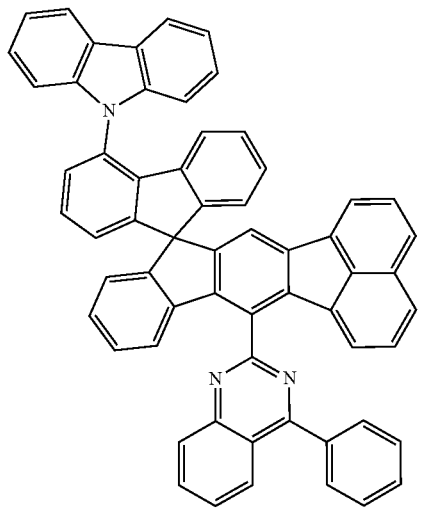
P140
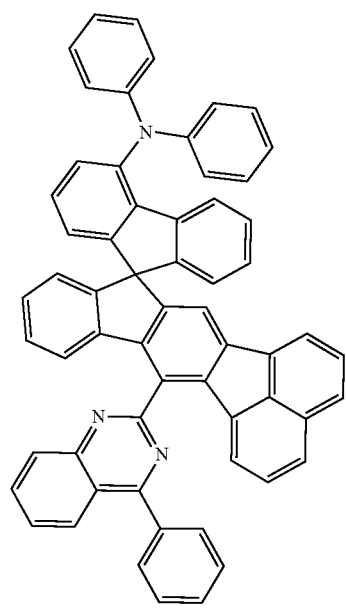
P141
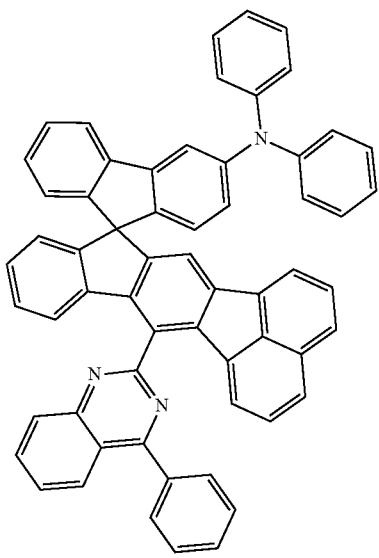
P142
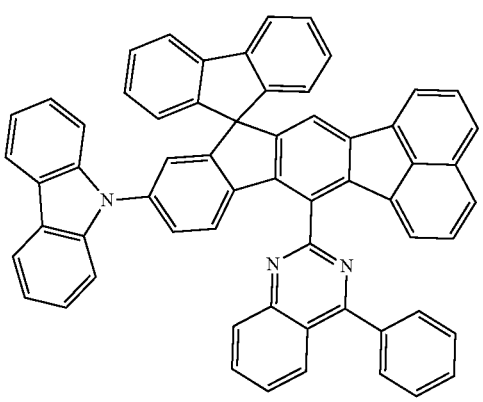
P143
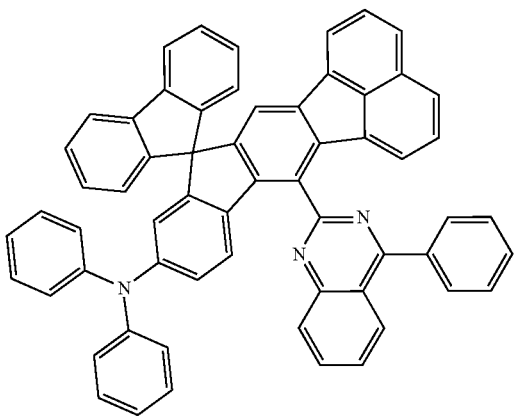
P144
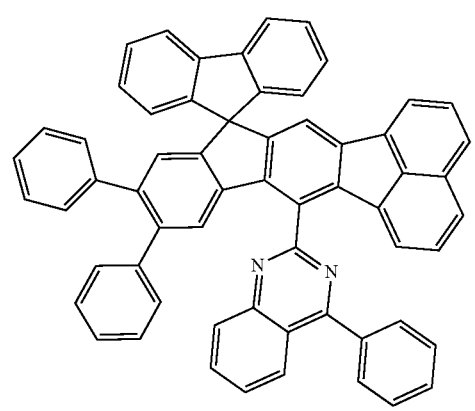

P145
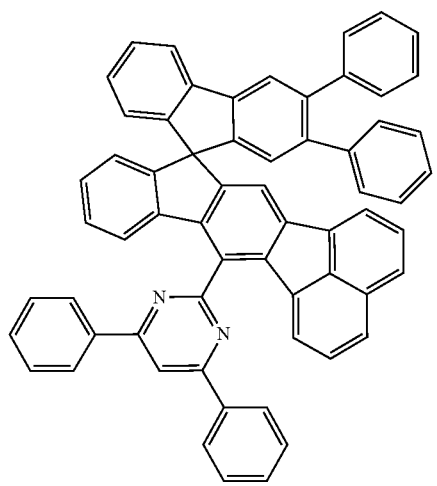
P146
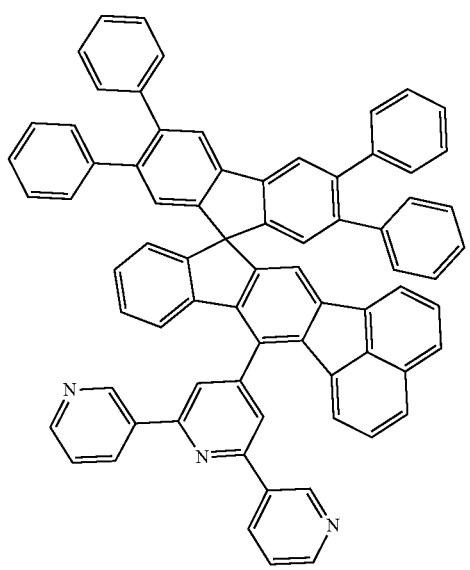
P147
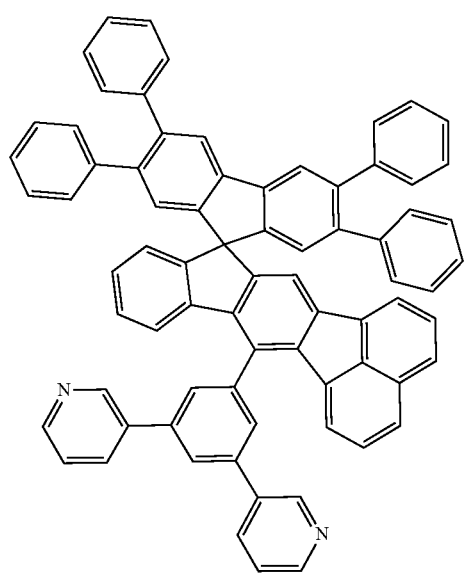
P148
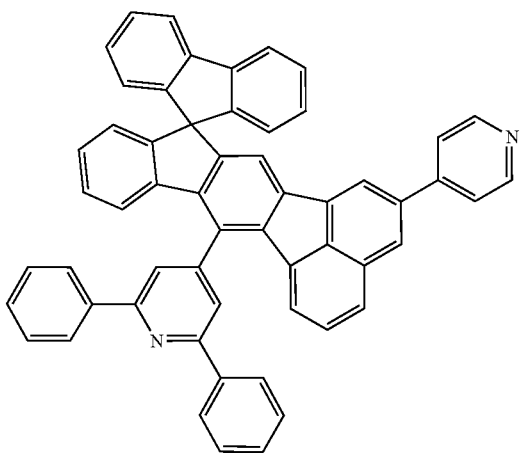
P149
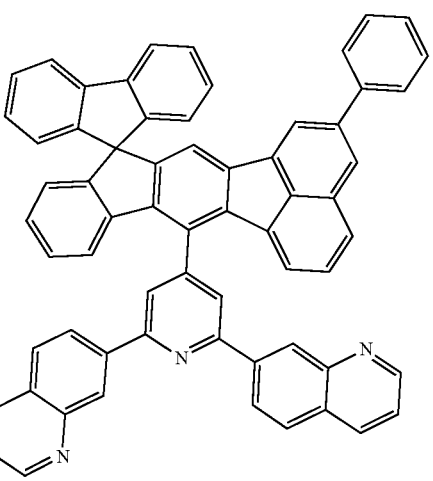
P150
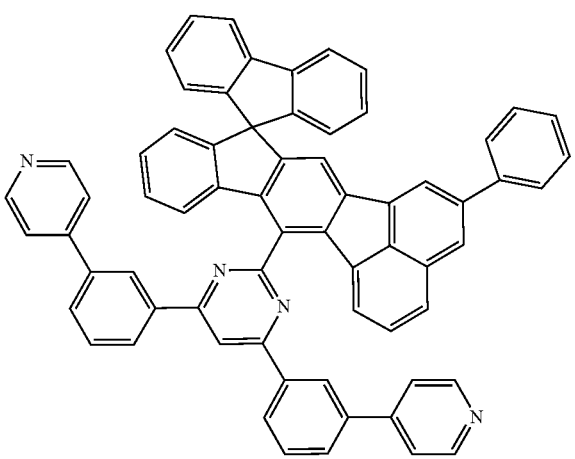

P151
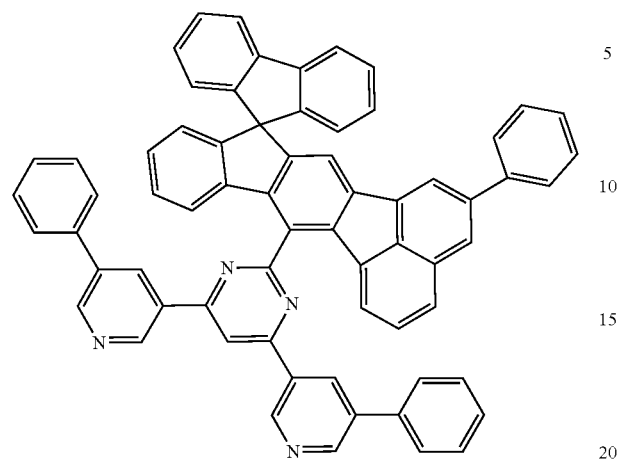
P154
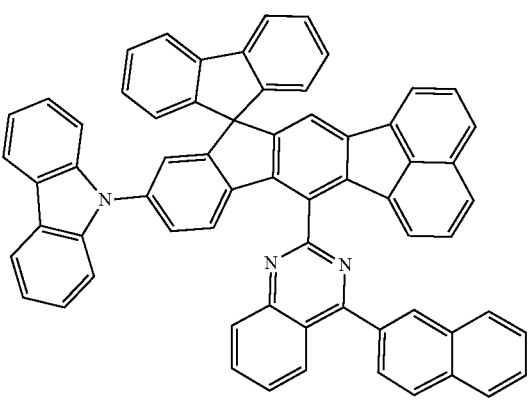
P152
P155
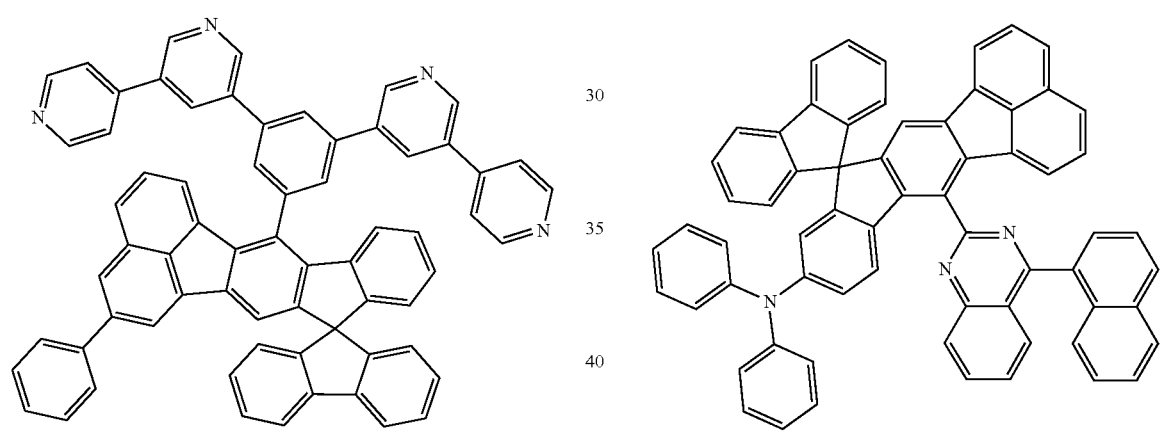
P153
P156
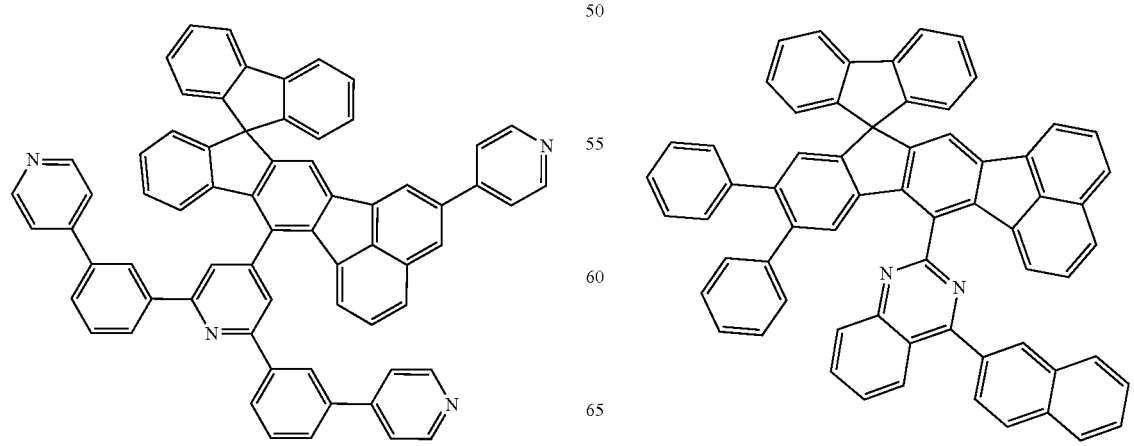

P157
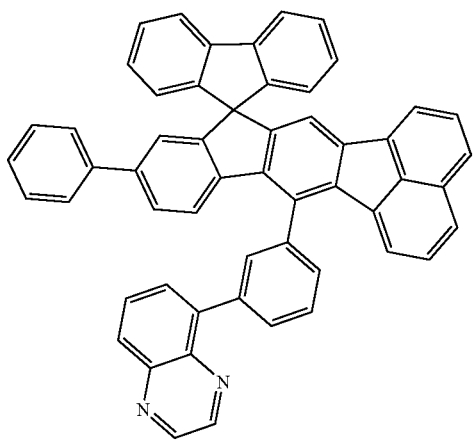
P158
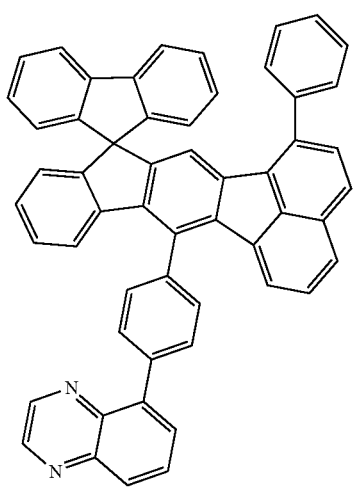
P159
P160
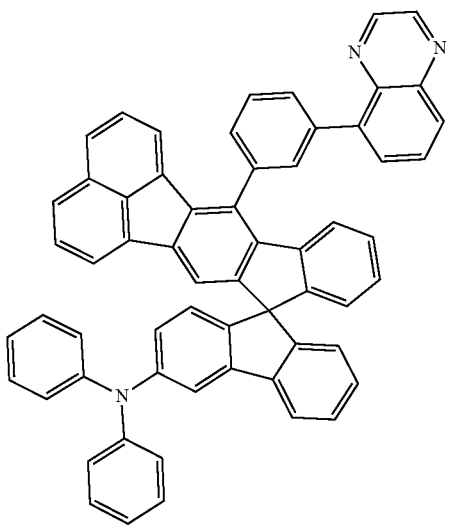
P161
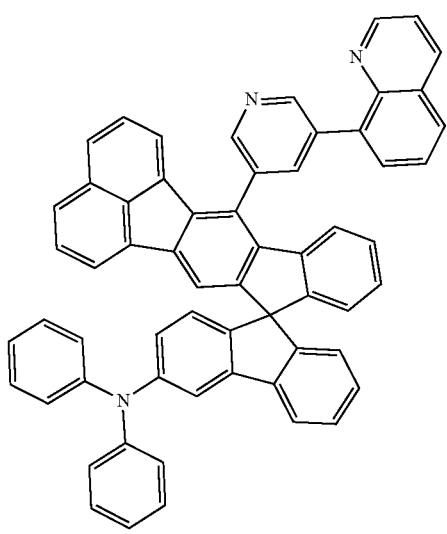
P162
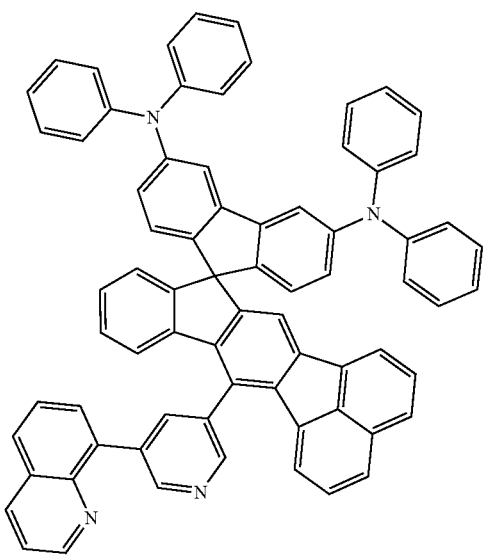

P163

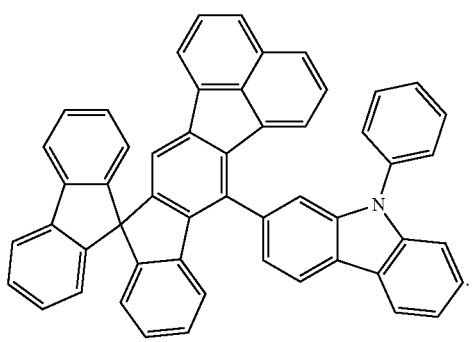

In an embodiment, the present disclosure provides an OLED device. The OLED device includes an anode, a cathode and an organic thin film layer disposed between the anode and the cathode, wherein the organic thin film layer includes at least one of the organic compounds as described for the first aspect.

In an embodiment, the organic thin film layer includes a light-emitting layer which includes at least one (such as one or two) of the organic compounds as described for the first aspect.

In an embodiment, each of the organic compounds is used as a host material of the light-emitting layer.

In an embodiment, each of the organic compounds is used as a green-light host material of the light-emitting layer.

The organic compound of the present disclosure uses a macrocyclic structure as the central skeleton collocated with the groups L, A and $R_1$ to $R_4$. Through the design of a molecular structure, the organic compound has a suitable HOMO energy level and a relatively deep LUMO energy level and can reduce the potential barrier of electron transport, improve an electron injection ability, effectively block holes and make more holes and electrons recombined in a light-emitting region, thereby achieving relatively high luminescence efficiency and a relatively low operating voltage. In an embodiment, based on the HOMO/LUMO energy level of the organic compound, the organic compound is particularly suitable for use as a green-light N-type host material (green-light N-type Host).

On the other hand, in the present disclosure, through the design and compounding of a particular central skeleton and groups, the organic compound has a relatively high singlet energy level $E_S$ which can reach about 2.8 eV and can effectively transport electrons and confine holes and excitons in the light-emitting region, which is conducive to widening the light-emitting region and improving the efficiency and lifetime of the device. In another embodiment, the organic compound is used as a blue-light host material of the light-emitting layer (blue-light Host).

In an embodiment, the organic thin film layer includes an electron transport layer which includes at least one of the organic compounds as described for the first aspect.

In an embodiment, the organic thin film layer includes a hole blocking layer which includes at least one of the organic compounds as described for the first aspect.

In an embodiment, a material of the anode in the OLED device may be a metal, a metal oxide or a conductive polymer, wherein the metal includes copper, gold, silver, iron, chromium, nickel, manganese, palladium, platinum and the like as well as alloys thereof, the metal oxide includes indium tin oxide (ITO), indium zinc oxide (IZO), zinc oxide, indium gallium zinc oxide (IGZO) and the like, and the conductive polymer includes polyaniline, polypyrrole, poly(3-methylthiophene) and the like. In addition to the above materials that facilitate hole injection and combinations thereof, the material of the anode further includes known materials suitable for use as the anode.

A material of the cathode in the OLED device may be a metal or a multilayer metal material, wherein the metal includes aluminum, magnesium, silver, indium, tin, titanium and the like as well as alloys thereof, and the multilayer metal material includes LiF/Al, $LiO_2$/Al, $BaF_2$/Al and the like. In addition to the above materials that facilitate electron injection and combinations thereof, the material of the cathode further includes known materials suitable for use as the cathode.

In the OLED device, the organic thin film layer includes at least one light-emitting layer (EML) and other function layers disposed on two sides of the at least one light-emitting layer, where the other function layers include any one or a combination of at least two of an electron transport layer (ETL), a hole transport layer (HTL), a hole injection layer (HIL), an electron blocking layer (EBL), a hole blocking layer (HBL) or an electron injection layer (EIL), wherein the hole/electron injection and transport layers may be carbazole compounds, arylamine compounds, benzimidazole compounds and metal compounds, etc. The OLED device may further be optionally provided with a capping layer (CPL) disposed on the cathode (on a side of the cathode facing away from the anode).

In an embodiment, as shown in FIG. 1 which is a structure diagram of the OLED device, the OLED device includes an anode 110, a cathode 150 and a light-emitting layer 130 disposed between the anode 110 and the cathode 150, where a first organic thin film layer 120 and a second organic thin film layer 140 are disposed on two sides of the light-emitting layer 130. The first organic thin film layer 120 includes any one or a combination of at least two of a hole transport layer (HTL), a hole injection layer (HIL) or an electron blocking layer (EBL), and the second organic thin film layer 140 includes any one or a combination of at least two of an electron transport layer (ETL), a hole blocking layer (HBL) or an electron injection layer (EIL).

In an embodiment, the light-emitting layer 130 includes at least one of the organic compounds provided by the present disclosure.

Optionally, a capping layer (CPL) may be further disposed on the cathode 150 (on a side of the cathode 150 facing away from 110).

The OLED device may be prepared by the following method: forming the anode on a transparent or opaque smooth substrate, forming the organic thin film layer on the anode, and forming the cathode on the organic thin film layer. The organic thin film layer may be formed by using known film forming methods such as evaporation, sputtering, spin coating, impregnation and ion plating.

In an embodiment, the present disclosure provides a display panel. The display panel includes the OLED device as described for the second aspect.

In an embodiment, the present disclosure provides an electronic apparatus. The electronic apparatus includes at least one of the OLED device as described for the second aspect or the display panel as described for the third aspect.

Exemplarily, the organic compound having the structure represented by Formula I in the present disclosure may be prepared according to the following synthesis route:

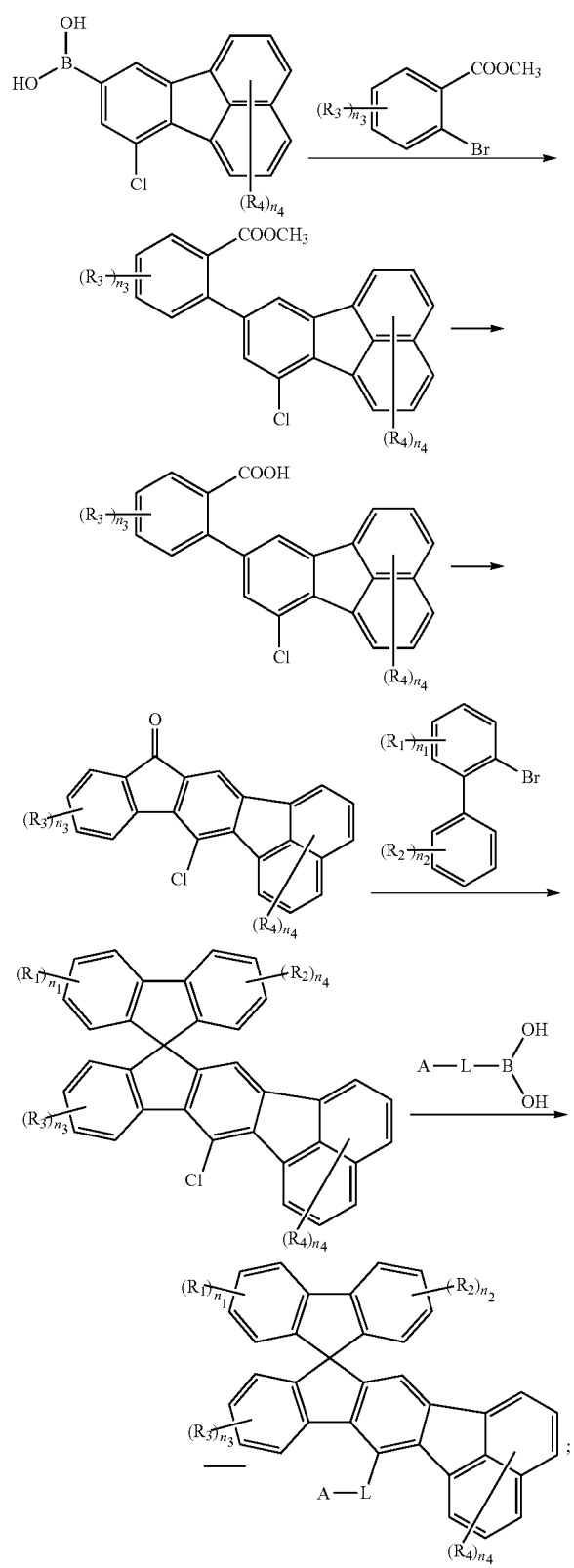

wherein L, A, $R_1$, $R_2$, $R_3$, $R_4$, $n_1$, $n_2$, $n_3$ and $n_4$ are defined within the same ranges as in Formula I.

Preparation examples of the organic compound of the present disclosure are exemplarily described below.

SYNTHESIS EXAMPLE 1

An intermediate for preparing the organic compound was synthesized by the specific steps below.

(1) Synthesis of Intermediate 1

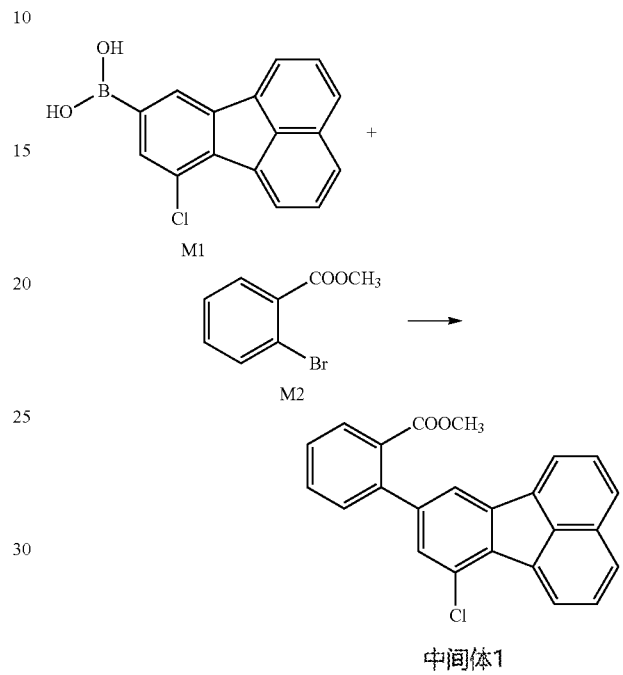

中间体1

Reactant M1 (0.1 mol), Reactant M2 (0.1 mol), potassium carbonate (0.30 mol), water (165.6 g), tetrakis(triphenylphosphine)palladium (Pd(PPh$_3$)$_4$, 1.0 mmol), toluene (400 mL) and absolute ethanol (100 mL) were added to a 1 L three-necked flask. Under $N_2$ protection, the system was heated to reflux and reacted for 8 h at a maintained temperature. The reaction was stopped and cooled to 25° C., the layers were separated, and the organic phases were collected and washed with water to be neutral. The solvents were removed from the organic phases under reduced pressure and the organic phases were purified through column chromatography using pure toluene and recrystallized from toluene and absolute ethanol to obtain Intermediate 1 with a yield of 85%.

(2) Synthesis of Intermediate 2

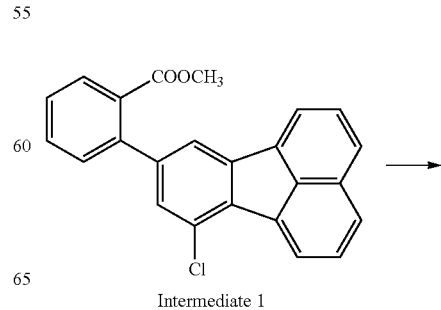

Intermediate 1

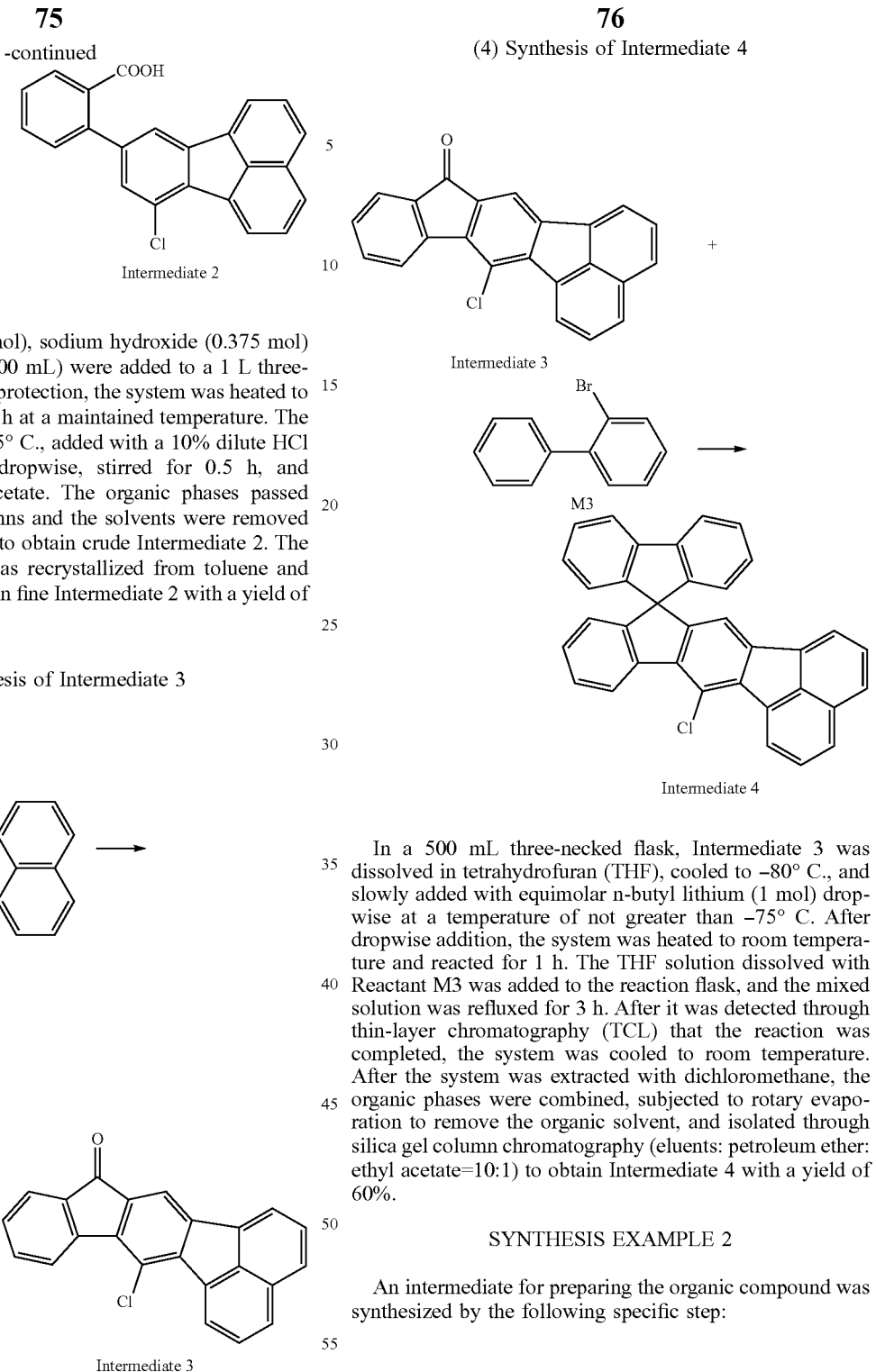

-continued

Intermediate 2

Intermediate 1 (0.1 mol), sodium hydroxide (0.375 mol) and absolute ethanol (400 mL) were added to a 1 L three-necked flask. Under $N_2$ protection, the system was heated to reflux and reacted for 3 h at a maintained temperature. The system was cooled to 25° C., added with a 10% dilute HCl solution (0.375 mol) dropwise, stirred for 0.5 h, and extracted with ethyl acetate. The organic phases passed through silica gel columns and the solvents were removed under reduced pressure to obtain crude Intermediate 2. The crude Intermediate 2 was recrystallized from toluene and absolute ethanol to obtain fine Intermediate 2 with a yield of 88%.

(3) Synthesis of Intermediate 3

Intermediate 2

Intermediate 3

Intermediate 2 (0.10 mol) and methanesulfonic acid (240 g) were added to a 500 mL three-necked flask. Under $N_2$ protection, the system was heated to 75° C. and reacted for 6 h at a maintained temperature. The reaction solution was cooled to 25° C., slowly poured into 250 g of crushed ice, stirred, suction-filtered, and washed with 100 mL of water to obtain a crude product. The crude product was recrystallized from toluene to obtain fine Intermediate 3 with a yield of 77%.

(4) Synthesis of Intermediate 4

Intermediate 3

M3

Intermediate 4

In a 500 mL three-necked flask, Intermediate 3 was dissolved in tetrahydrofuran (THF), cooled to −80° C., and slowly added with equimolar n-butyl lithium (1 mol) dropwise at a temperature of not greater than −75° C. After dropwise addition, the system was heated to room temperature and reacted for 1 h. The THF solution dissolved with Reactant M3 was added to the reaction flask, and the mixed solution was refluxed for 3 h. After it was detected through thin-layer chromatography (TCL) that the reaction was completed, the system was cooled to room temperature. After the system was extracted with dichloromethane, the organic phases were combined, subjected to rotary evaporation to remove the organic solvent, and isolated through silica gel column chromatography (eluents: petroleum ether:ethyl acetate=10:1) to obtain Intermediate 4 with a yield of 60%.

SYNTHESIS EXAMPLE 2

An intermediate for preparing the organic compound was synthesized by the following specific step:

Intermediate 3

-continued

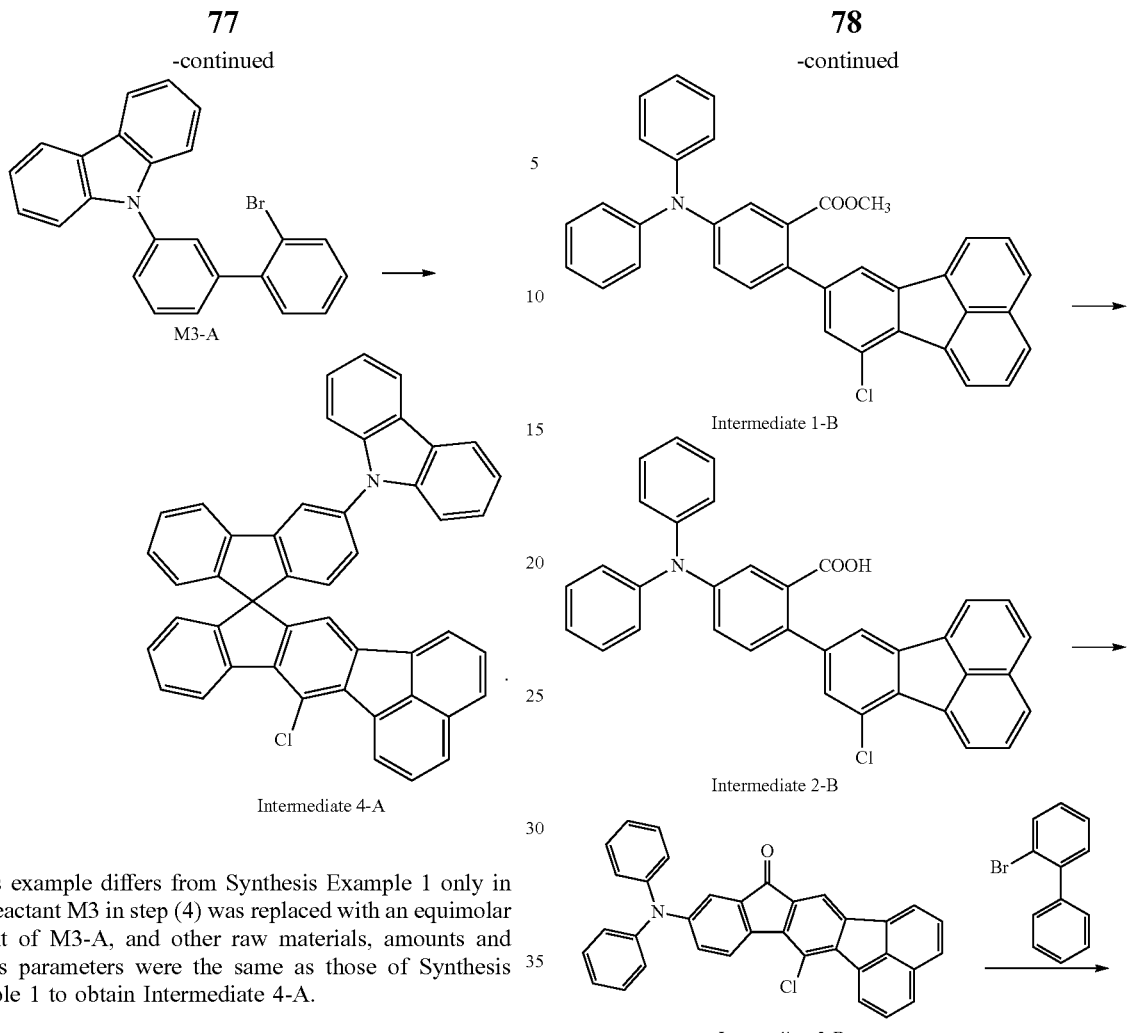

Intermediate 4-A

This example differs from Synthesis Example 1 only in that Reactant M3 in step (4) was replaced with an equimolar amount of M3-A, and other raw materials, amounts and process parameters were the same as those of Synthesis Example 1 to obtain Intermediate 4-A.

SYNTHESIS EXAMPLE 3

An intermediate for preparing the organic compound was synthesized by the following specific steps:

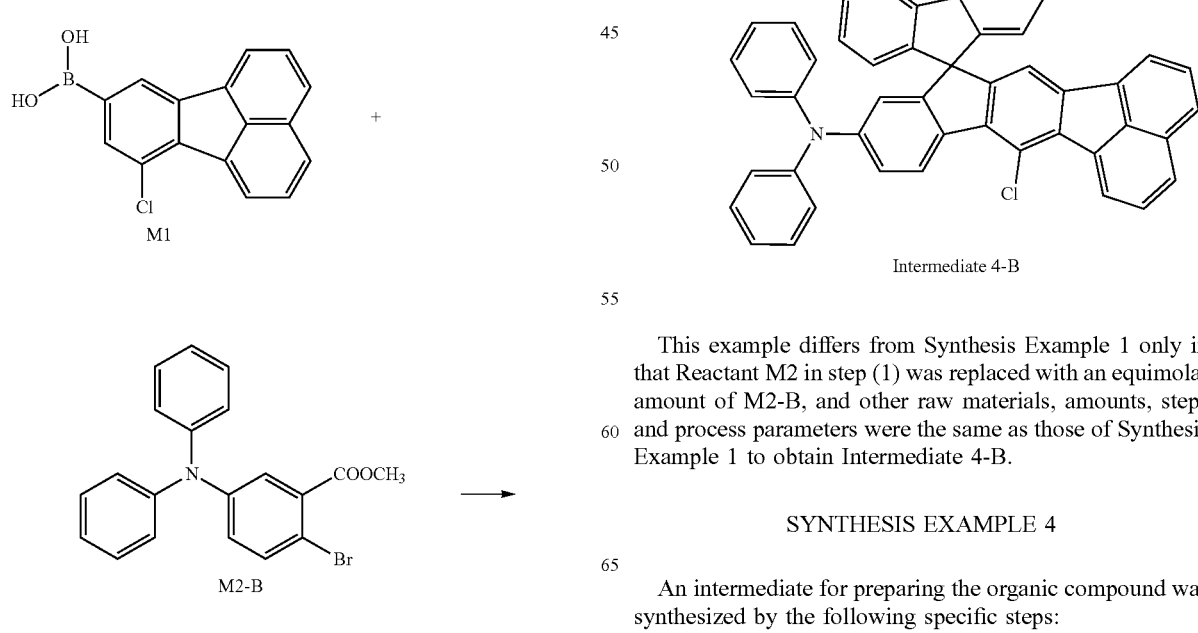

-continued

Intermediate 1-B

Intermediate 2-B

Intermediate 3-B

Intermediate 4-B

This example differs from Synthesis Example 1 only in that Reactant M2 in step (1) was replaced with an equimolar amount of M2-B, and other raw materials, amounts, steps and process parameters were the same as those of Synthesis Example 1 to obtain Intermediate 4-B.

SYNTHESIS EXAMPLE 4

An intermediate for preparing the organic compound was synthesized by the following specific steps:

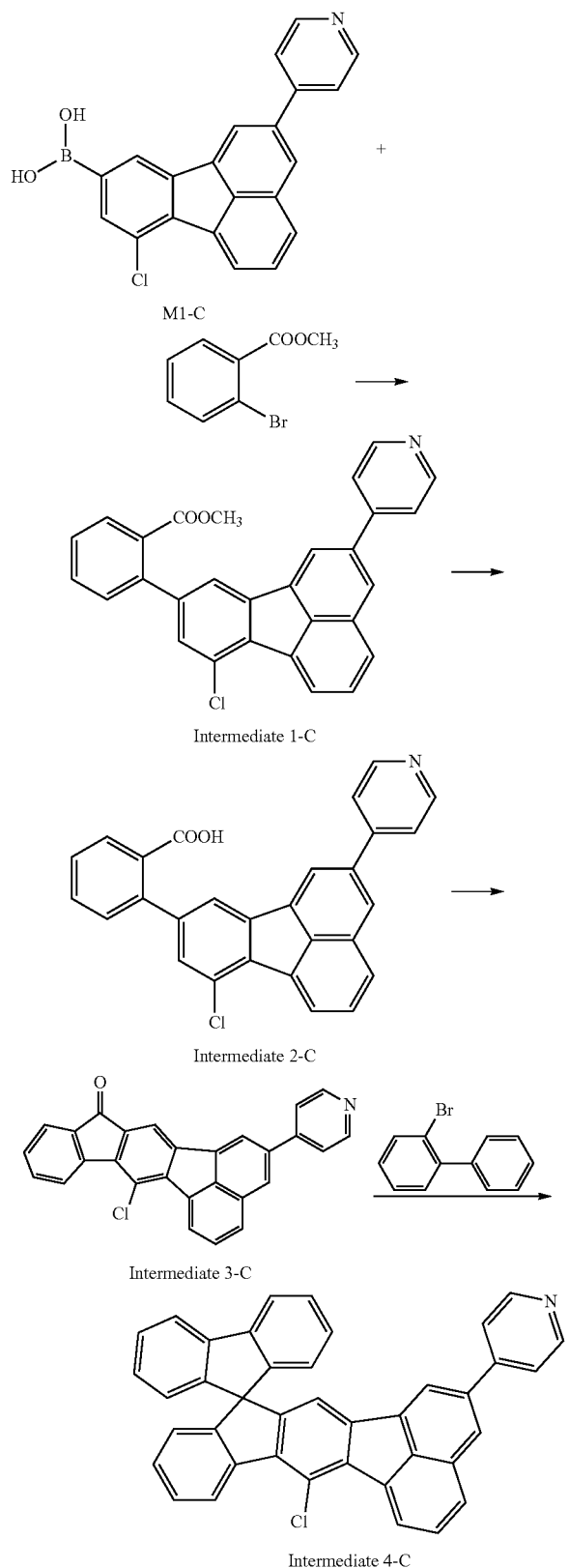

M1-C

Intermediate 1-C

Intermediate 2-C

Intermediate 3-C

Intermediate 4-C

This example differs from Synthesis Example 1 only in that Reactant M1 in step (1) was replaced with an equimolar amount of M1-C, and other raw materials, amounts, steps and process parameters were the same as those of Synthesis Example 1 to obtain Intermediate 4-C.

EXAMPLE 1

Organic Compound P3 having a structure of

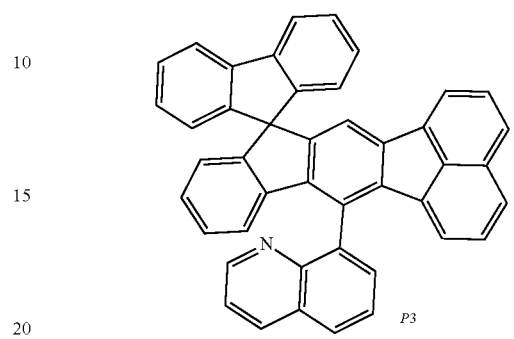

was prepared by the following method:

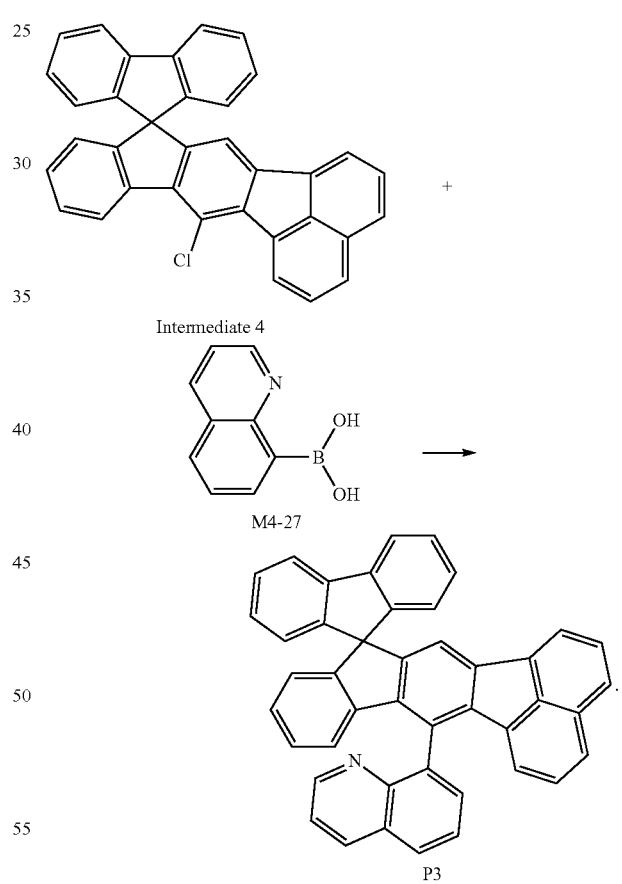

Intermediate 4

M4-27

P3

In a nitrogen flow, Intermediate 4 (30 mmol) and Reactant M4-3 (32 mmol) were dissolved in tetrahydrofuran, added with an aqueous solution of potassium carbonate (70 mmol), and heated and stirred. In a reflux state, a catalyst Pd(PPh$_3$)$_4$ (0.5 mmol) was added and heated and stirred for 8 h. After the reaction was completed, the system was cooled to room temperature, the solution of potassium carbonate was removed, and the system was filtered. The filtered solid was washed with ethanol to obtain the target product P3.

Matrix-assisted laser desorption/ionization time-of-flight (MALDI-TOF) mass spectrometry (m/z): calculated value: C$_{44}$H$_{25}$N, 567.20; measured value: 567.43.

Results of the elemental analysis of the compound (%): calculated value: C, 93.09, H, 4.44, N, 2.47; measured value: C, 93.08, H, 4.45, N, 2.47.

EXAMPLE 2

Organic Compound P27 having a structure of

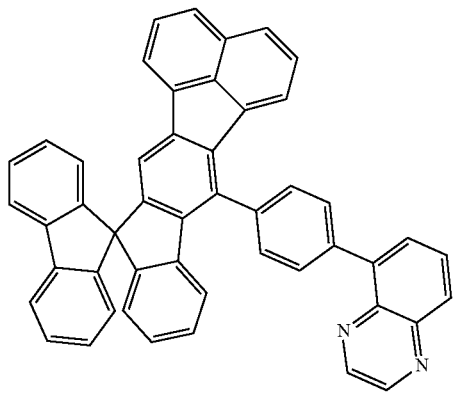
P27 was prepared by the following method:

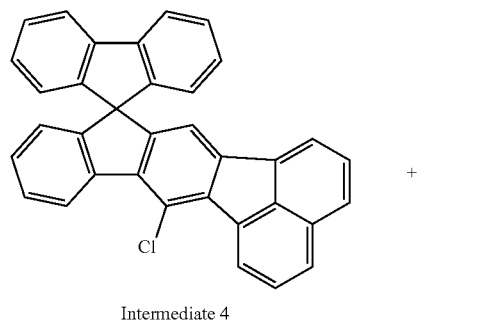
Intermediate 4

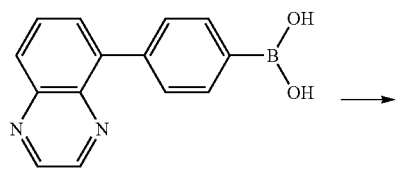
M4-27

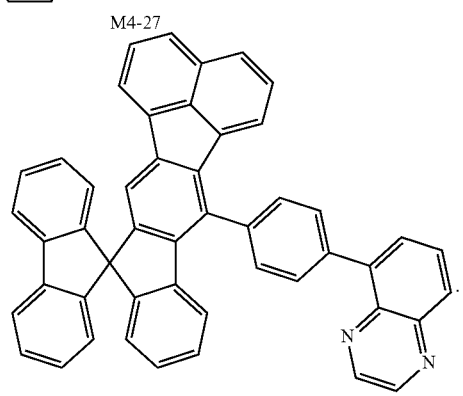
P27

This example differs from Example 1 only in that Reactant M4-3 was replaced with an equimolar amount of M4-27, and other raw materials, amounts and process parameters were the same as those of Example 1 to obtain the target product P27.

MALDI-TOF (m/z): calculated value: C$_{49}$H$_{28}$N$_2$, 644.23; measured value: 644.4.

Results of the elemental analysis of the compound (%): calculated value: C, 91.28, H, 4.38, N, 4.34; measured value: C, 91.29, H, 4.37, N, 4.34.

EXAMPLE 3

Organic Compound P28 having a structure of

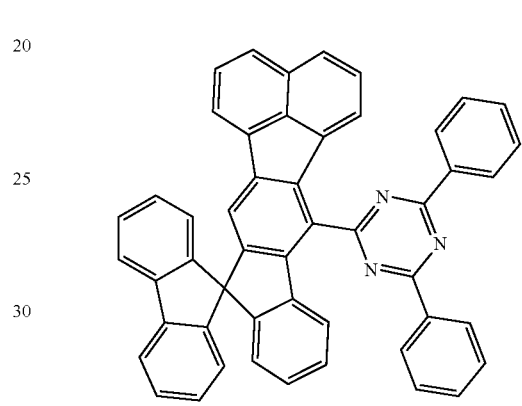
P28 was prepared by the following method:

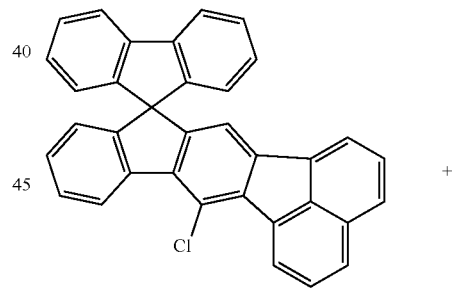
Intermediate 4

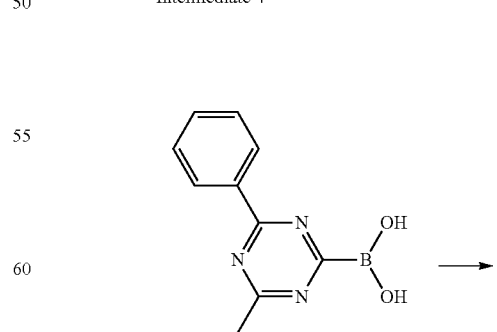
M4-28

-continued

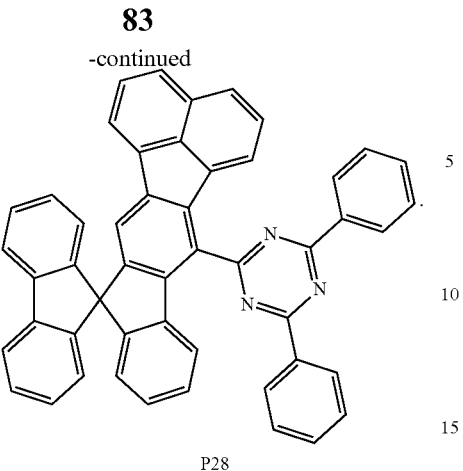

P28

This example differs from Example 1 only in that Reactant M4-3 was replaced with an equimolar amount of M4-28, and other raw materials, amounts and process parameters were the same as those of Example 1 to obtain the target product P28.

MALDI-TOF (m/z): calculated value: $C_{50}H_{29}N_3$, 671.24; measured value: 671.47.

Results of the elemental analysis of the compound (%): calculated value: C, 89.39, H, 4.35, N, 6.25; measured value: C, 89.40, H, 4.35, N, 6.25.

EXAMPLE 4

Organic Compound P40 having a structure of

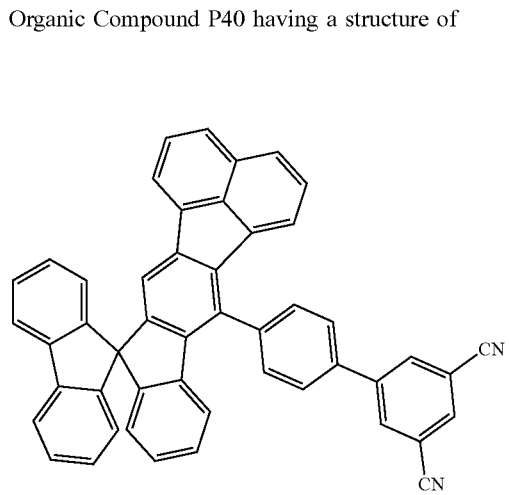

P40 was prepared by the following method:

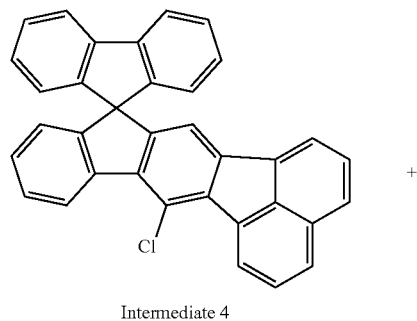

Intermediate 4

+

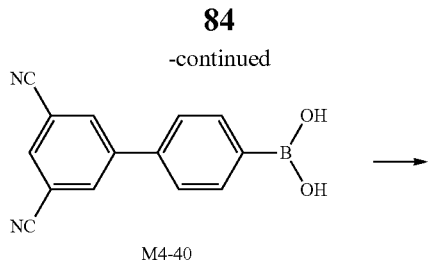

M4-40

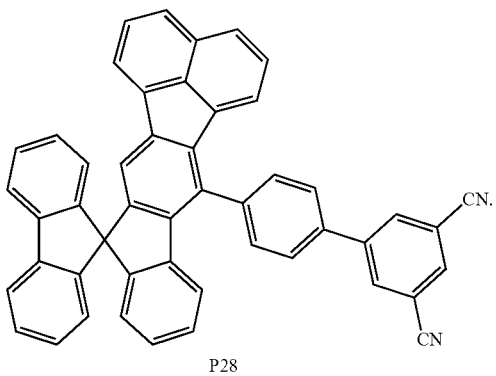

P28

This example differs from Example 1 only in that Reactant M4-3 was replaced with an equimolar amount of M4-40, and other raw materials, amounts and process parameters were the same as those of Example 1 to obtain the target product P40.

MALDI-TOF (m/z): calculated value: $C_{49}H_{26}N_2$, 642.21; measured value: 642.46.

Results of the elemental analysis of the compound (%): calculated value: C, 91.56, H, 4.08, N, 4.36; measured value: C, 91.55, H, 4.09, N, 4.36.

EXAMPLE 5

Organic Compound P44 having a structure of

P44

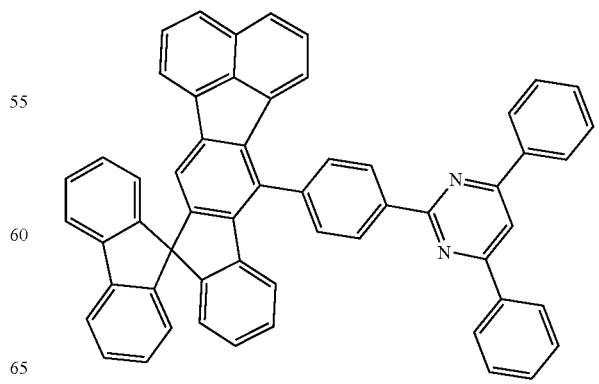

was prepared by the following method:

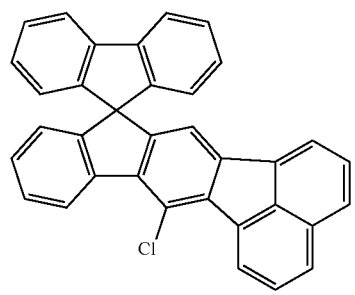

Intermediate 4

+

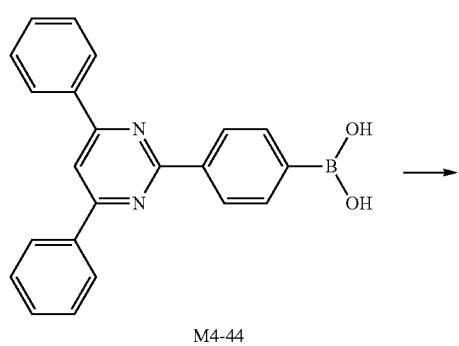

M4-44

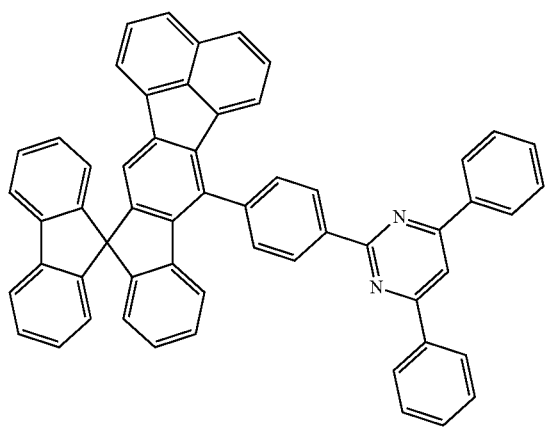

P44

This example differs from Example 1 only in that Reactant M4-3 was replaced with an equimolar amount of M4-44, and other raw materials, amounts and process parameters were the same as those of Example 1 to obtain the target product P44.

MALDI-TOF (m/z): calculated value: $C_{57}H_{34}N_2$, 746.27; measured value: 746.52.

Results of the elemental analysis of the compound (%): calculated value: C, 91.66, H, 4.59, N, 3.75; measured value: C, 91.67, H, 4.58, N, 3.75.

EXAMPLE 6

Organic Compound P54 having a structure of

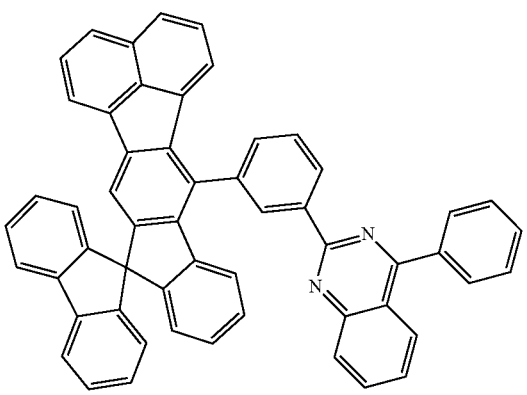

P54 was prepared by the following method:

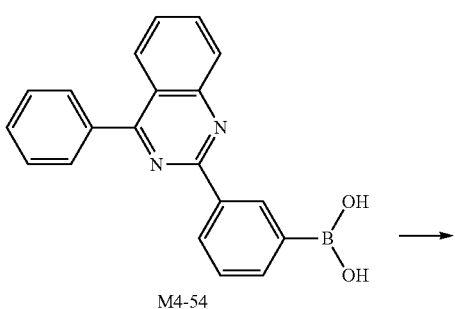

Intermediate 4

+

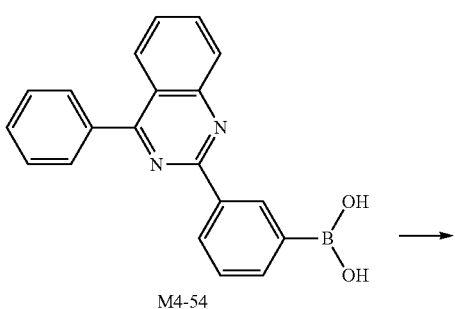

M4-54

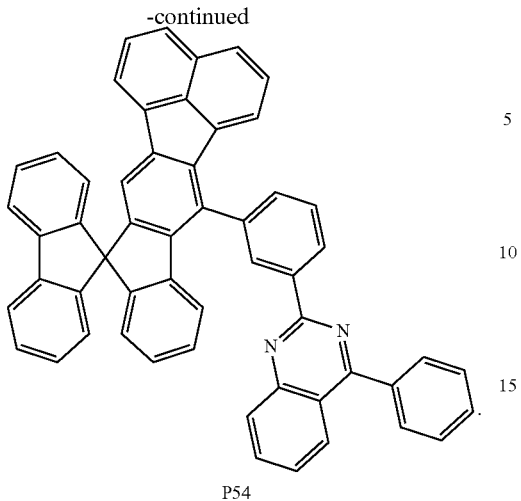

P54

This example differs from Example 1 only in that Reactant M4-3 was replaced with an equimolar amount of M4-54, and other raw materials, amounts and process parameters were the same as those of Example 1 to obtain the target product P54.

MALDI-TOF (m/z): calculated value: $C_{55}H_{32}N_2$, 720.26; measured value: 720.54.

Results of the elemental analysis of the compound (%): calculated value: C, 91.64, H, 4.47, N, 3.89; measured value: C, 91.63, H, 4.48, N, 3.89.

EXAMPLE 7

Organic Compound P97 having a structure of

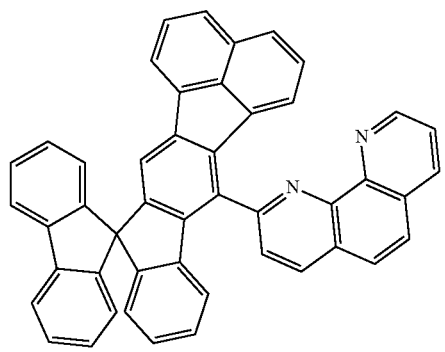

P97 was prepared by the following method:

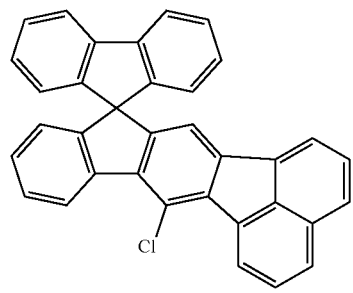

Intermediate 4

+

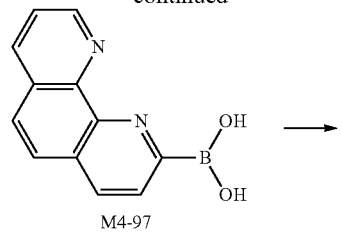

M4-97

→

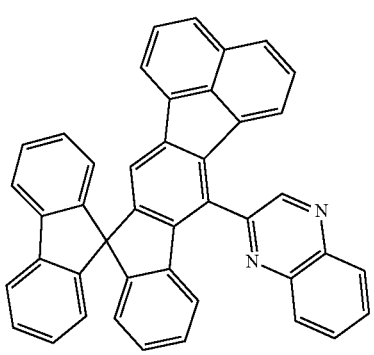

P97

This example differs from Example 1 only in that Reactant M4-3 was replaced with an equimolar amount of M4-97, and other raw materials, amounts and process parameters were the same as those of Example 1 to obtain the target product P97.

MALDI-TOF (m/z): calculated value: $C_{47}H_{26}N_2$, 618.21; measured value: 618.39.

Results of the elemental analysis of the compound (%): calculated value: C, 91.24, H, 4.24, N, 4.53; measured value: C, 91.23, H, 4.24, N, 4.53.

EXAMPLE 8

Organic Compound P101 having a structure of

P101 was prepared by the following method:

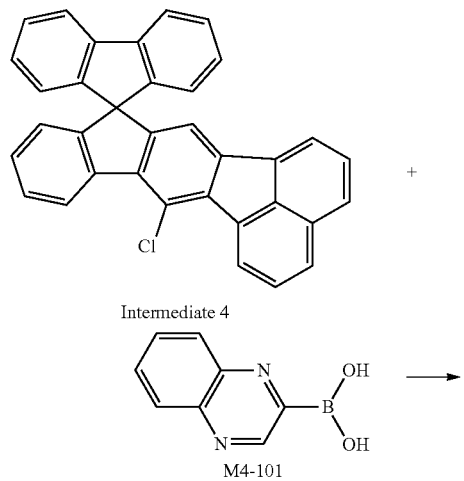

Intermediate 4

M4-101

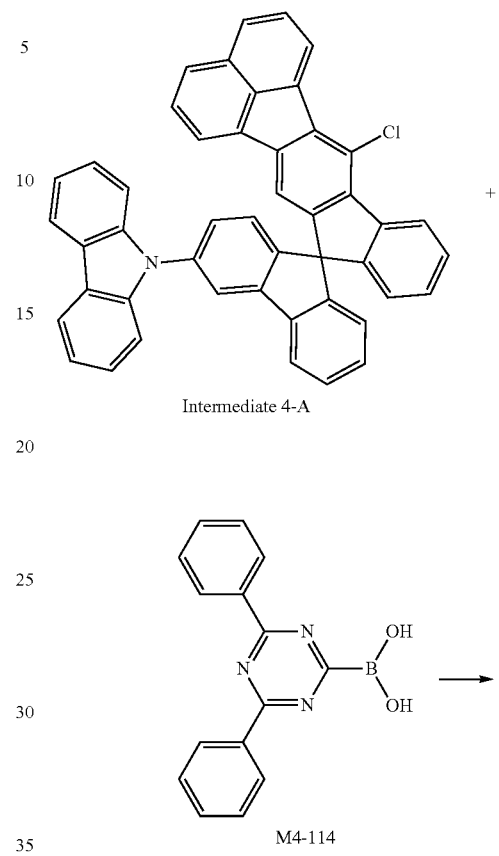

Intermediate 4-A

M4-114

P114

This example differs from Example 1 only in that Reactant M4-3 was replaced with an equimolar amount of M4-101, and other raw materials, amounts and process parameters were the same as those of Example 1 to obtain the target product P101.

MALDI-TOF (m/z): calculated value: $C_{43}H_{24}N_2$, 568.19; measured value: 568.44.

Results of the elemental analysis of the compound (%): calculated value: C, 90.82, H, 4.25, N, 4.93; measured value: C, 90.83, H, 4.24, N, 4.93.

EXAMPLE 9

Organic Compound P114 having a structure of

P114

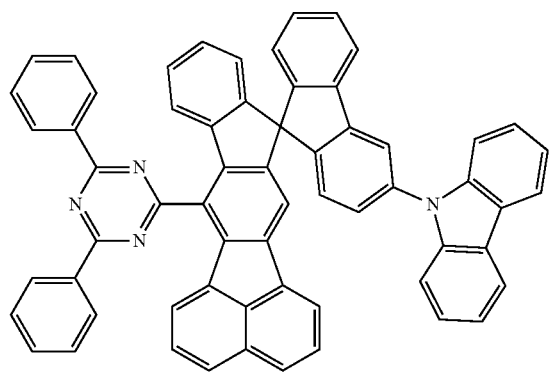

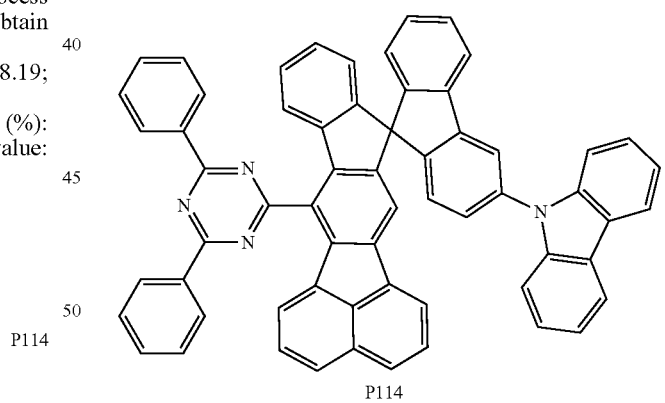

P114

This example differs from Example 1 only in that Intermediate 4 was replaced with an equimolar amount of Intermediate 4-A and Reactant M4-3 was replaced with an equimolar amount of M4-114, and other raw materials, amounts and process parameters were the same as those of Example 1 to obtain the target product P114.

MALDI-TOF (m/z): calculated value: $C_{62}H_{36}N_4$, 836.29; measured value: 836.47.

Results of the elemental analysis of the compound (%): calculated value: C, 88.97, H, 4.34, N, 6.69; measured value: C, 88.96, H, 4.35, N, 6.69.

EXAMPLE 10

Organic Compound P143 having a structure of

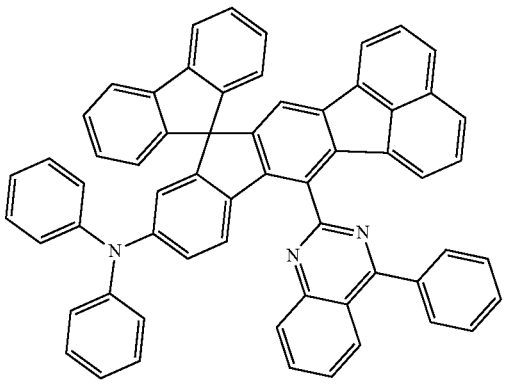

P143 was prepared by the following method:

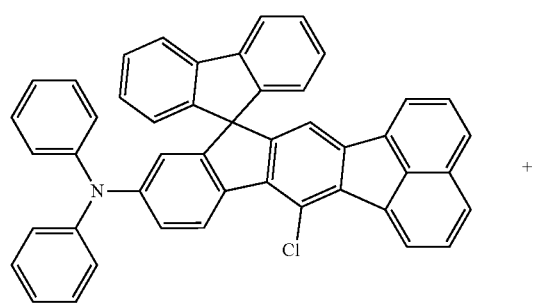

Intermediate 4-B

+

M4-114

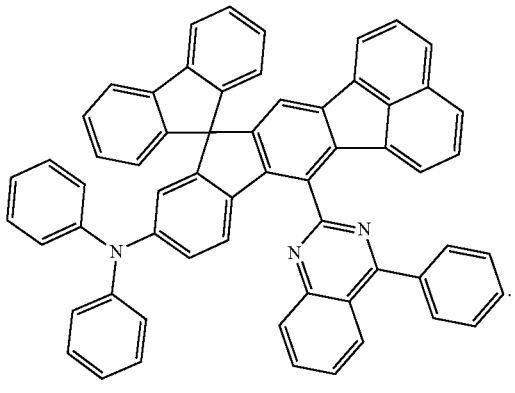

P143

This example differs from Example 1 only in that Intermediate 4 was replaced with an equimolar amount of Intermediate 4-B and Reactant M4-3 was replaced with an equimolar amount of M4-143, and other raw materials, amounts and process parameters were the same as those of Example 1 to obtain the target product P143.

MALDI-TOF (m/z): calculated value: $C_{61}H_{37}N_3$, 811.30; measured value: 811.53.

Results of the elemental analysis of the compound (%): calculated value: C, 90.23, H, 4.59, N, 5.18; measured value: C, 90.24, H, 4.58, N, 5.18.

EXAMPLE 11

Organic Compound P153 having a structure of

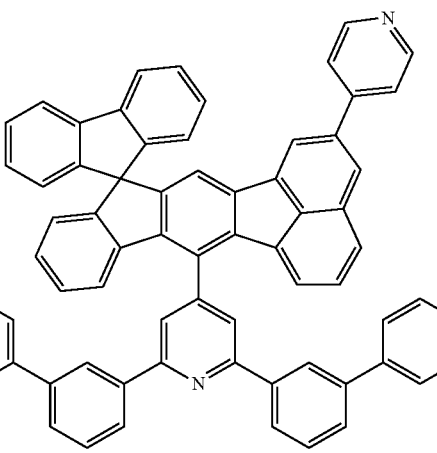

P153 was prepared by the following method:

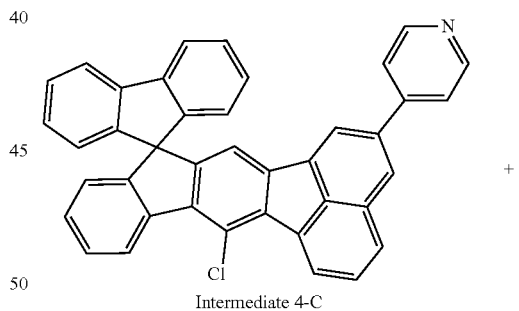

Intermediate 4-C

+

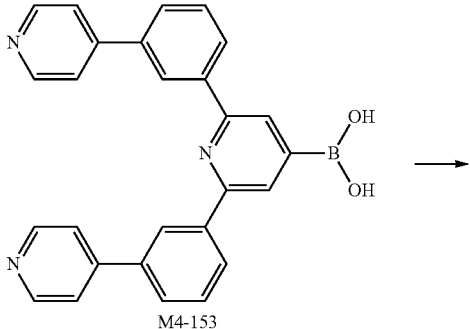

M4-153

-continued

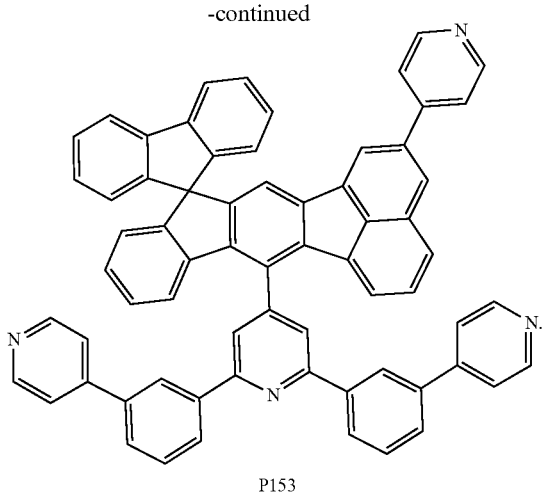

P153

This example differs from Example 1 only in that Intermediate 4 was replaced with an equimolar amount of Intermediate 4-C and Reactant M4-3 was replaced with an equimolar amount of M4-153, and other raw materials, amounts and process parameters were the same as those of Example 1 to obtain the target product P153.

MALDI-TOF (m/z): calculated value: $C_{67}H_{40}N_4$, 900.33; measured value: 900.52.

Results of the elemental analysis of the compound (%): calculated value: C, 89.31, H, 4.47, N, 6.22; measured value: C, 89.32, H, 4.46, N, 6.22.

Simulated Calculations of Compounds

By use of a density-functional theory (DFT), the distribution and energy levels of molecular frontier orbital HOMO and LUMO were optimized and calculated for the organic compounds provided by the present disclosure using a Gaussian 09 package (Gaussian Inc.) at a calculation level of B3LYP/6-31G(d). Meanwhile, based on a time-dependent density-functional theory (TD-DFT), the singlet energy levels $E_S$ of molecules of the organic compounds were simulated and calculated. The results are shown in Table 1.

TABLE 1

| Organic Compound | LUMO (eV) | HOMO (eV) | $E_g$ (eV) | $E_S$ (eV) |
| --- | --- | --- | --- | --- |
| P3   | −1.77 | −5.38 | 3.61 | 2.840 |
| P27  | −2.07 | −5.55 | 3.48 | 2.803 |
| P28  | −1.95 | −5.54 | 3.59 | 2.923 |
| P40  | −2.17 | −5.62 | 3.45 | 2.868 |
| P44  | −1.92 | −5.49 | 3.57 | 2.939 |
| P54  | −1.94 | −5.52 | 3.58 | 2.895 |
| P97  | −1.85 | −5.43 | 3.58 | 2.802 |
| P101 | −2.11 | −5.57 | 3.46 | 2.751 |
| P114 | −2.01 | −5.30 | 3.29 | 2.908 |
| P153 | −2.17 | −5.72 | 3.55 | 2.926 |

As can be known from the calculation results in Table 1, in the present disclosure, through the special design of the molecular structure, the organic compound has suitable HOMO and LUMO energy levels which are deeper and a relatively high singlet energy level $E_S$ of 2.75-2.94 eV and can well match the energy level of an existing material of an adjacent layer used in mass production, effectively transport electrons, and confine holes and excitons in the light-emitting region, which is conducive to widening the light-emitting region and improving the luminescence efficiency and lifetime of the device. The organic compound is especially suitable for use as a host material when used as an OLED material.

Application examples in which the organic compounds of the present disclosure are applied to the OLED device are described below.

Application Example 1

Figure 2:
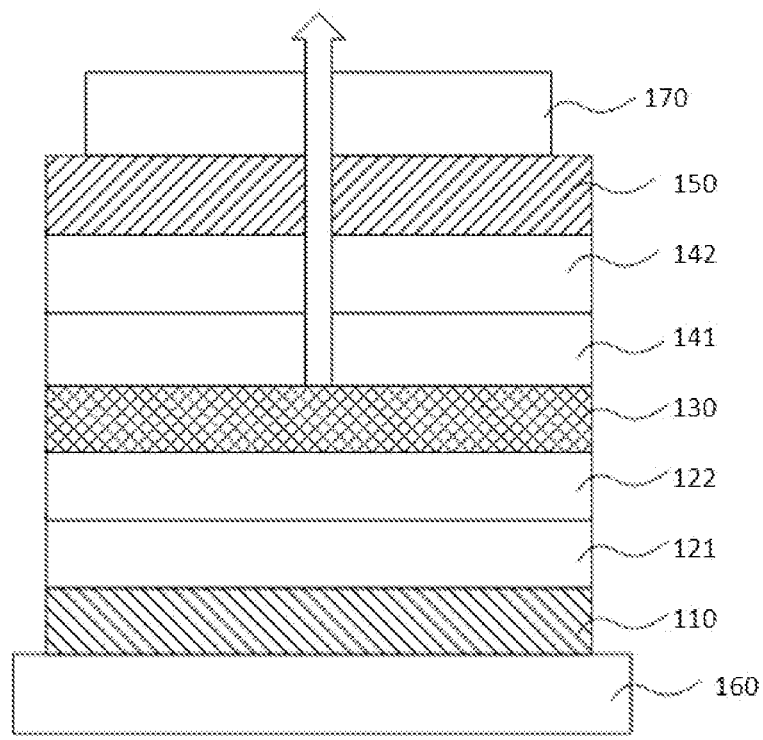
FIG. 2 is a structure diagram of an OLED device according to another embodiment of the present disclosure.

An OLED device whose structure is shown in FIG. 2 includes a substrate 160, an anode 110, a first hole transport layer 121, a second hole transport layer 122, a light-emitting layer 130, a first electron transport layer 141, a second electron transport layer 142, a cathode 150 and a capping layer 170 which are stacked in sequence. The anode is indium tin oxide (ITO) and has a thickness of 15 nm, the first hole transport layer has a thickness of 10 nm, the second hole transport layer has a thickness of 95 nm, the light-emitting layer has a thickness of 30 nm, the first electron transport layer has a thickness of 35 nm, the second electron transport layer has a thickness of 5 nm, the cathode is a magnesium-silver electrode and has a thickness of 15 nm, where a mass ratio of magnesium to silver is 1:9, and the capping layer (CPL) has a thickness of 100 nm.

The method for preparing the OLED device includes the steps below.

(1) A glass substrate was cut into a size of 50 mm×50 mm×0.7 mm, sonicated in isopropyl alcohol and deionized water for 30 minutes separately, and then exposed to ozone for about 10 minutes for cleaning. The glass substrate obtained through magnetron sputtering and having the ITO anode was installed onto a vacuum deposition apparatus.

(2) Compound HAT-CN was vacuum evaporated on the ITO anode at a vacuum degree of $2×10^{-6}$ Pa as the first hole transport layer with a thickness of 10 nm.

(3) Compound TAPC was vacuum evaporated on the first hole transport layer as the second hole transport layer with a thickness of 95 nm.

(4) The light-emitting layer with a thickness of 30 nm was vacuum evaporated on the second hole transport layer, where Organic Compound P3 and Organic Compound P163 provided by the present disclosure were used as a host material (where a mass ratio of P3 to P163 was 4:6), Ir(MDQ)$_2$(acac) was used as a doping material, a mass ratio of the host material to Ir(MDQ)$_2$(acac) was 97:3.

(5) Compound BCP was vacuum evaporated on the light-emitting layer as the first electron transport layer with a thickness of 35 nm.

(6) Compound Alq$_3$ was vacuum evaporated on the first electron transport layer as the second electron transport layer with a thickness of 5 nm.

(7) The magnesium-silver electrode was vacuum evaporated on the second electron transport layer as the cathode with a thickness of 15 nm, where a mass ratio of Mg to Ag was 1:9.

(8) Compound CBP with a high refractive index was vacuum evaporated on the cathode as the capping layer (cathode covering layer) with a thickness of 100 nm, so as to obtain the OLED device.

The materials used in the OLED device have the following structures:
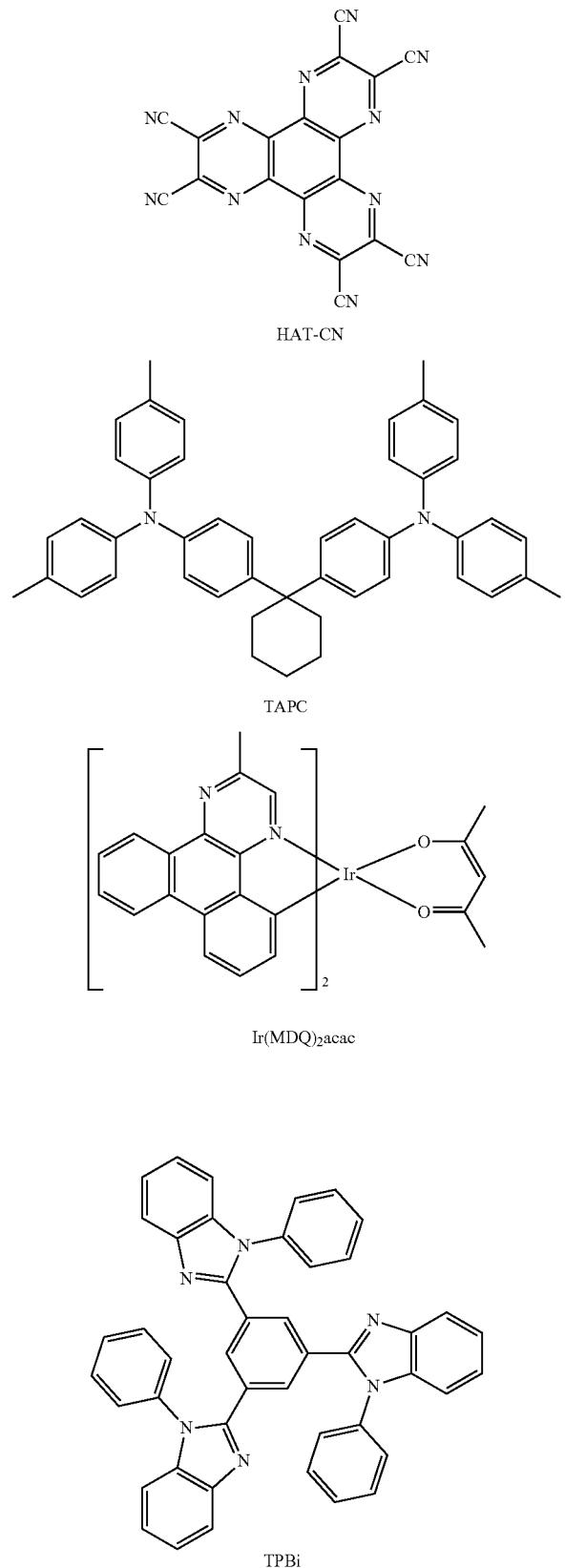
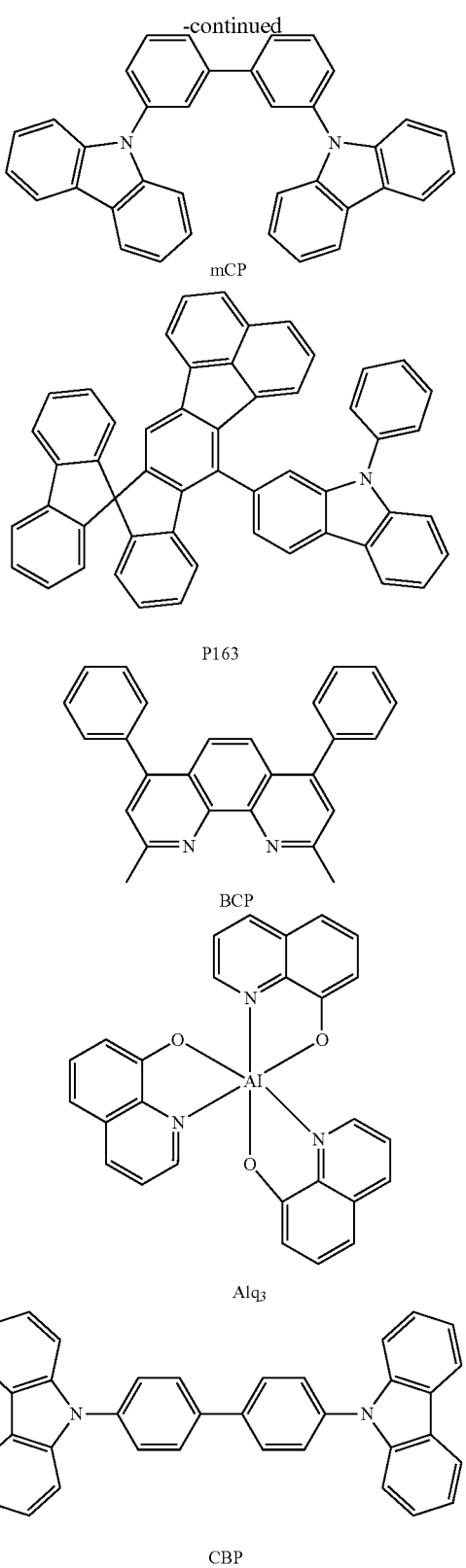
Application Examples 2 to 12
An OLED device differs from Application Example 1 only in that Organic Compound P3 in step (4) was replaced with the same amount of Organic Compounds P27, P28, P40, P44, P54, P97, P101, P143, P153, P156 and P159, respectively; and the structure of the device, thicknesses, other materials and the preparation method were the same as those of Application Example 1.

Application Example 13

An OLED device differs from Application Example 1 only in that the host material (a combination of P3 and P163) in step (4) was replaced with the same amount of Organic Compound P114; and the structure of the device, thicknesses, other materials and the preparation method were the same as those of Application Example 1.

Comparative Example 1

An OLED device differs from Application Example 1 only in that the host material (a combination of P3 and P163) in step (4) was replaced with the same amount of Comparative Compound mCP; and the structure of the device, thicknesses, other materials and the preparation method were the same as those of Application Example 1.

Performance Evaluation of the OLED Device

A Keithley 2365A digital nanovoltmeter was used for testing currents of the OLED device at different voltages, and then the currents were divided by a luminescence area to obtain current densities of the OLED device at different voltages. A Konica Minolta CS-2000 spectroradiometer was used for testing the brightness and radiation energy flux densities of the OLED device at different voltages. According to the current densities and brightness of the OLED device at different voltages, a turn-on voltage and current efficiency (CE, cd/A) at the same current density (10 mA/cm$^2$) were obtained, where $V_{on}$ denotes the turn-on voltage when the brightness is 1 cd/m$^2$. A lifetime LT95 was obtained (under a testing condition of 50 mA/cm$^2$) by measuring the time taken for the OLED device to reach 95% of its initial brightness.

The test data on the turn-on voltage $V_{on}$, current efficiency (CE) and lifetime LT95 of Comparative Example 1 (REF) is regarded as 100%, and the $V_{on}$, CE and LT95 of Application Examples 1 to 13 are ratios of their respective test data to the test data of Comparative Example 1, that is, relative values relative to Comparative Example 1. Specific data is shown in Table 2.

TABLE 2

| OLED Device | Host Material of the Lightemitting Layer | $V_{on}$ | CE | LT95 |
| --- | --- | --- | --- | --- |
| Application Example 1 | P3/P163 | 96.8% | 106.5% | 107.2% |
| Application Example 2 | P27/P163 | 96.4% | 105.8% | 108.3% |
| Application Example 3 | P28/P163 | 97.4% | 105.4% | 108.6% |
| Application Example 4 | P40/P163 | 98.1% | 105.6% | 106.8% |
| Application Example 5 | P44/P163 | 97.6% | 107.3% | 106.0% |
| Application Example 6 | P54/P163 | 97.1% | 106.2% | 107.5% |
| Application Example 7 | P97/P163 | 96.7% | 107.8% | 105.9% |
| Application Example 8 | P101/P163 | 97.8% | 106.1% | 105.7% |
| Application Example 9 | P143/P163 | 97.6% | 103.8% | 104.2% |

TABLE 2-continued

| OLED Device | Host Material of the Lightemitting Layer | $V_{on}$ | CE | LT95 |
| --- | --- | --- | --- | --- |
| Application Example 10 | P153/P163 | 97.8% | 108.1% | 106.2% |
| Application Example 11 | P156/P163 | 97.3% | 106.4% | 105.8% |
| Application Example 12 | P159/P163 | 97.0% | 105.5% | 108.1% |
| Application Example 13 | P114 | 97.8% | 105.3% | 107.3% |
| Comparative Example 1 (REF) | mCP | 100% | 100% | 100% |

As can be seen from Table 2, compared with the device in Comparative Example 1, the OLED device using the organic compound of the present disclosure has a lower operating voltage, higher luminescence efficiency and a longer lifetime. Compared with the device in the Comparative Example, the OLED device using the organic compound of the present disclosure has a reduced operating voltage, significantly improved luminescence efficiency and a significantly prolonged lifetime. This may result from that the organic compound of the present disclosure has a relatively deep LUMO energy level so that electron injection is smoother, thereby reducing the operating voltage of the device; the organic compound has a suitable HOMO value and can effectively block holes and confine holes in the light-emitting region for recombination with electrons, which is conducive to widening the light-emitting recombination region and improving the luminescence efficiency of the device; meanwhile, the organic compound of the present disclosure has good thermal stability and film formability, which is conducive to the stability of the device and prolongs the lifetime of the device.

The applicant has stated that although the organic compound and the application thereof in the present disclosure are described through the preceding embodiments, the present disclosure is not limited to the processes and steps described above, which means that the implementation of the present disclosure does not necessarily depend on the processes and steps described above. It should be apparent to those skilled in the art that any improvements made to the present disclosure, equivalent replacements of raw materials selected in the present disclosure and additions of adjuvant ingredients thereof and selections of specific methods, etc., all fall within the protection scope and the disclosure scope of the present disclosure.

What is claimed is:

1. An organic compound, wherein the organic compound has a structure represented by Formula I:

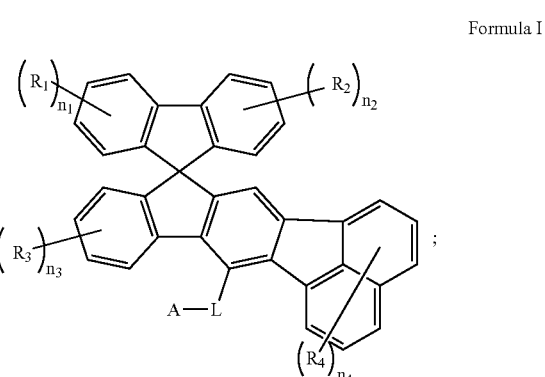

Formula I wherein L is selected from any one of a single bond, substituted or unsubstituted C6 to C30 arylene, or substituted or unsubstituted C3 to C30 heteroarylene;

A is selected from any one of substituted or unsubstituted C6 to C30 aryl, substituted or unsubstituted C3 to C30 heteroaryl, substituted or unsubstituted C6 to C30 arylketonyl, substituted or unsubstituted C6 to C30 arylsulfonyl, or substituted or unsubstituted C6 to C30 arylboryl;

$R_1$, $R_2$, $R_3$ and $R_4$ are each independently selected from any one of halogen, cyano, substituted or unsubstituted C1 to C30 linear or branched alkyl, substituted or unsubstituted C3 to C30 cycloalkyl, substituted or unsubstituted C1 to C30 alkoxy, substituted or unsubstituted C6 to C30 aryl, substituted or unsubstituted C3 to C30 heteroaryl, or substituted or unsubstituted C6 to C30 arylamino;

$n_1$, $n_2$ and $n_3$ are each independently selected from an integer from 0 to 4; and $n_4$ is selected from an integer from 0 to 6.

2. The organic compound according to claim 1, wherein the substituted substituents in L, A, $R_1$, $R_2$, $R_3$ and $R_4$ are each independently selected from at least one of halogen, cyano, unsubstituted or R'-substituted C1 to C10 linear or branched alkyl, C3 to C10 cycloalkyl, unsubstituted or R'-substituted C1 to C10 alkoxy, unsubstituted or R'-substituted C6 to C20 aryl, unsubstituted or R'-substituted C3 to C20 heteroaryl, or unsubstituted or R'-substituted C6 to C20 arylamino; wherein R' is selected from at least one of halogen, cyano, C1 to C6 linear or branched alkyl, C6 to C12 aryl or C3 to C12 heteroaryl.

3. The organic compound according to claim 1, wherein L is selected from any one of a single bond, substituted or unsubstituted C6 to C20 arylene, or substituted or unsubstituted C3 to C20 heteroarylene; and wherein the substituted substituents in L are each independently selected from at least one of cyano, unsubstituted or halogenated C1 to C6 linear or branched alkyl, C6 to C12 aryl or C3 to C12 heteroaryl.

4. The organic compound according to claim 1, wherein L is selected from any one of a single bond,

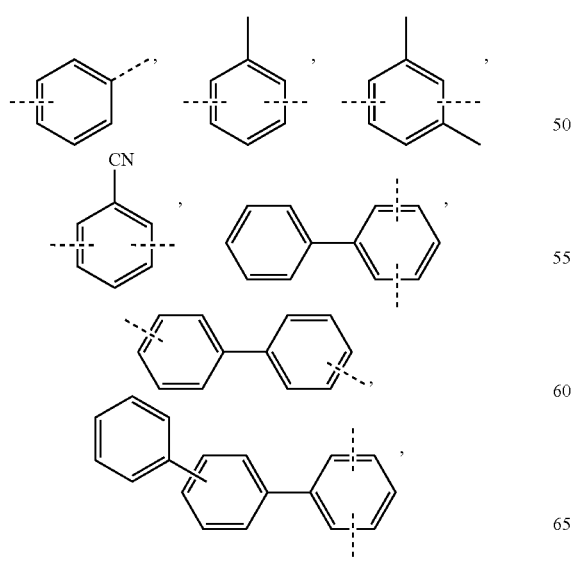

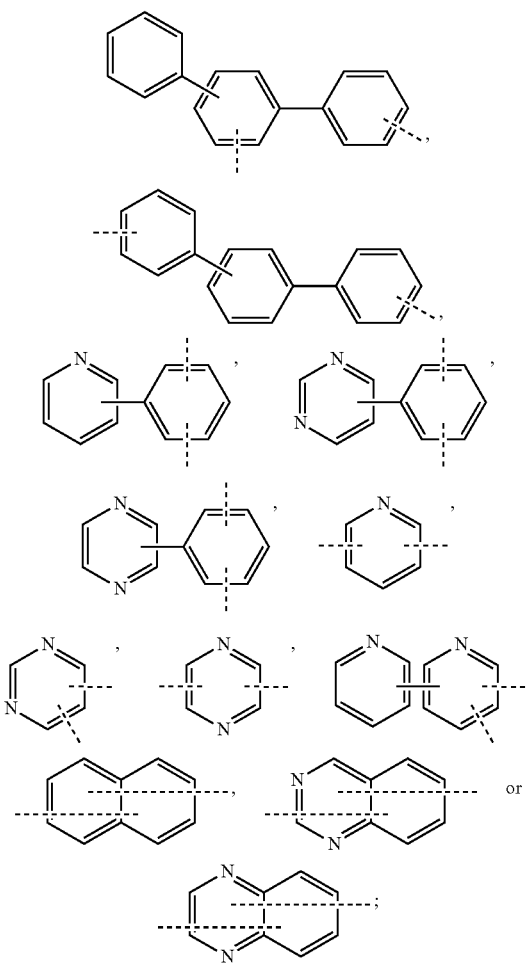

wherein the dashed line represents a linkage site of the group.

5. The organic compound according to claim 1, wherein A is selected from any one of the following groups:

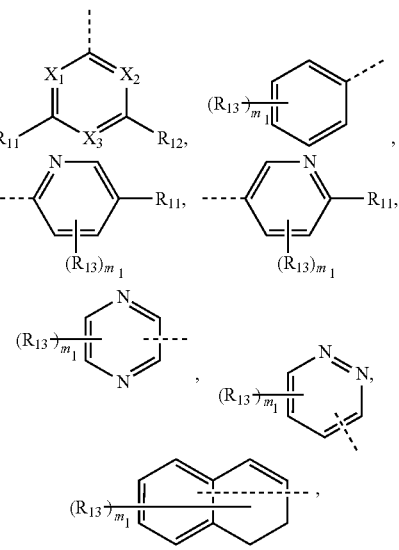

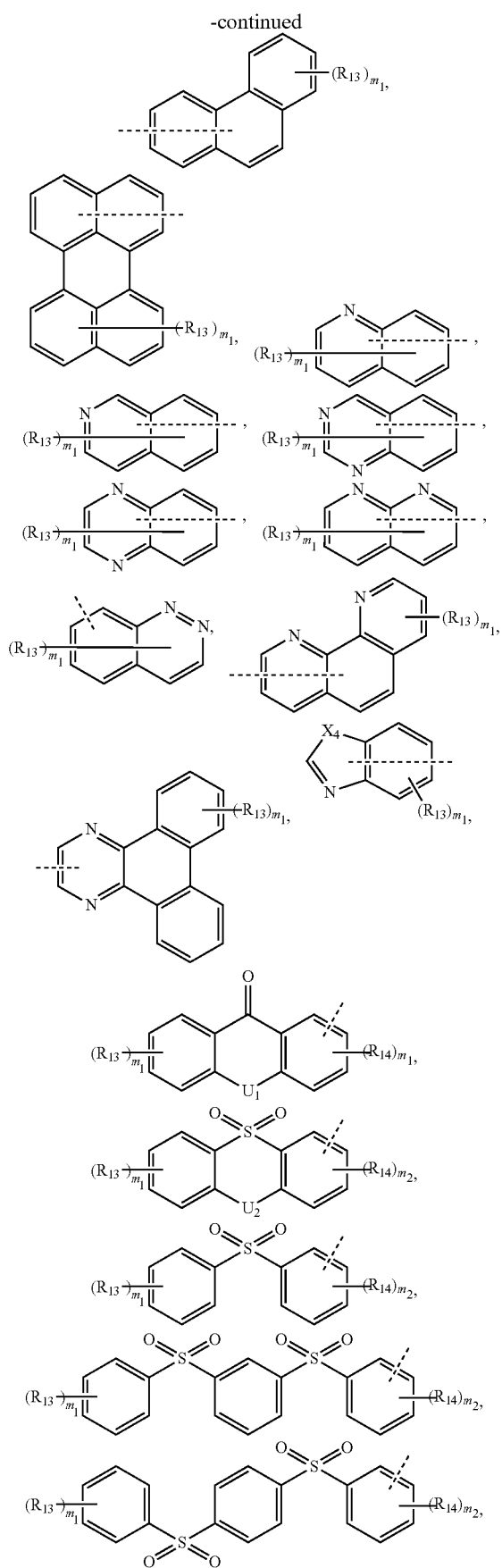

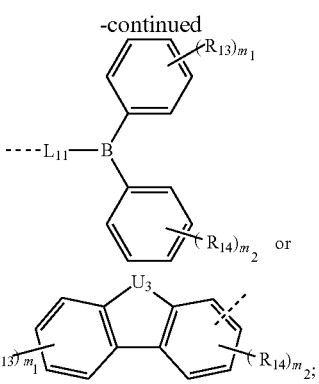

wherein the dashed line represents a linkage site of the group;

wherein $R_{11}$ and $R_{12}$ are each independently selected from any one of hydrogen, halogen, cyano, unsubstituted or R'-substituted C1 to C10 linear or branched alkyl, C3 to C10 cycloalkyl, unsubstituted or R'-substituted C1 to C10 alkoxy, unsubstituted or R'-substituted C6 to C20 aryl, or unsubstituted or R'-substituted C3 to C20 heteroaryl;

$R_{13}$ and $R_{14}$ are each independently selected from any one of halogen, cyano, unsubstituted or R'-substituted C1 to C10 linear or branched alkyl, C3 to C10 cycloalkyl, unsubstituted or R'-substituted C1 to C10 alkoxy, unsubstituted or R'-substituted C6 to C20 aryl, or unsubstituted or R'-substituted C3 to C20 heteroaryl;

R' is selected from at least one of halogen, cyano, C1 to C6 linear or branched alkyl, C6 to C12 aryl or C3 to C12 heteroaryl;

$U_1$ is

or $CR_{15}R_{16}$;

$U_2$ is $CR_{15}R_{16}$,

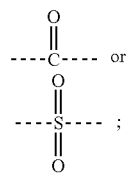

$U_3$ is O, S or $NR_{17}$;

$R_{15}$, $R_{16}$ and $R_{17}$ are each independently selected from any one of C1 to C10 linear or branched alkyl, C6 to C20 aryl or C3 to C20 heteroaryl;

$L_{11}$ is selected from any one of a single bond or C6 to C20 arylene; and $m_1$ and $m_2$ are each independently selected from an integer from 0 to 3.

6. The organic compound according to claim 5, wherein $R_{11}$ and $R_{12}$ are each independently selected from any one of hydrogen, cyano, C1 to C6 linear or branched alkyl, unsubstituted or R'-substituted phenyl, unsubstituted or R'-substituted naphthyl, unsubstituted or R'-substituted pyridyl, unsubstituted or R'-substituted pyrimidinyl, unsubstituted or R'-substituted pyrazinyl, unsubstituted or R'-substituted quinolinyl, unsubstituted or R'-substituted isoquinolinyl, unsubstituted or R'-substituted quinoxalinyl and unsubstituted or R'-substituted quinazolinyl; wherein R' is selected from at least one of cyano, C1 to C6 linear or branched alkyl, phenyl, pyridyl, pyrimidinyl or pyrazinyl.

7. The organic compound according to claim 5, wherein A is selected from any one of the following groups:

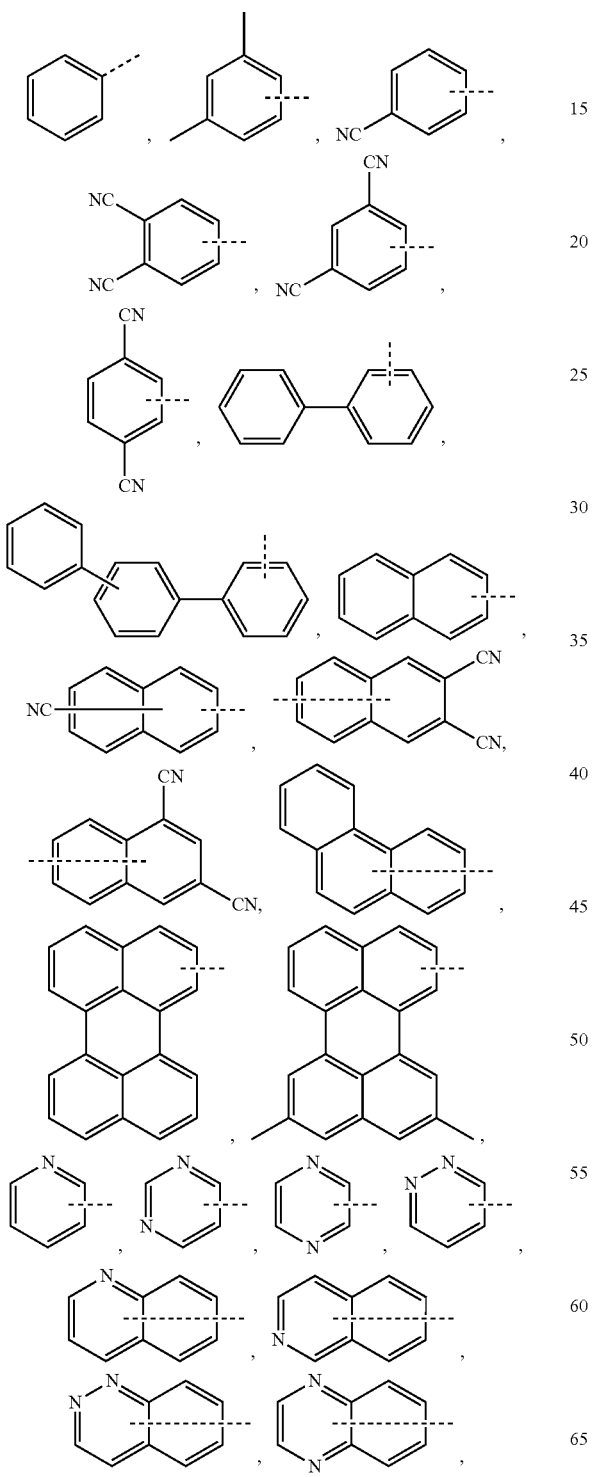

-continued

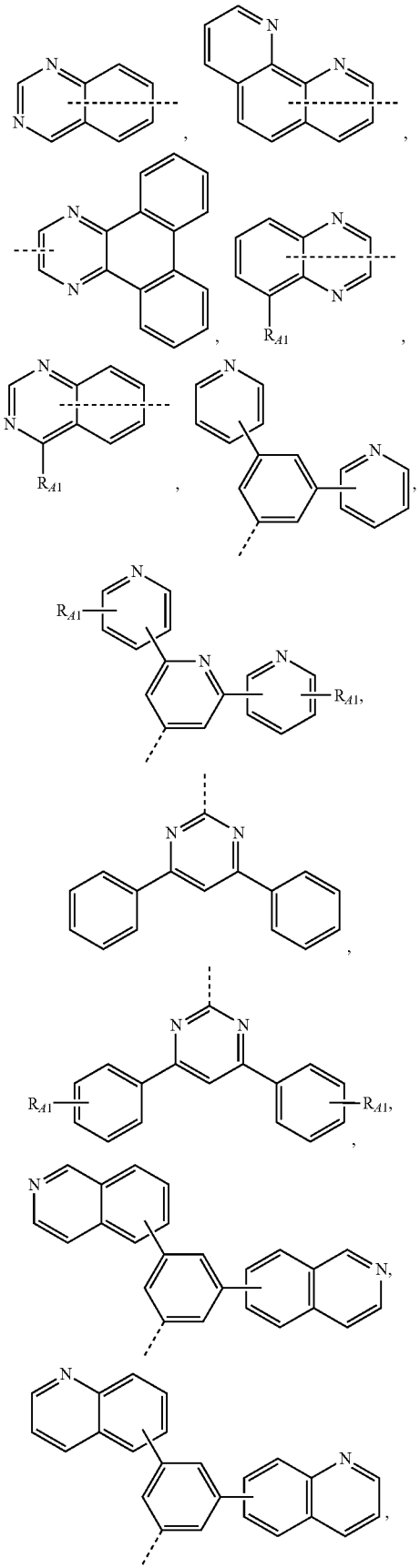

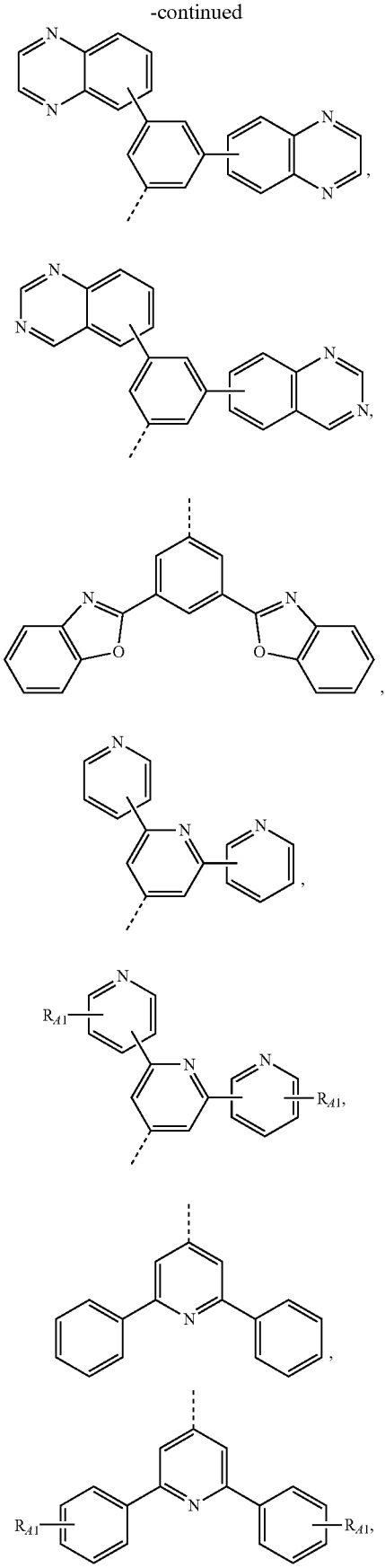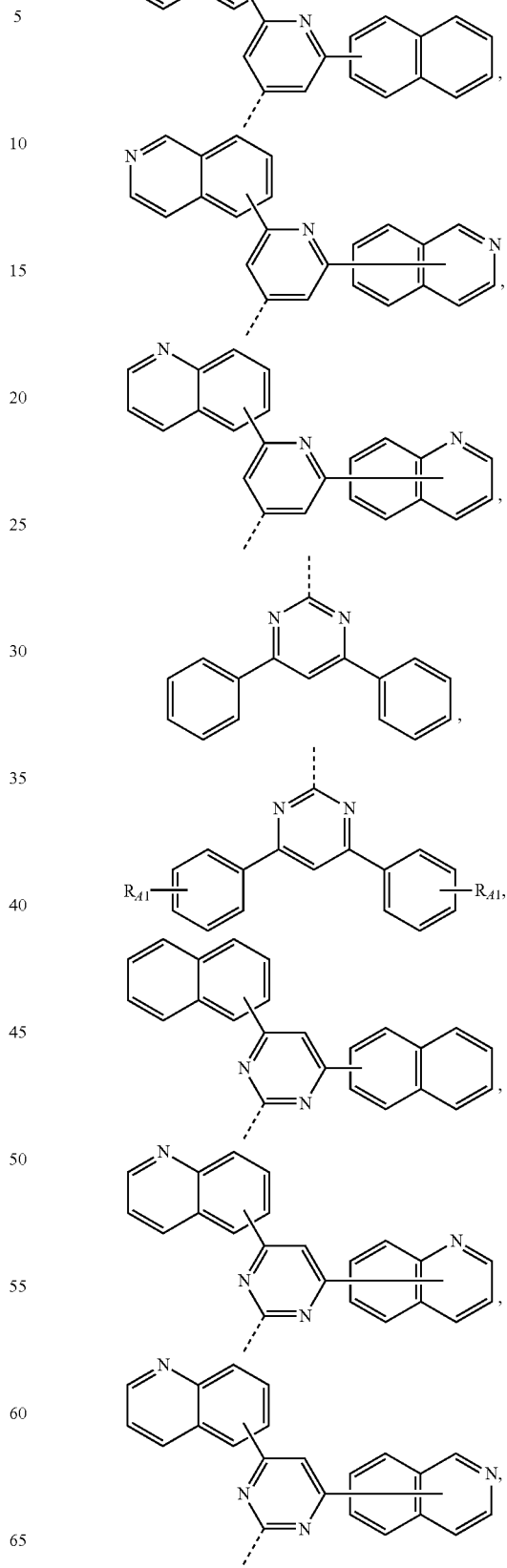

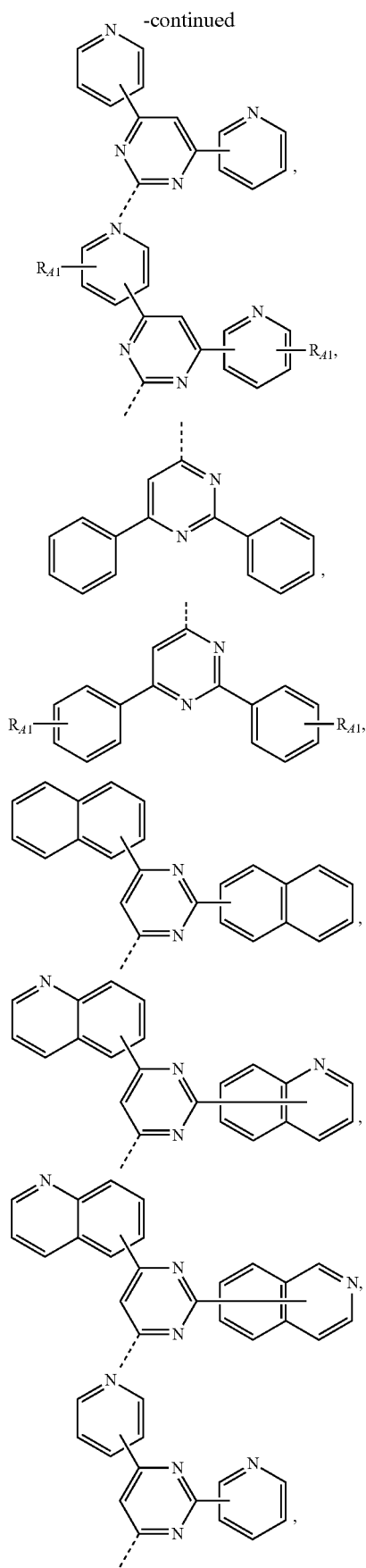
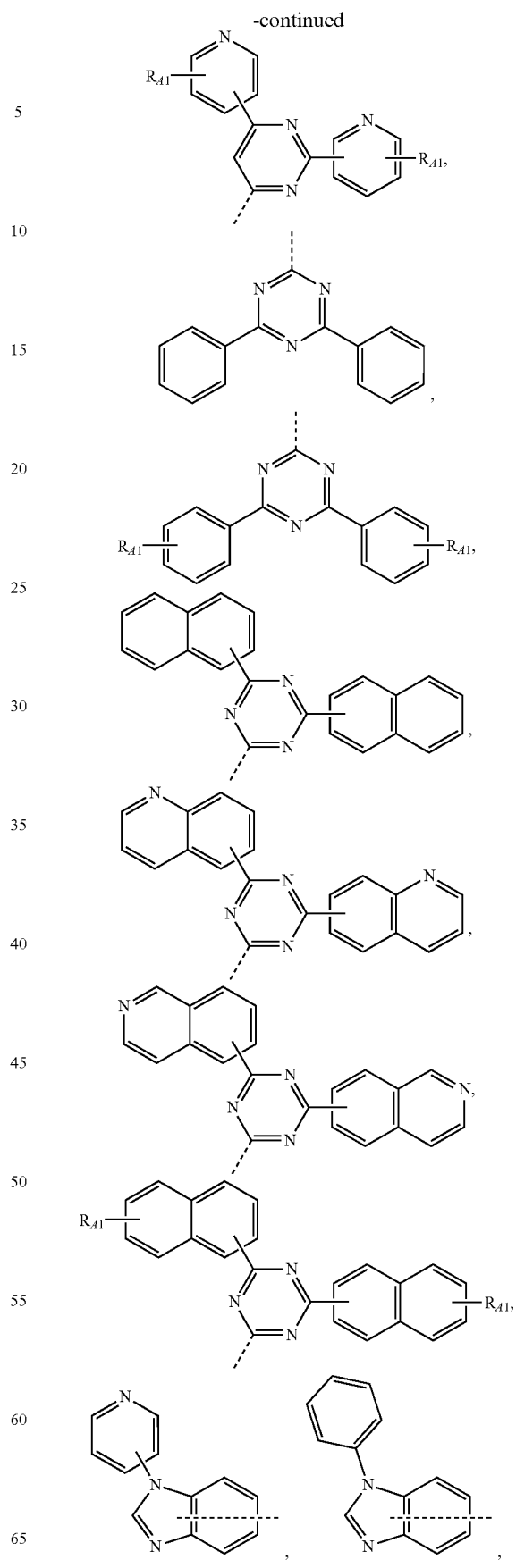

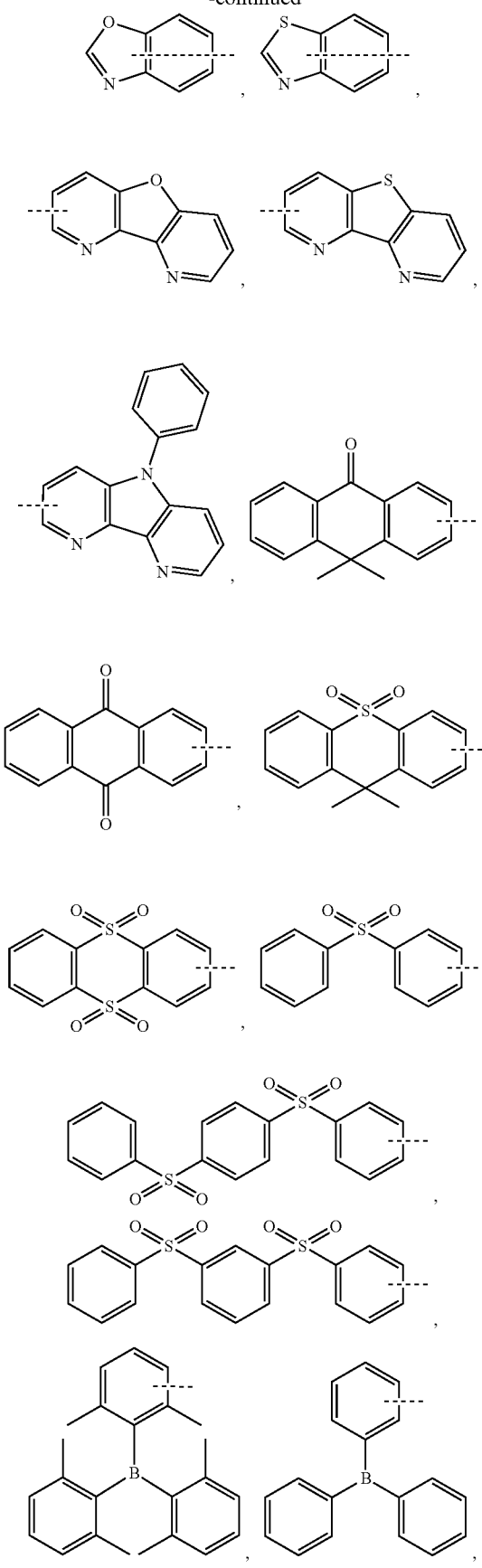

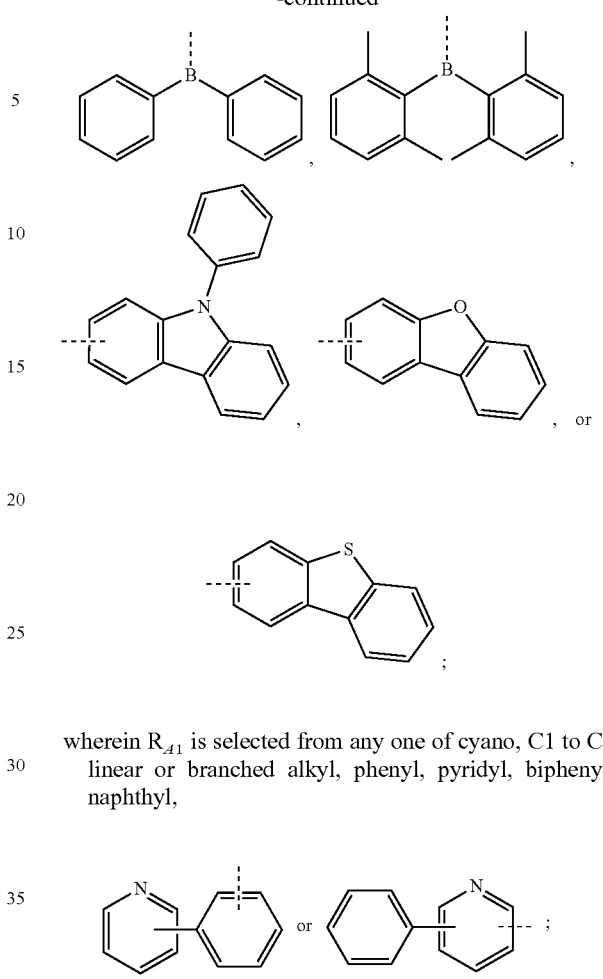

wherein $R_{41}$ is selected from any one of cyano, C1 to C6 linear or branched alkyl, phenyl, pyridyl, biphenyl, naphthyl, and the dashed line represents a linkage site of the group.

8. The organic compound according to claim 1, wherein $R_1$, $R_2$, $R_3$ and $R_4$ are each independently selected from any one of unsubstituted or halogenated C1 to C10 linear or branched alkyl, C3 to C10 cycloalkyl, unsubstituted or halogenated C1 to C10 alkoxy, substituted or unsubstituted C6 to C20 aryl, substituted or unsubstituted C3 to C20 heteroaryl, or substituted or unsubstituted C6 to C20 arylamino;

wherein substituents in the substituted aryl and the substituted heteroaryl are each independently selected from at least one of halogen, cyano or unsubstituted or halogenated C1 to C10 linear or branched alkyl.

9. The organic compound according to claim 8, wherein $R_1$, $R_2$, $R_3$ and $R_4$ are each independently selected from any one of unsubstituted or halogenated C1 to C10 linear or branched alkyl, C3 to C10 cycloalkyl, unsubstituted or halogenated C1 to C10 alkoxy, phenyl, naphthyl, biphenyl, pyridyl, carbazolyl or diphenylamino.

10. The organic compound according to claim 1, wherein $n_1$, $n_2$, $n_3$ and $n_4$ are each independently selected from an integer from 0 to 2.

11. The organic compound according to claim 1, wherein the organic compound is selected from any one of the following compounds P1 to P163:

-continued
P1
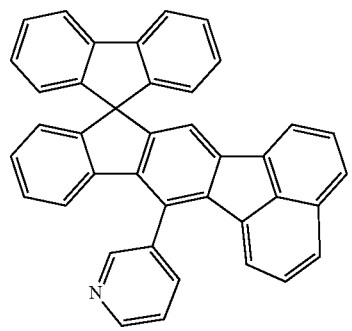
P2
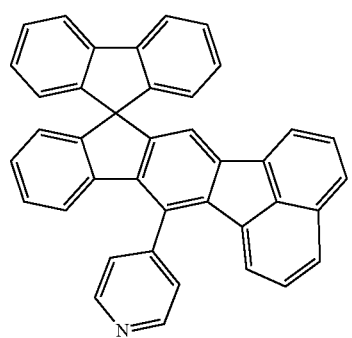
P3
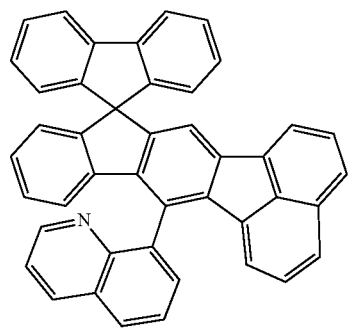
P4
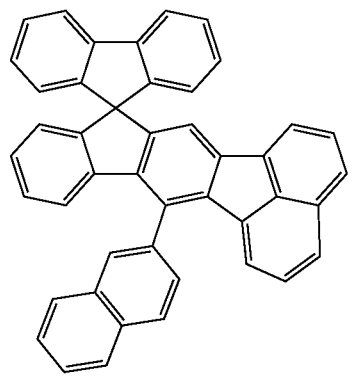
P5
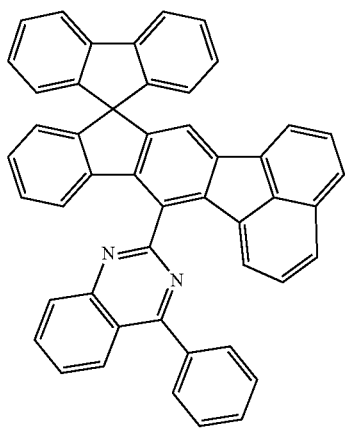
P6
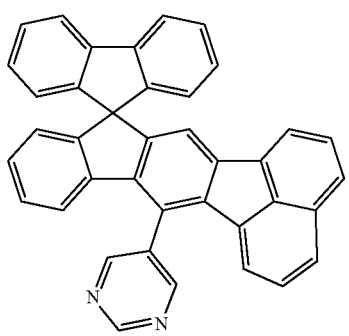
P7
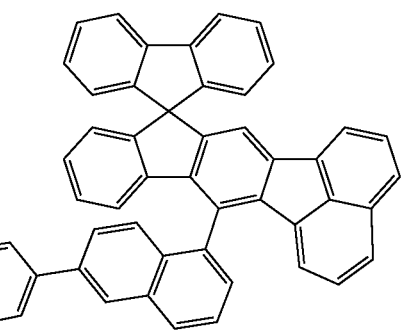
P8
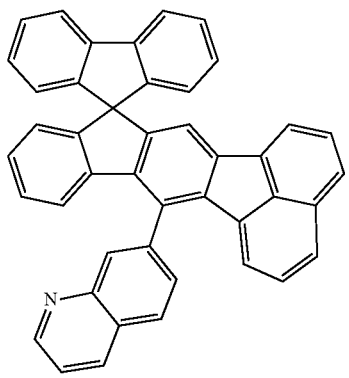

-continued
P9
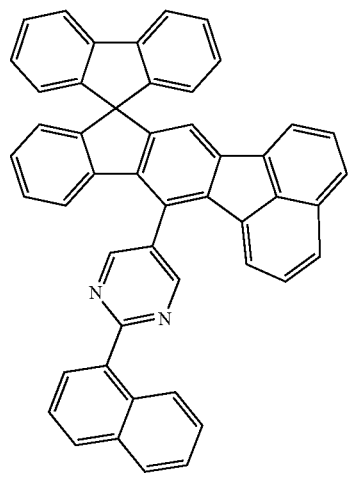
P10
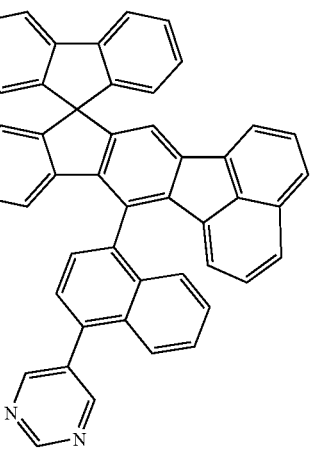
P11
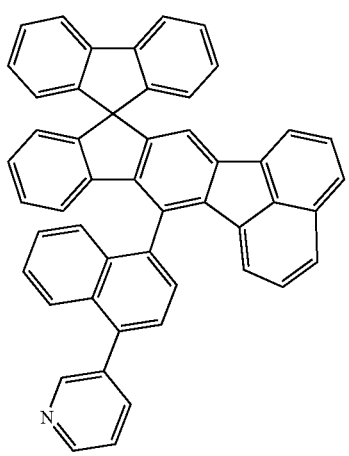
P12
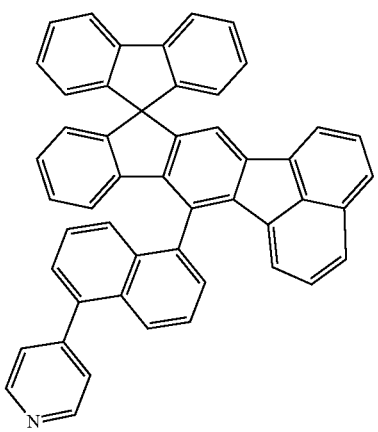
P13
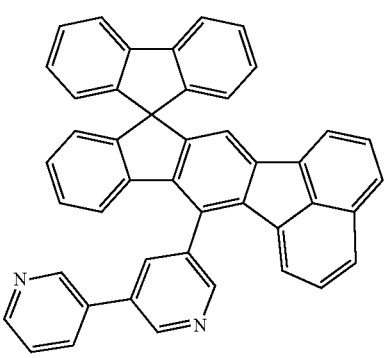
P14
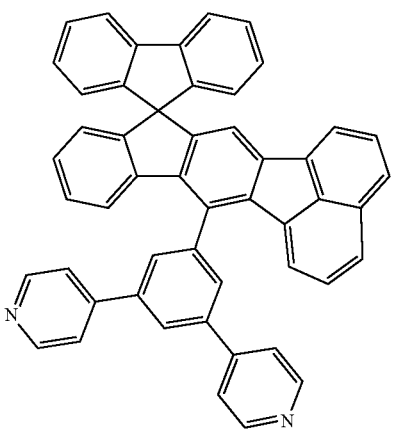
P15
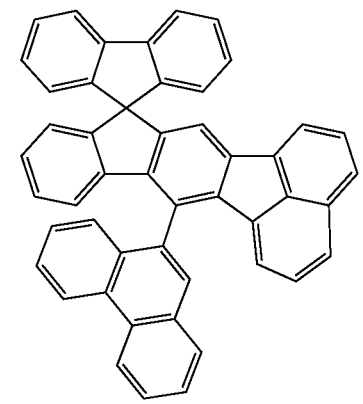

P16
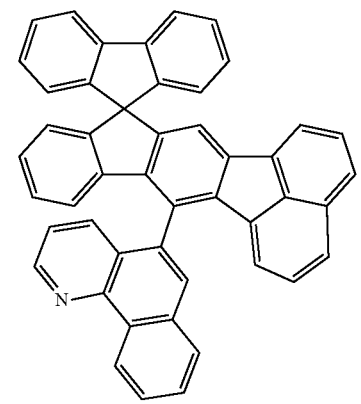
P17
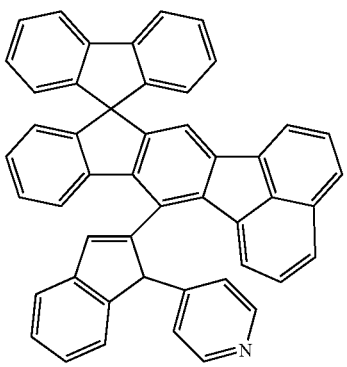
P18
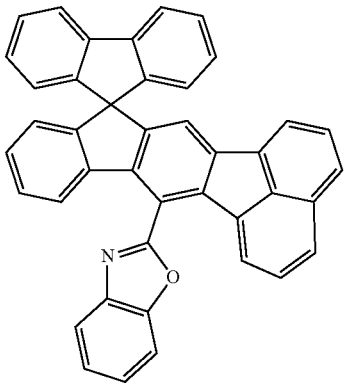
P19
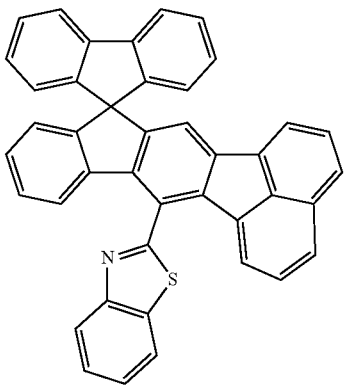
P20
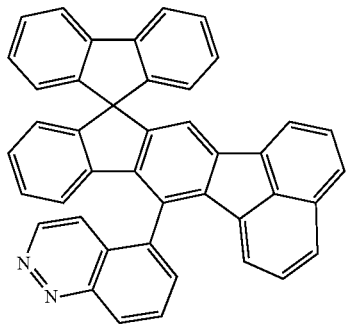
P21
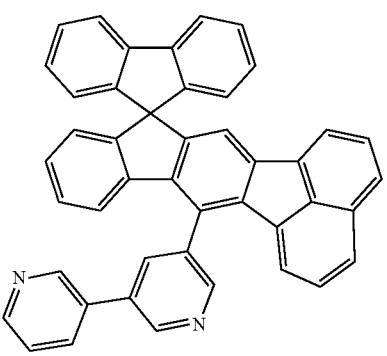
P22
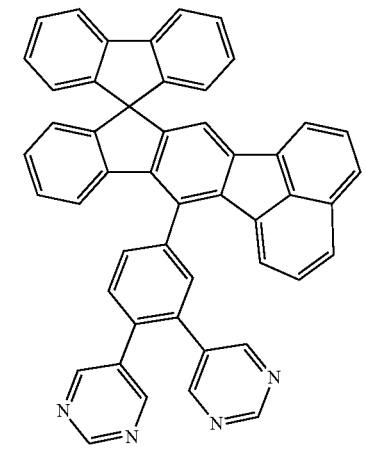
P23
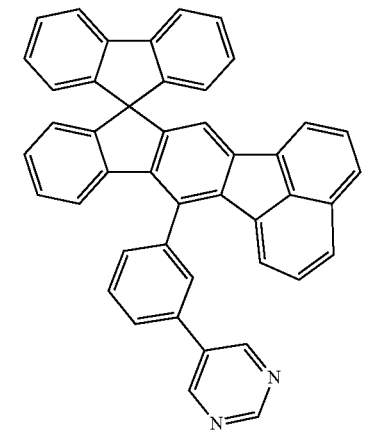

-continued
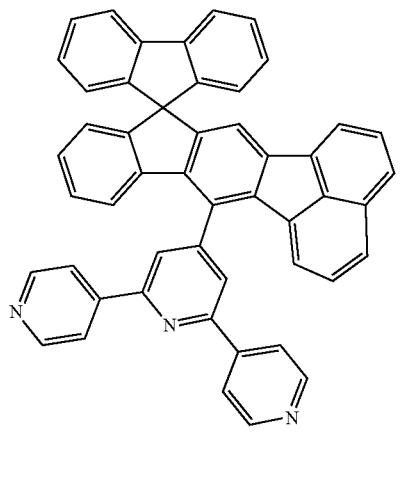
P24
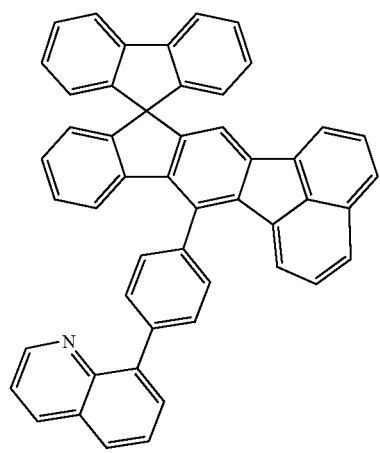
P25
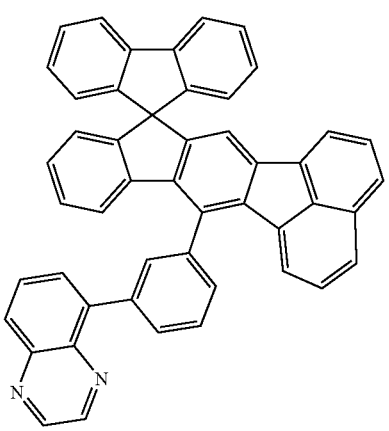
P26
-continued
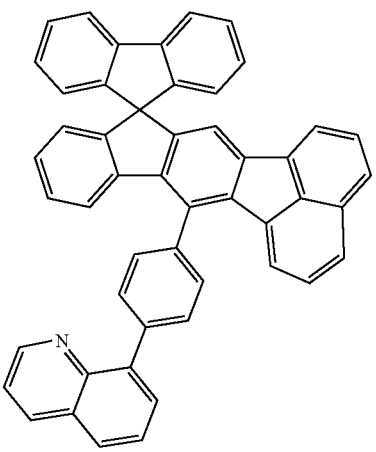
P27
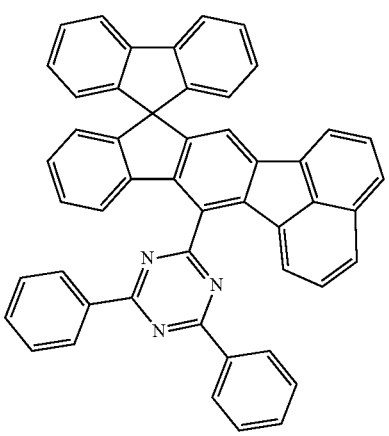
P27
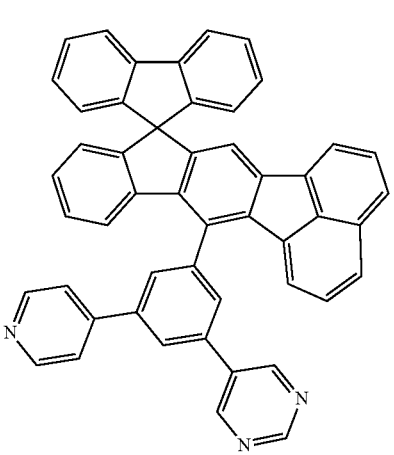
P29

P30 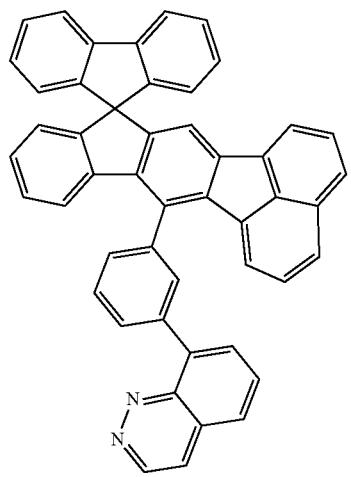
P33 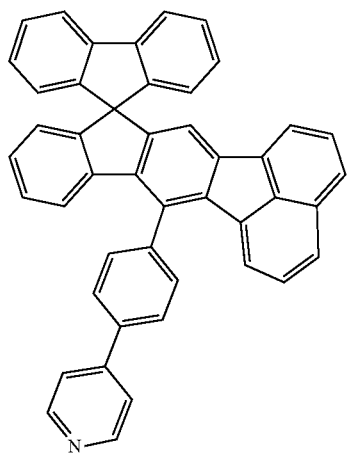
P31 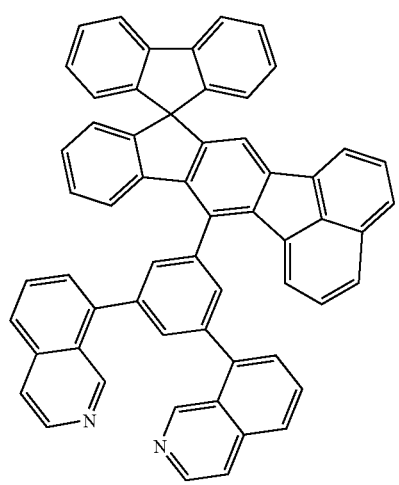
P34 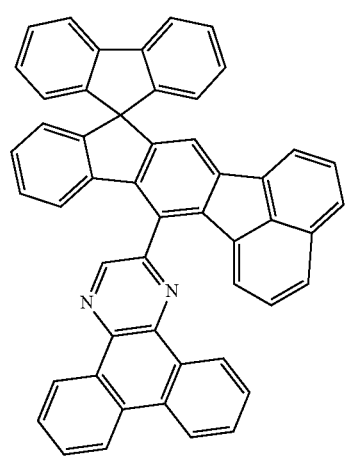
P32 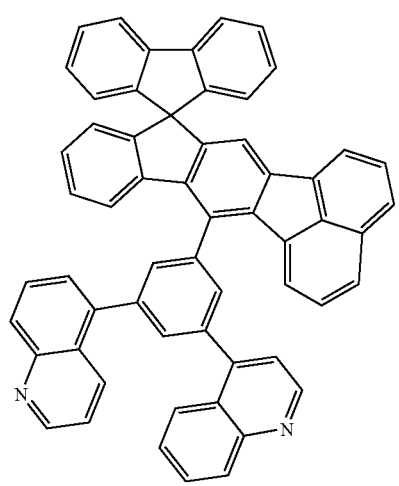
P35 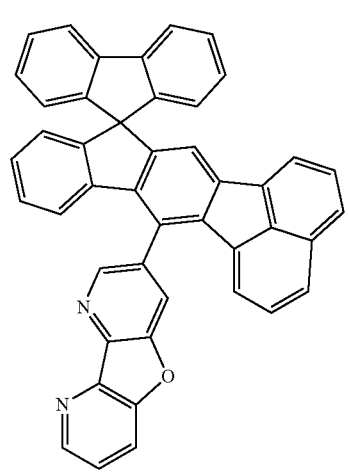

-continued
P36
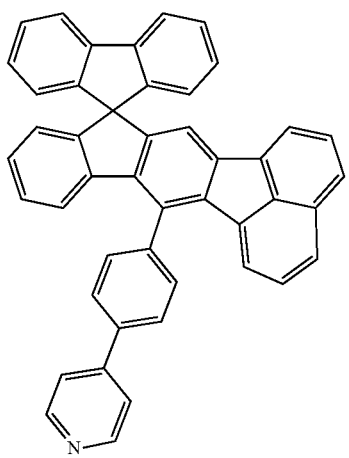
P37
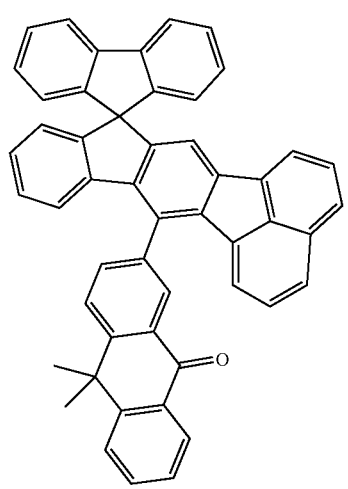
P38
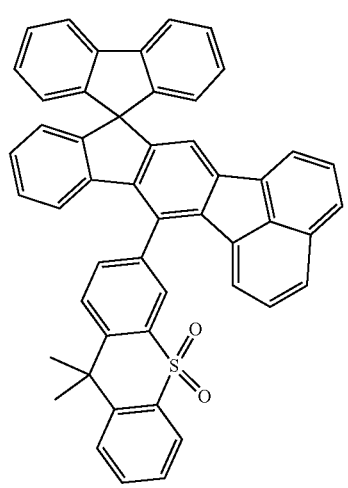
-continued
P39
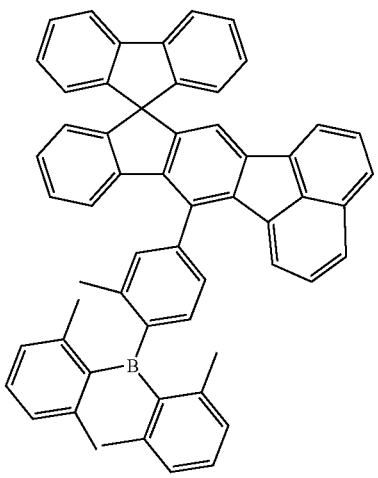
P40
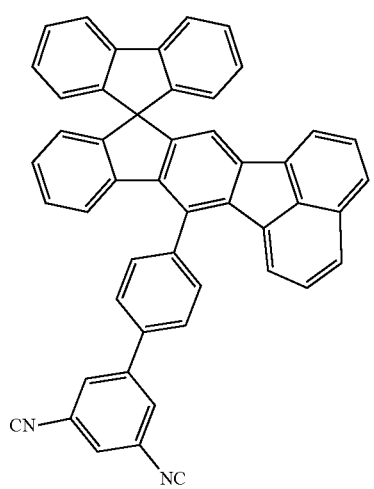
P41
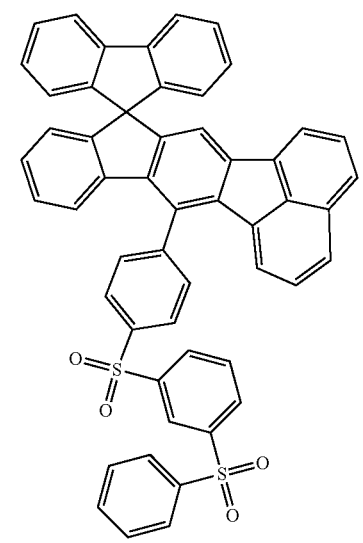

123
-continued
P42
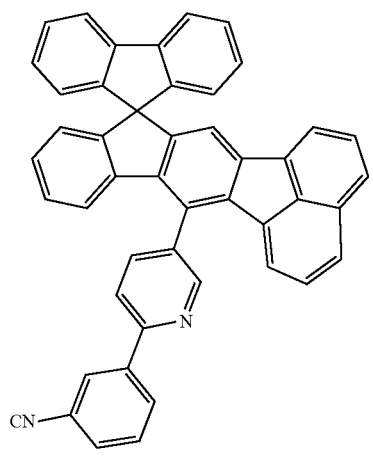
P43
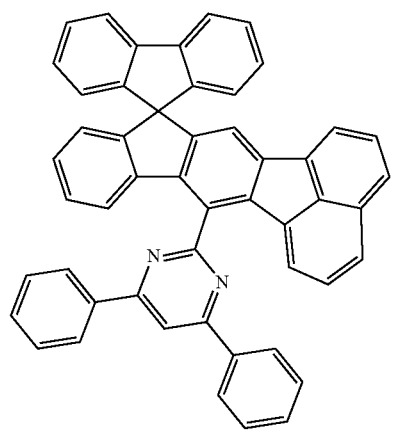
P44
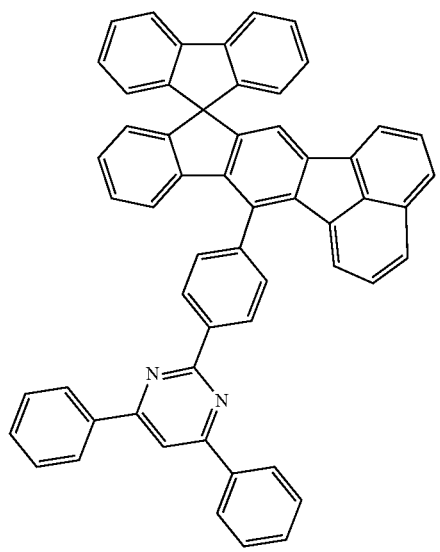
124
-continued
P45
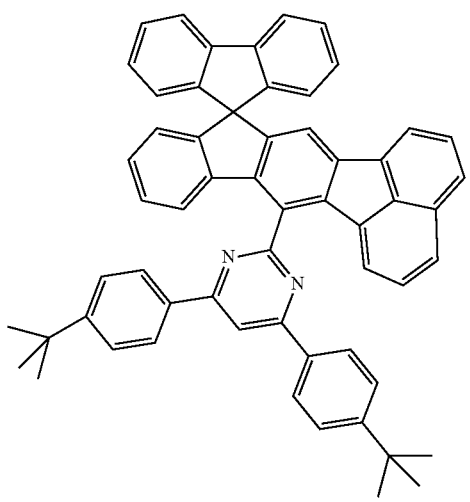
P46
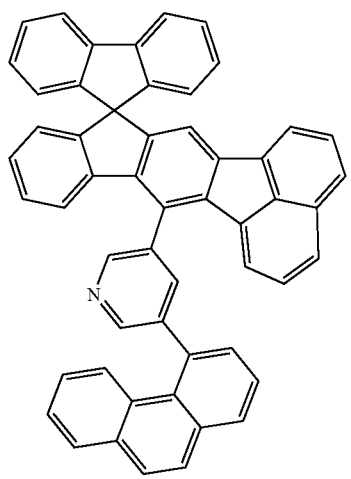
P47
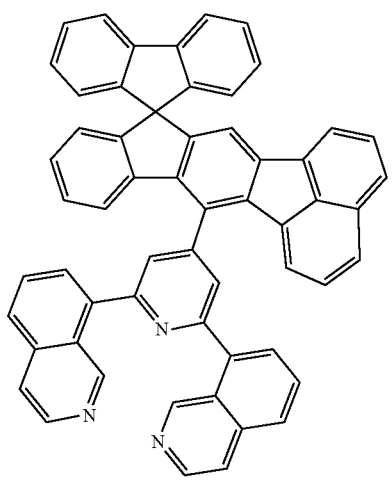

P48
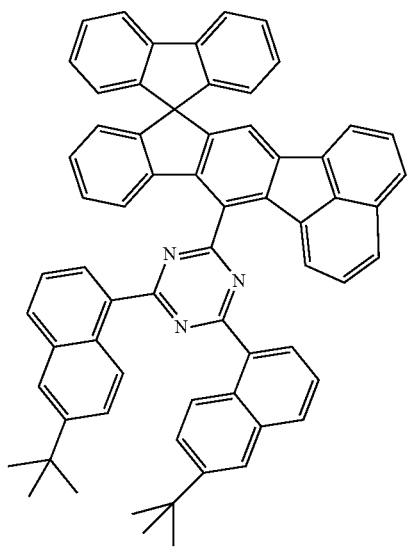
P49
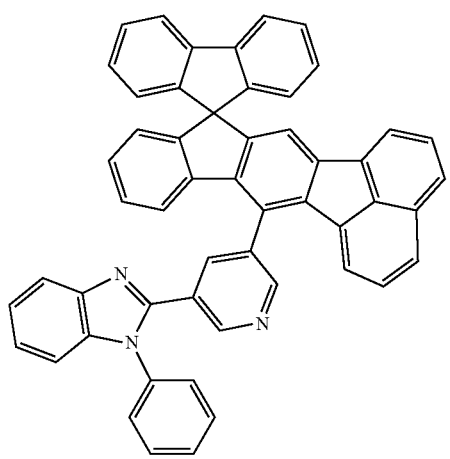
P50
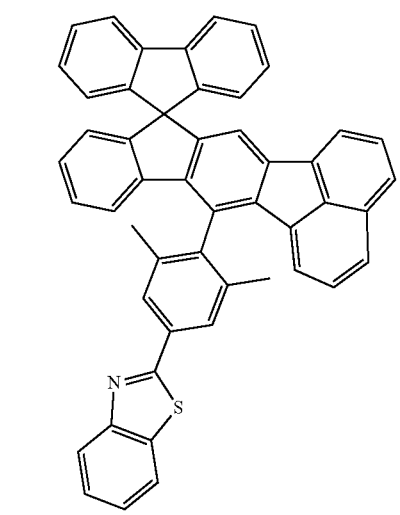
P51
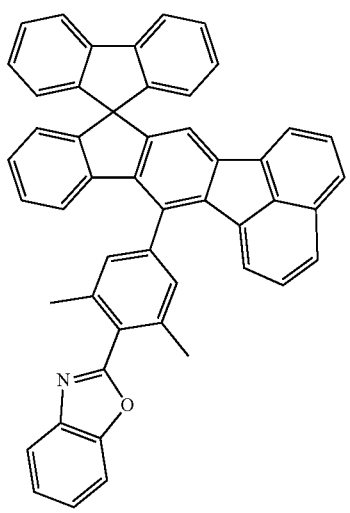
P52
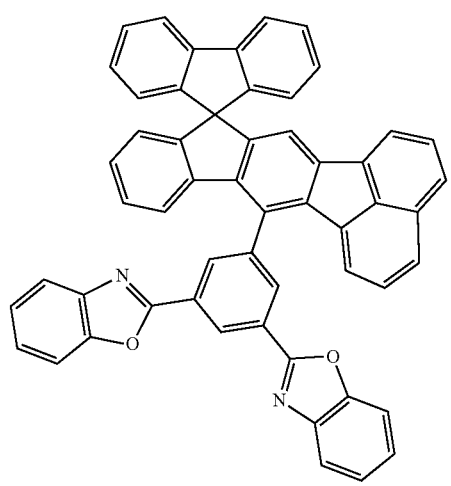
P53
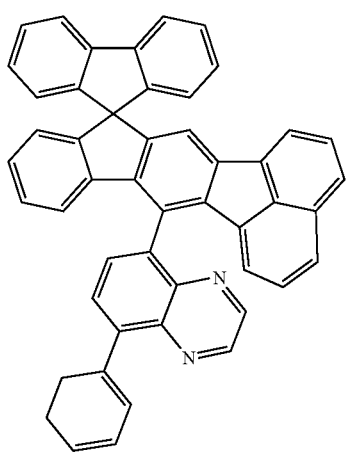

P54 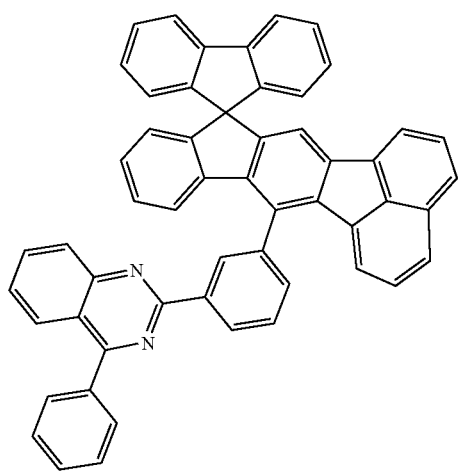
P55 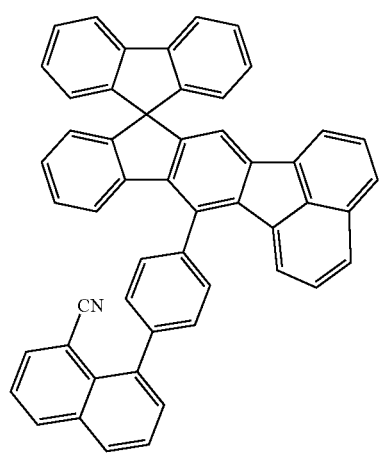
P56 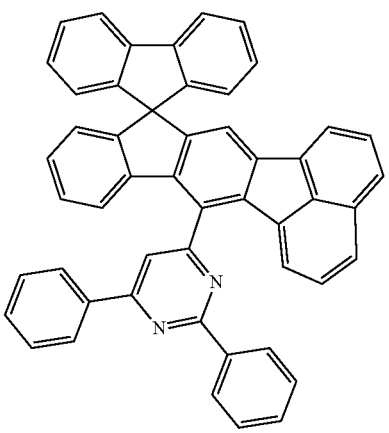
P57 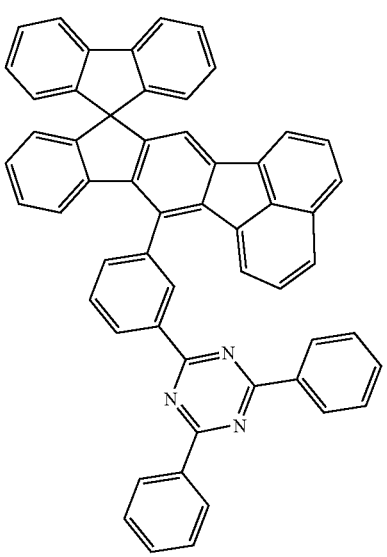
P58 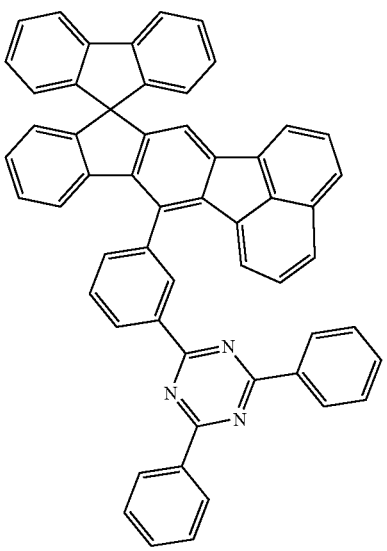
P59 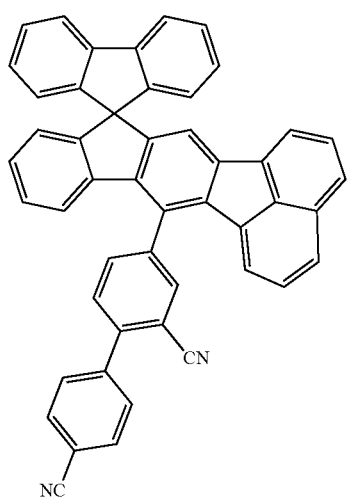

-continued
P60
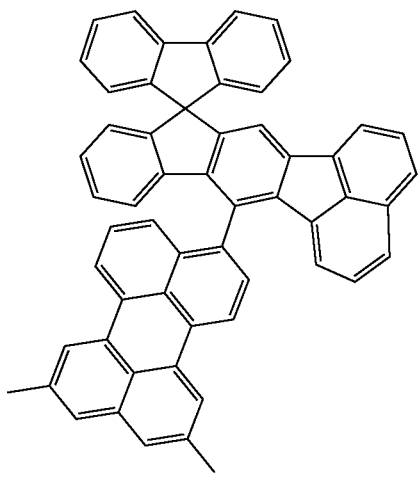
P61
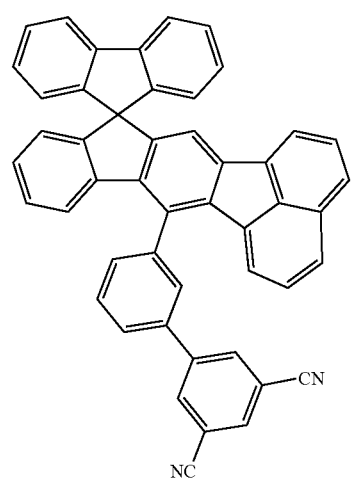
P62
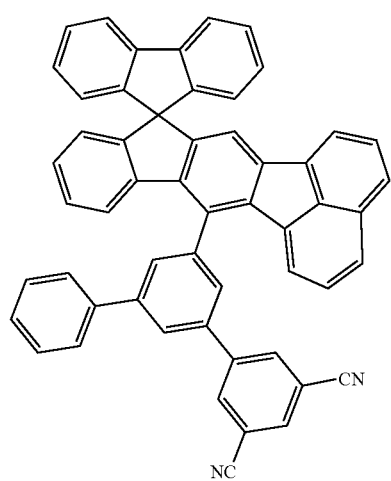
-continued
P63
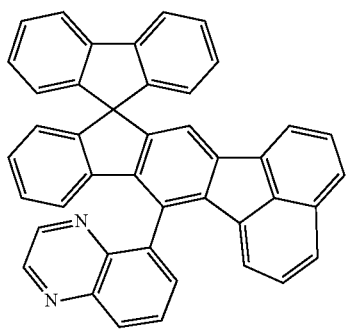
P64
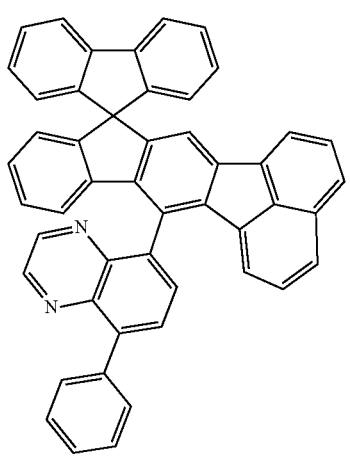
P65
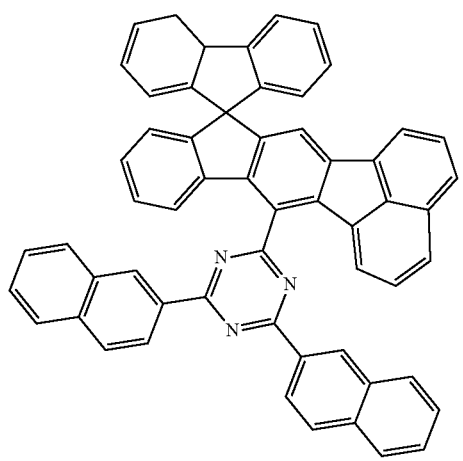

P66
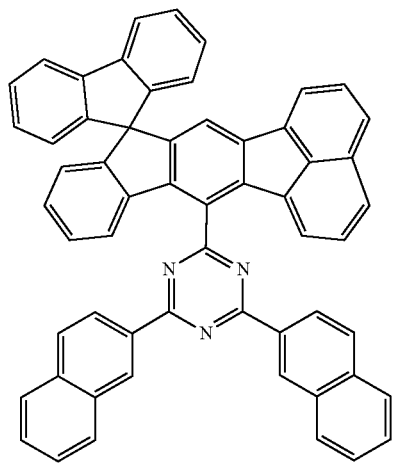
P67
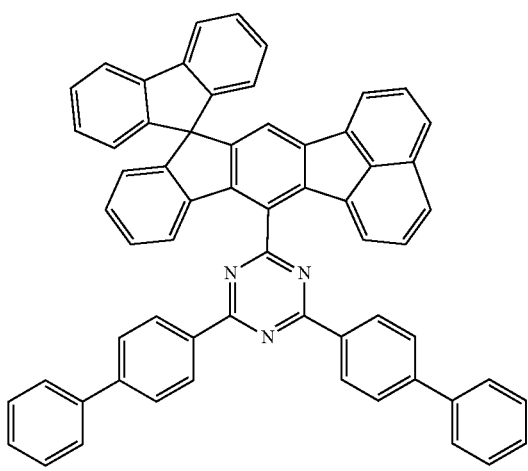
P68
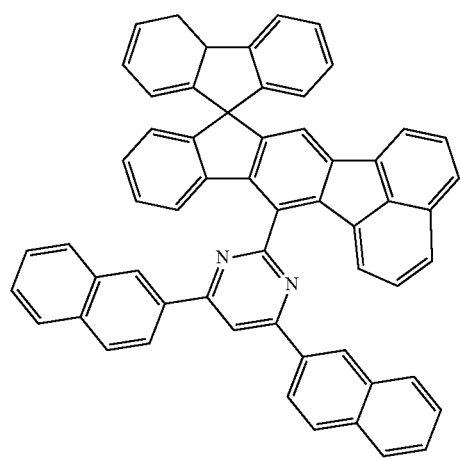
P69
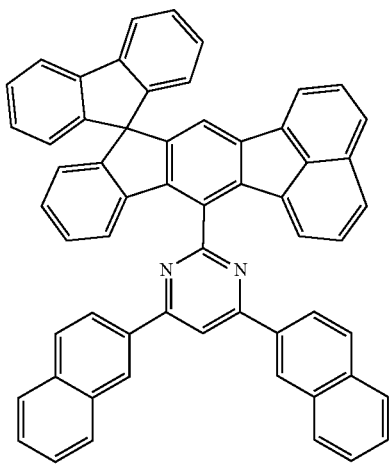
P70
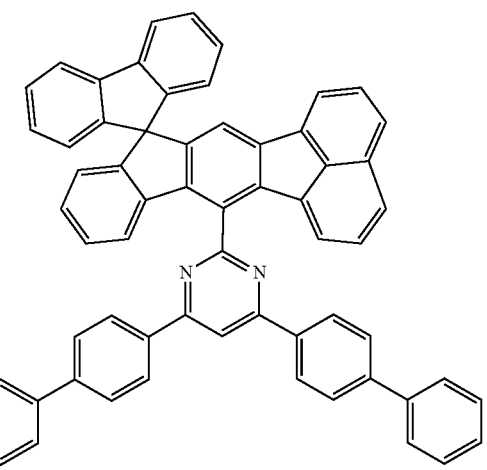
P71
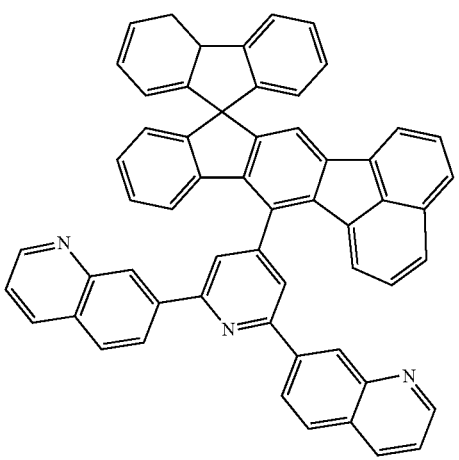

P72
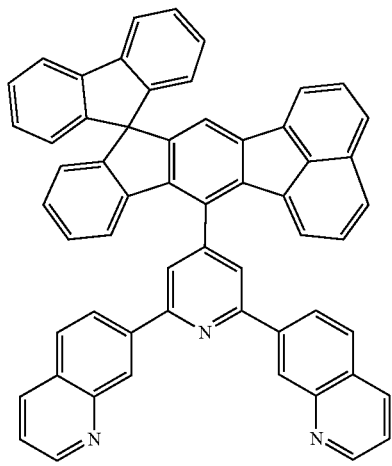
P73
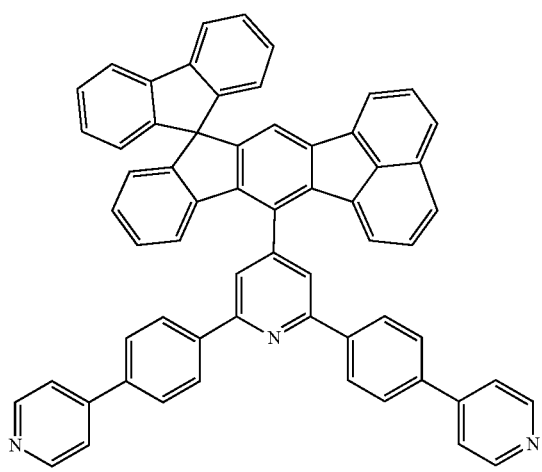
P74
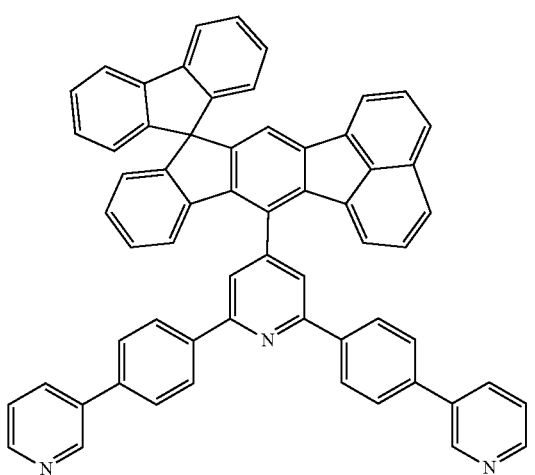
P75
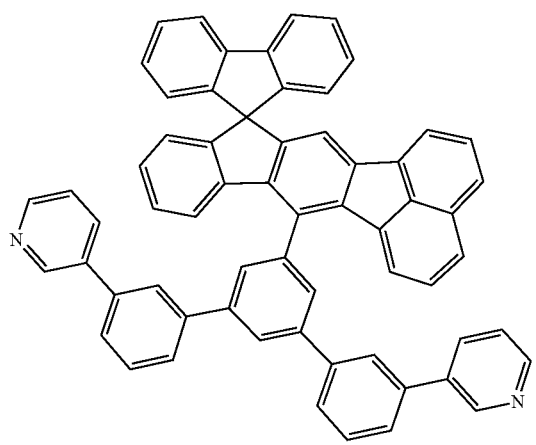
P76
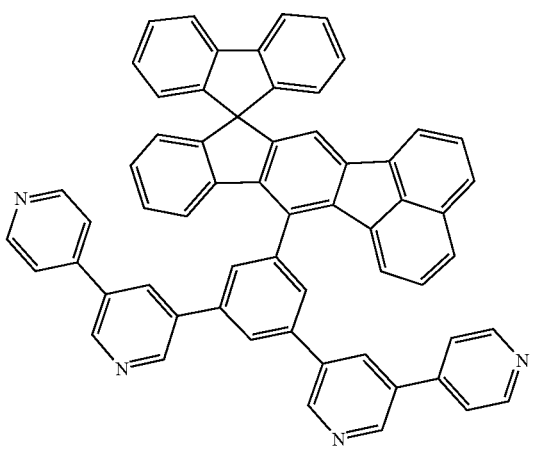
P77
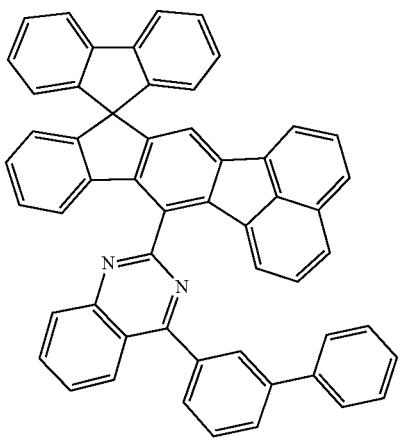

P78
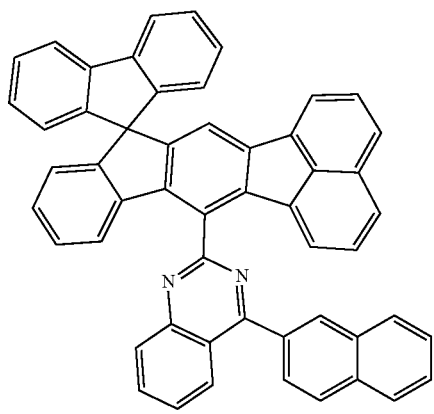
P79
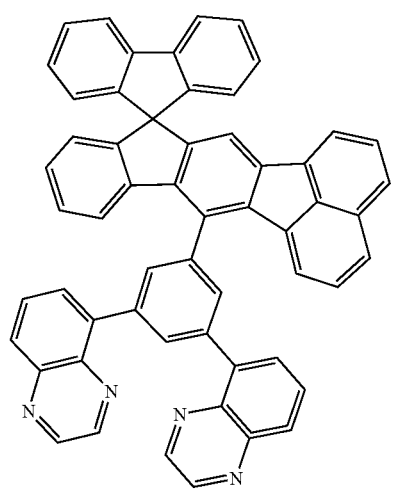
P80
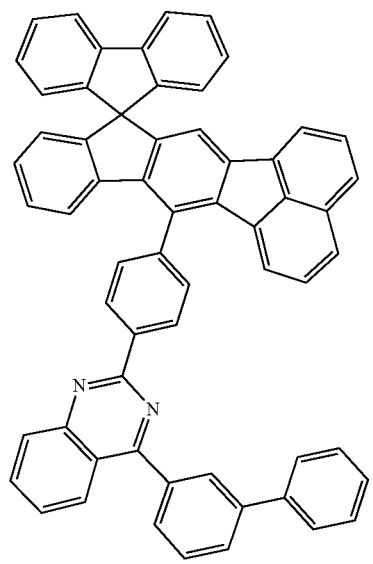
P81
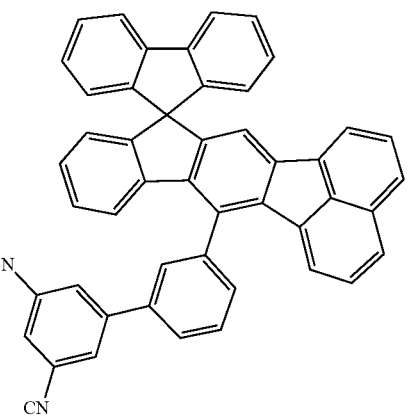
P82
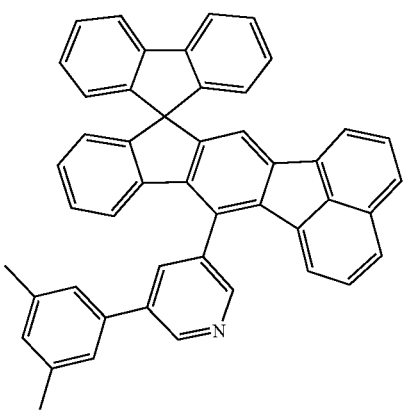
P83
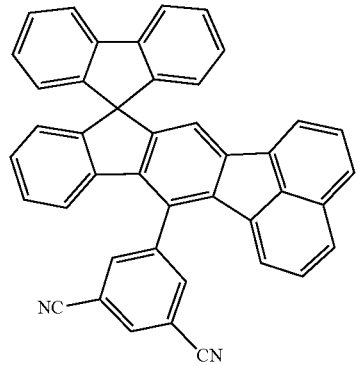
P84
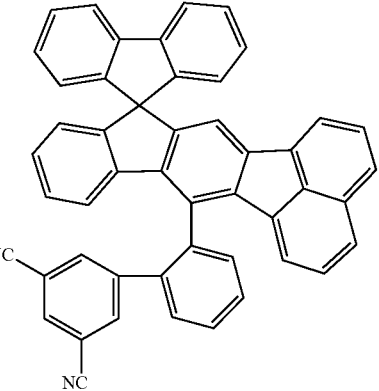

-continued
P85
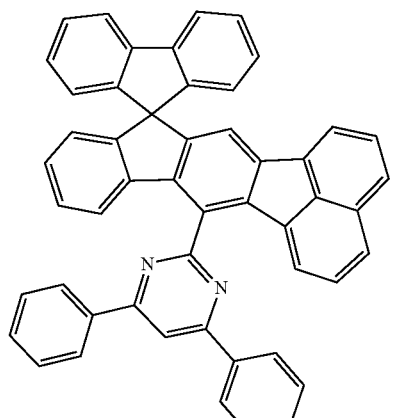
P86
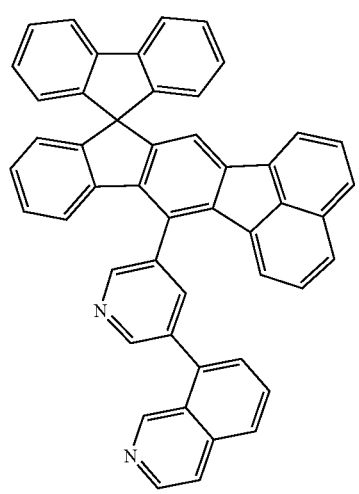
P87
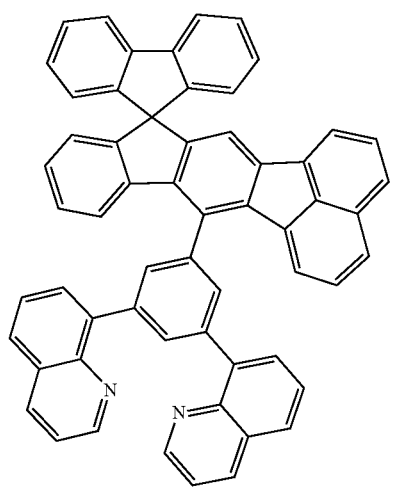
-continued
P88
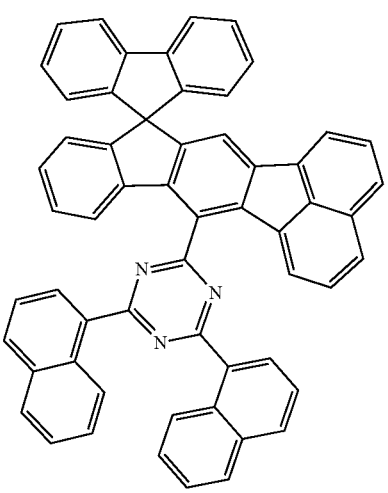
P89
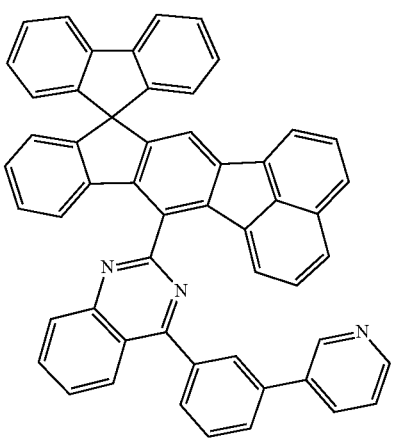
P90
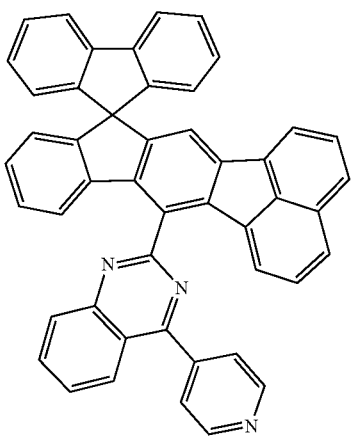

P91
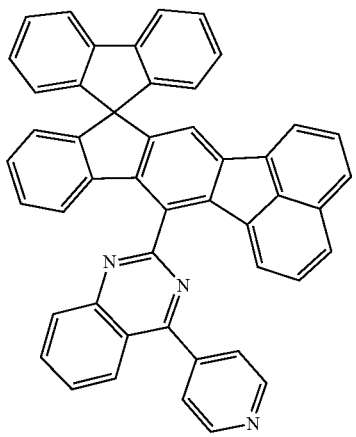
P92
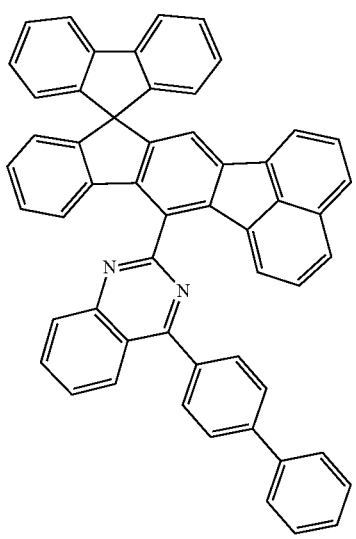
P93
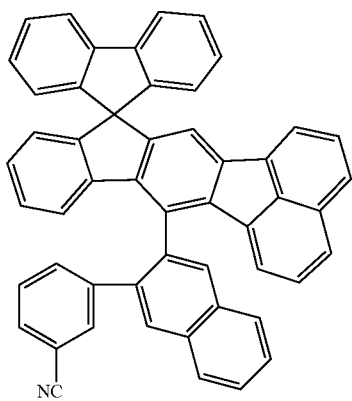
P94
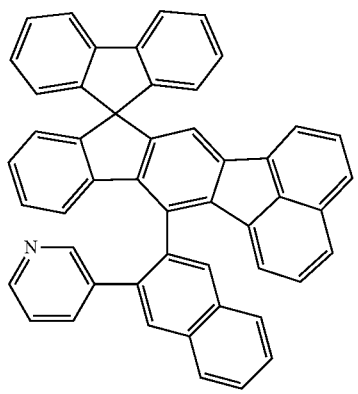
P95
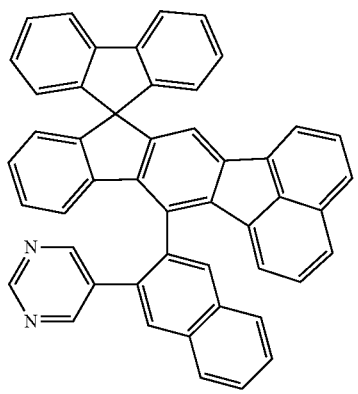
P96
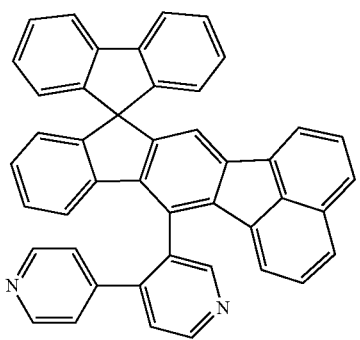
P97
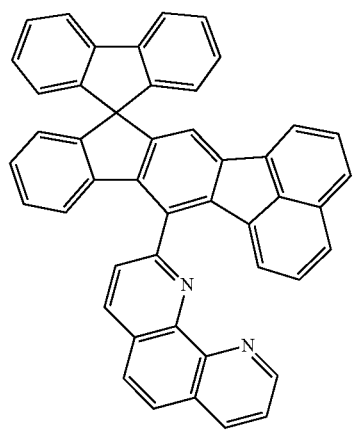

P98
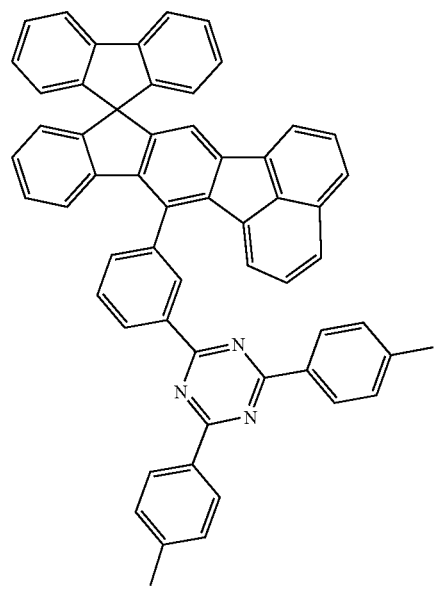
P99
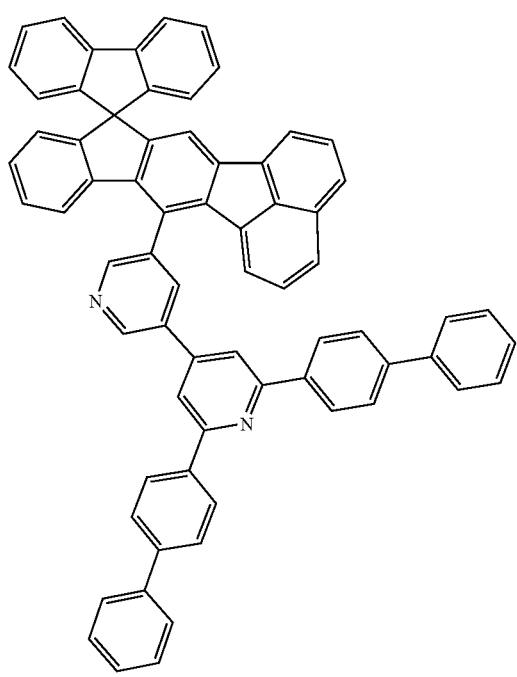
P100
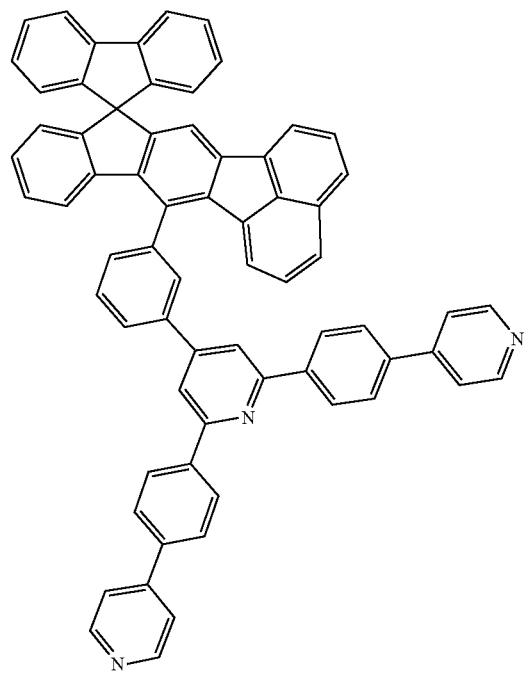
P101
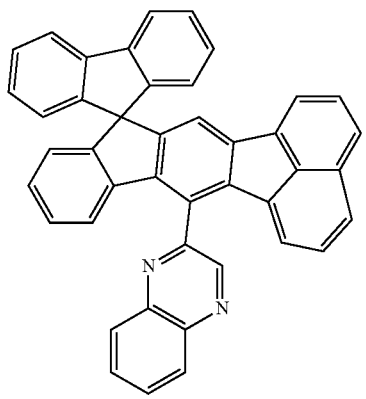
P102
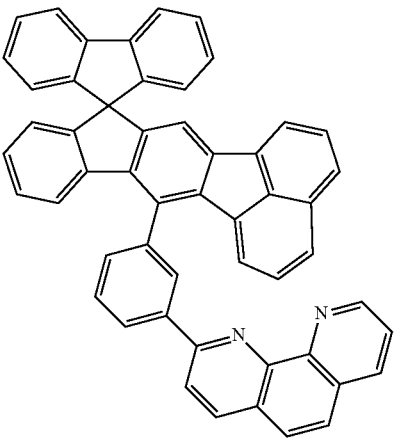

P103
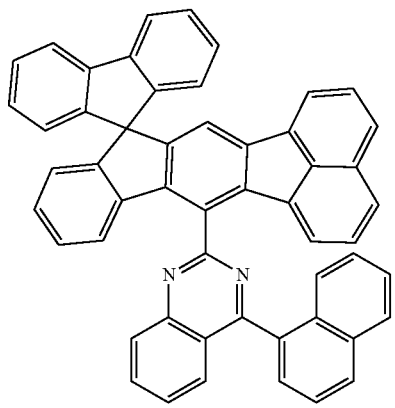
P104
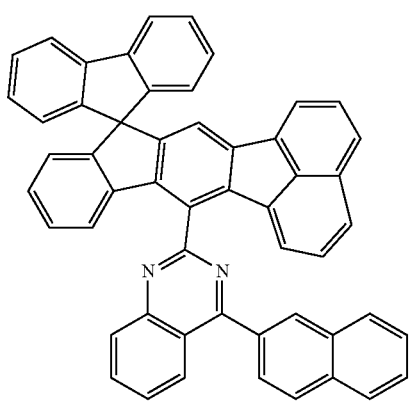
P105
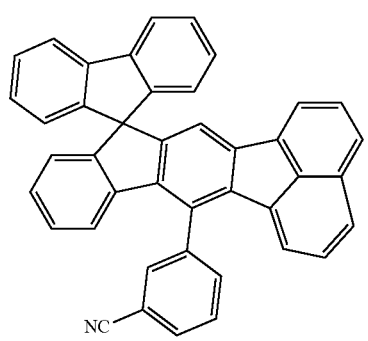
P106
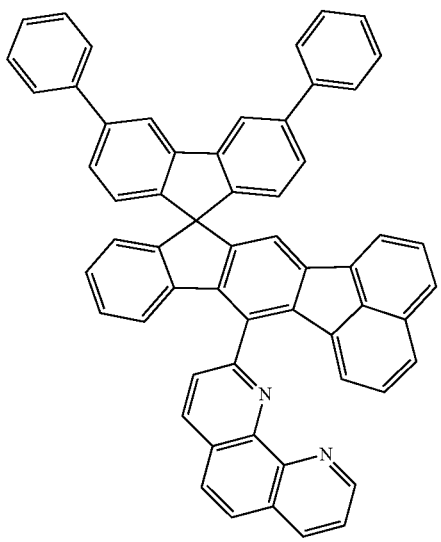
P107
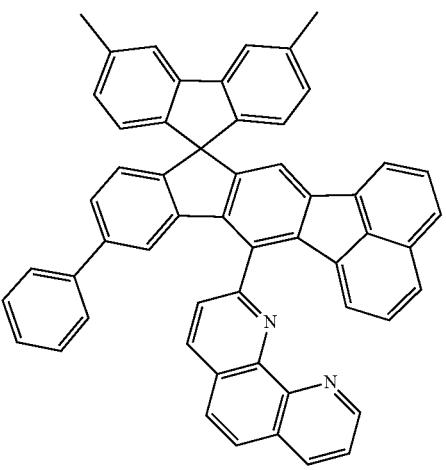
108
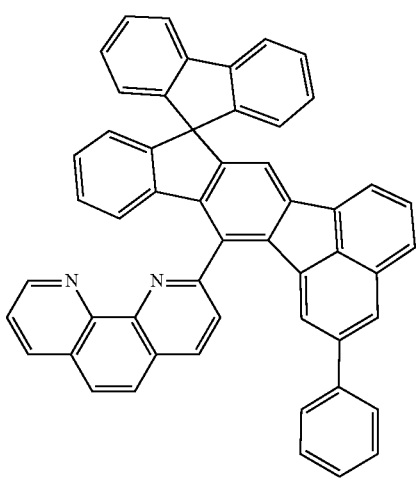

-continued
P109
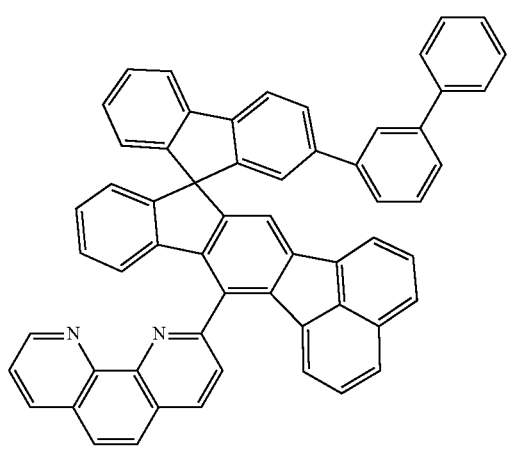
P110
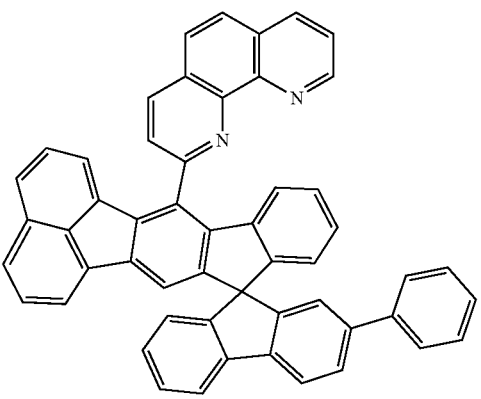
P111
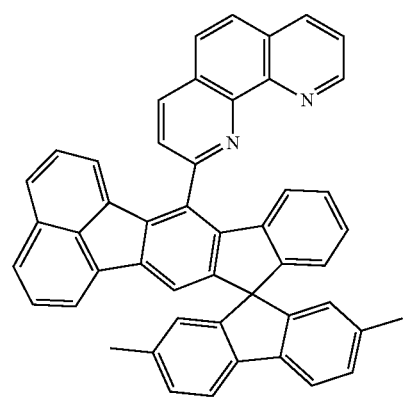
P112
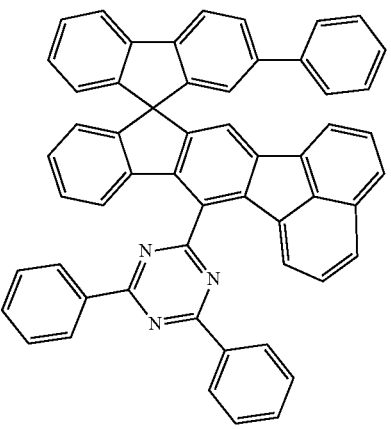
P113
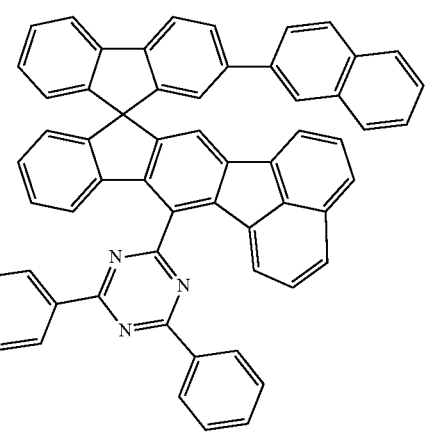
P114
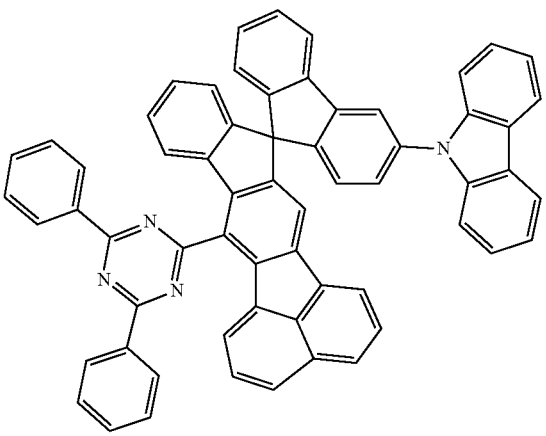

-continued
P115
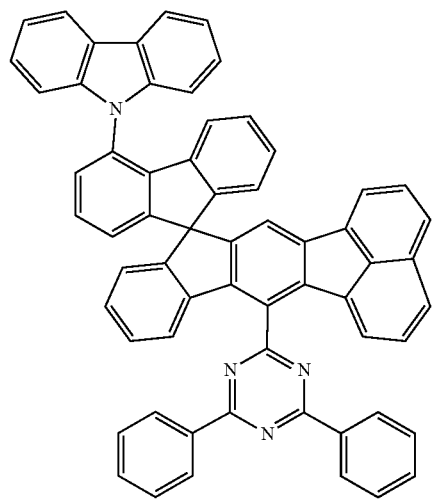
P116
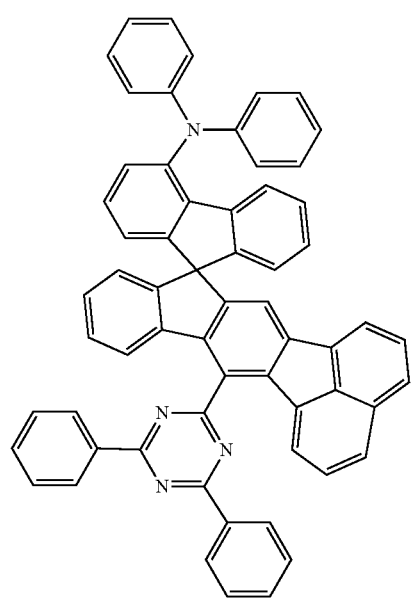
P117
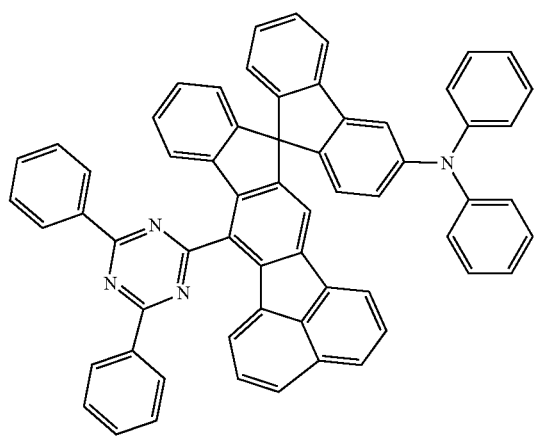
-continued
P118
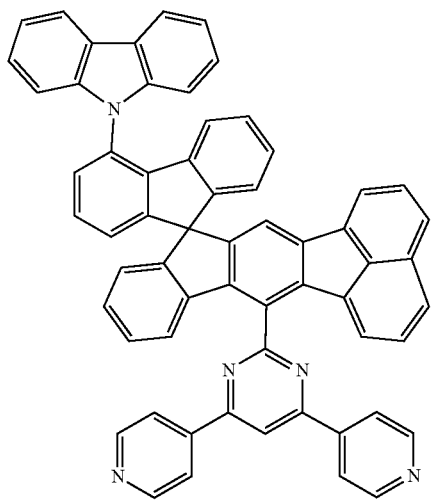
P119
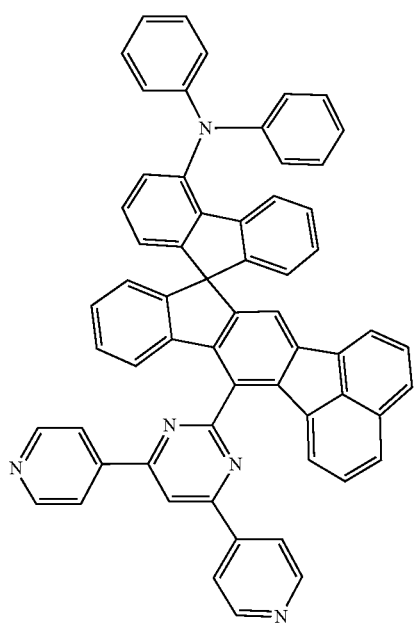
P120
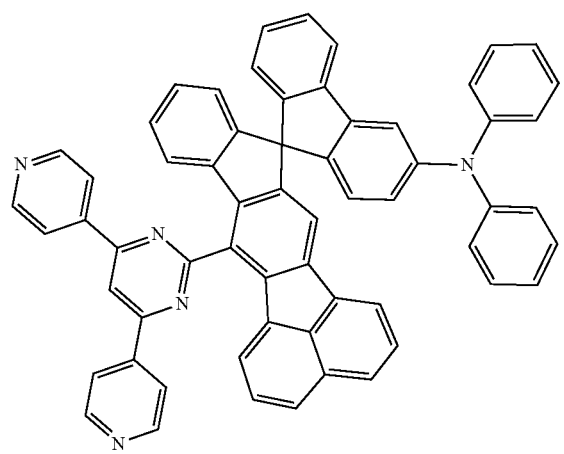

-continued
P121
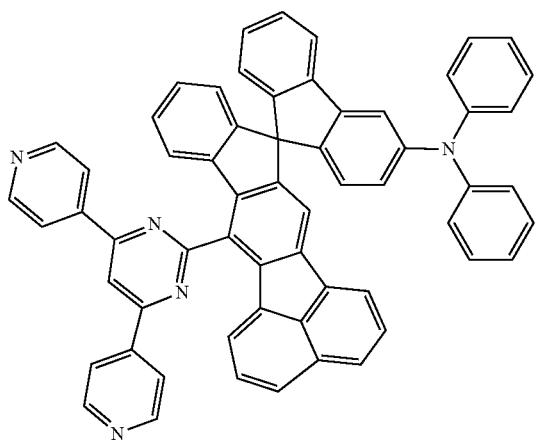
P122
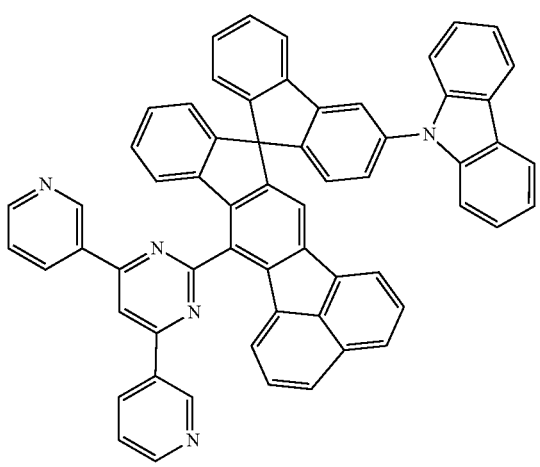
P123
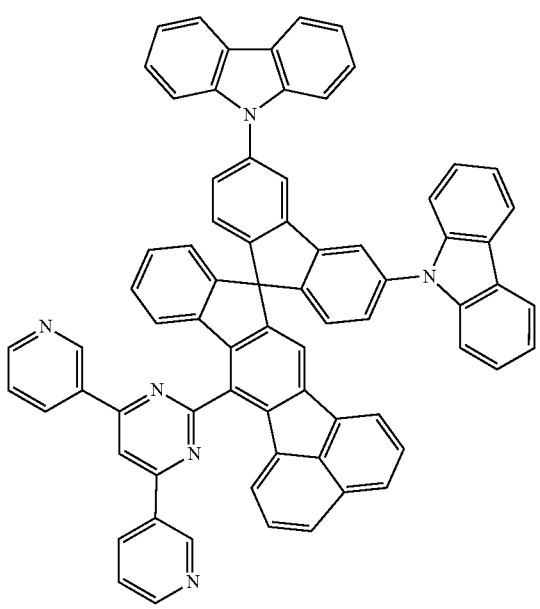
-continued
P124
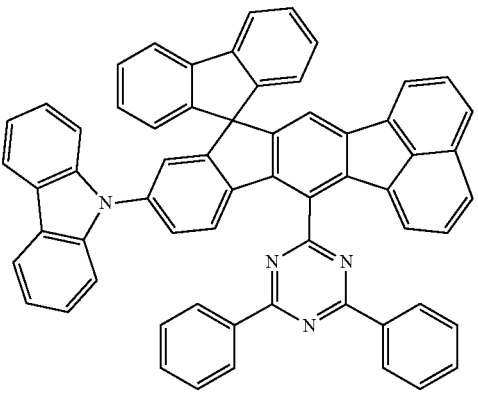
P125
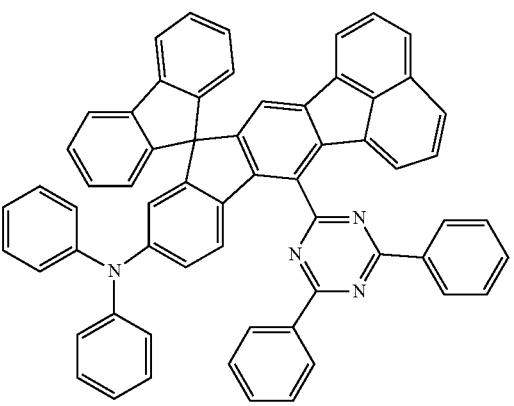
P126
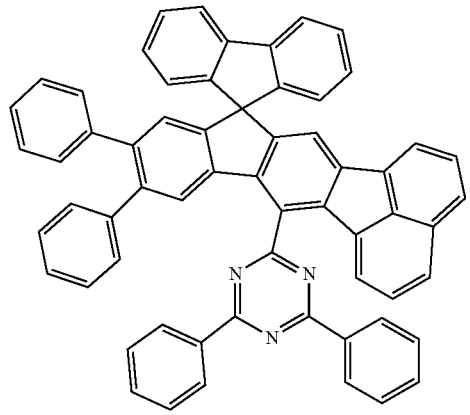

-continued
P127
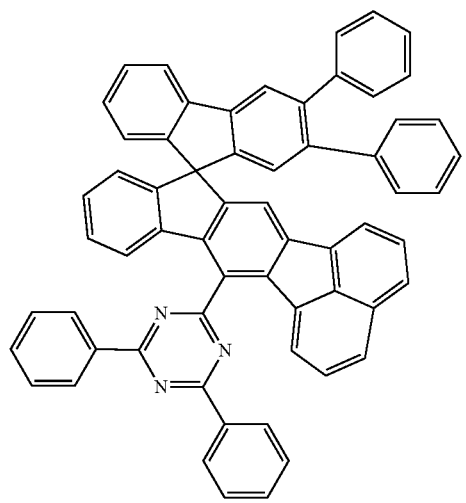
P128
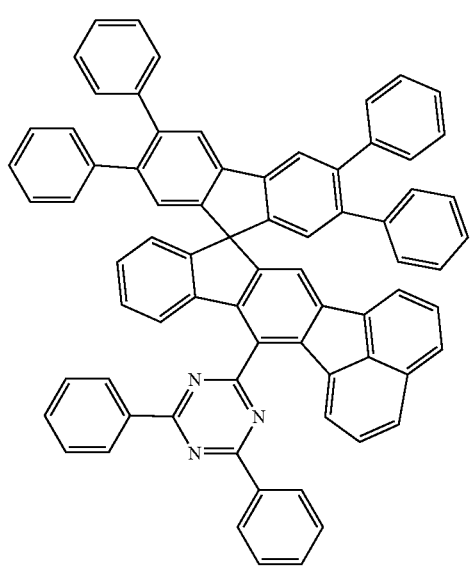
P129
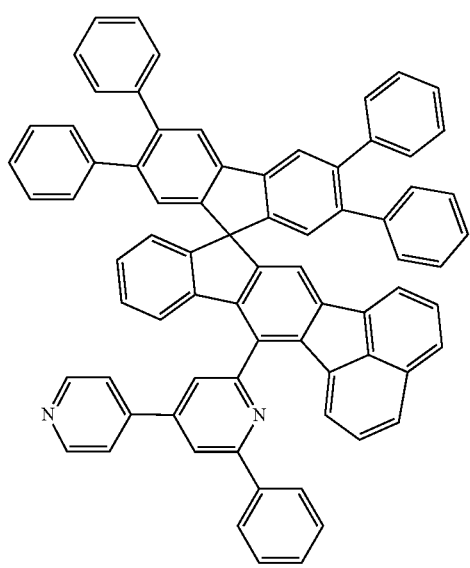
P130
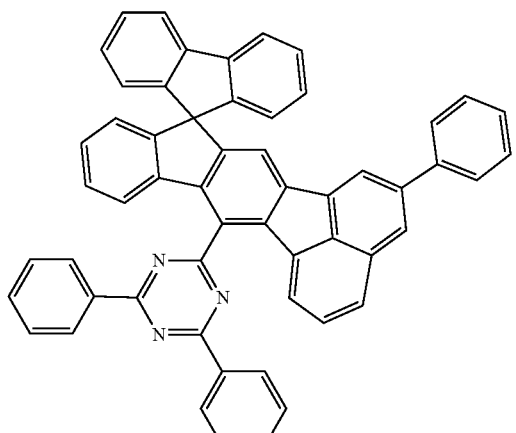
P131
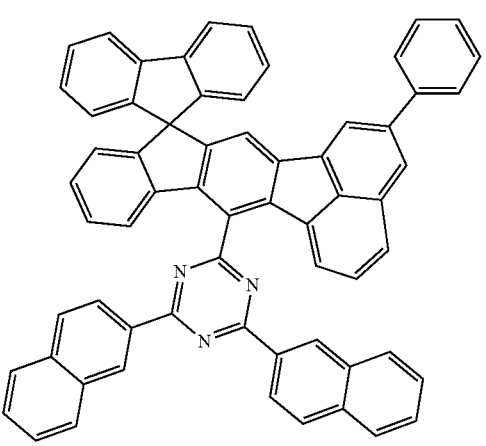
P132
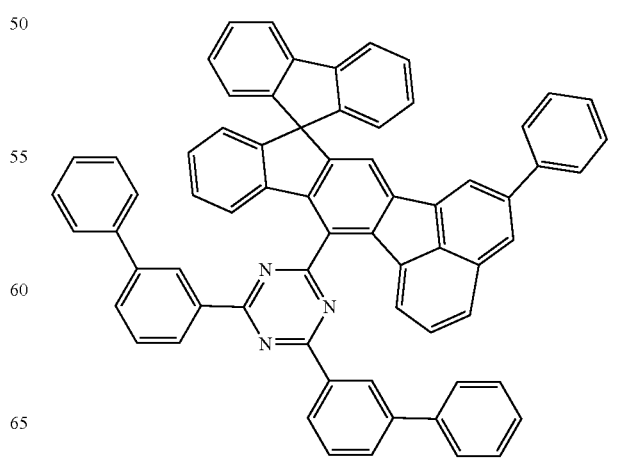

-continued
P133
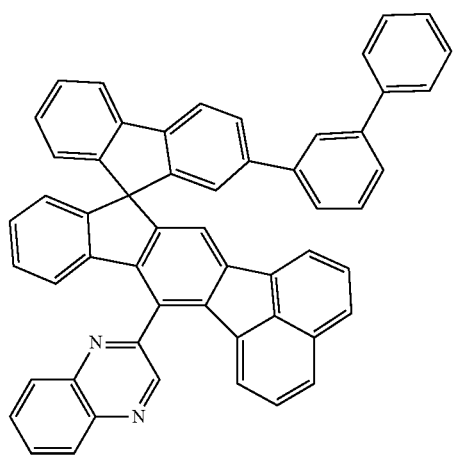
P134
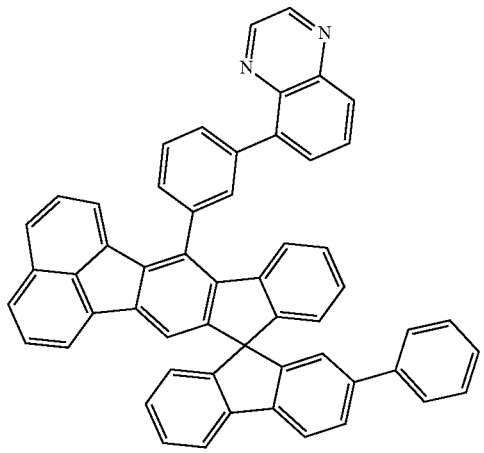
P135
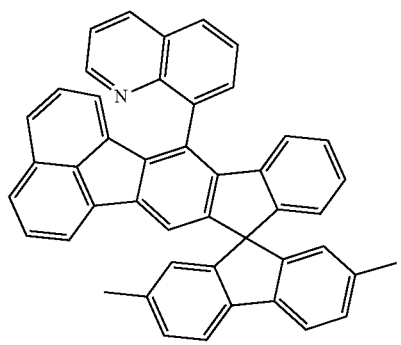
-continued
P136
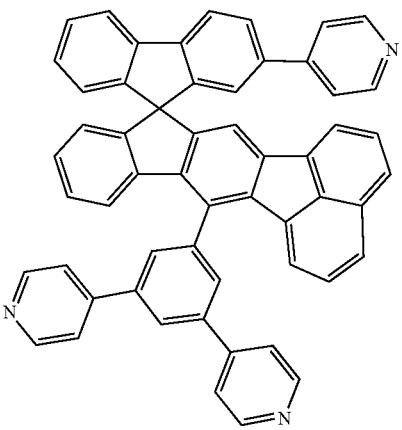
P137
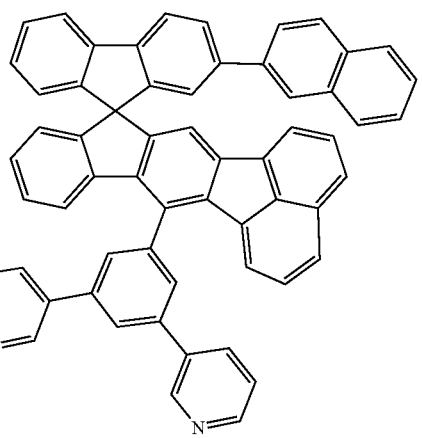
P138
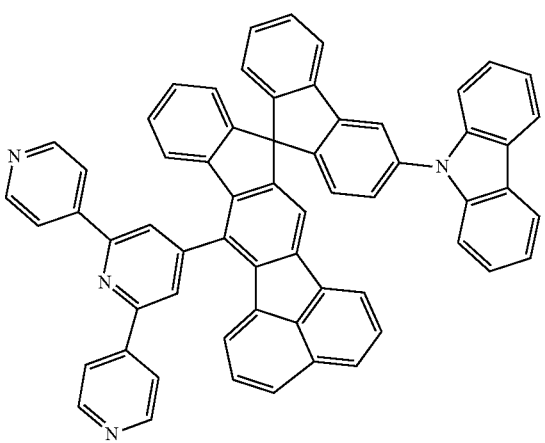

-continued
P139
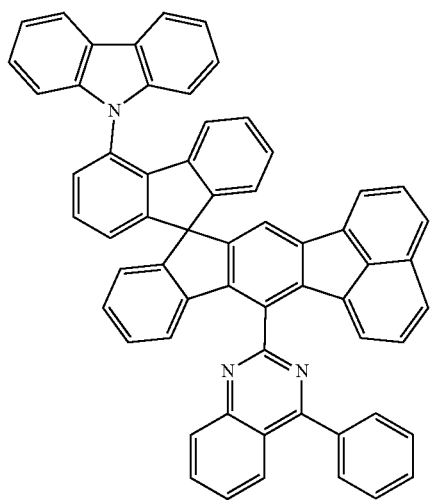
P140
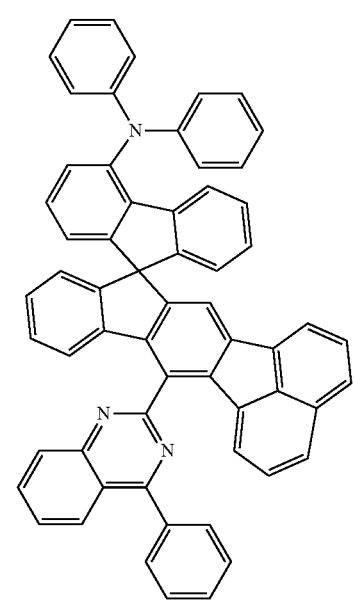
P141
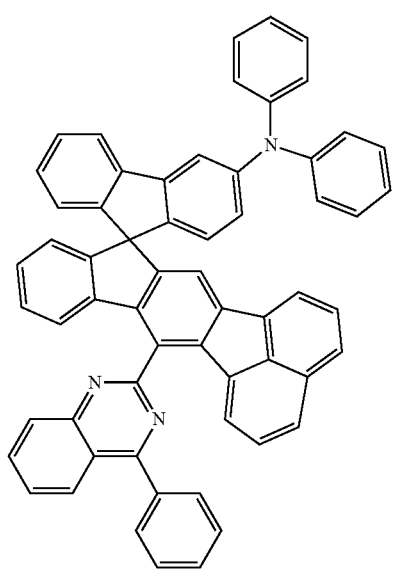
-continued
P142
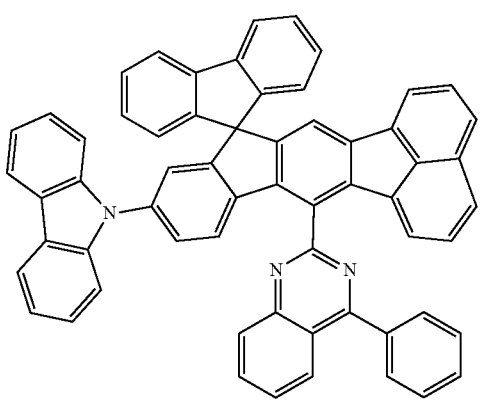
P143
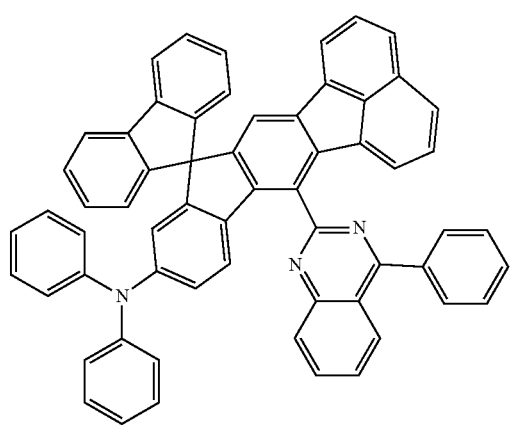
P144
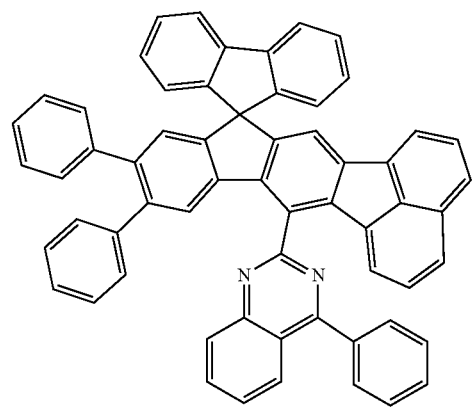

P145
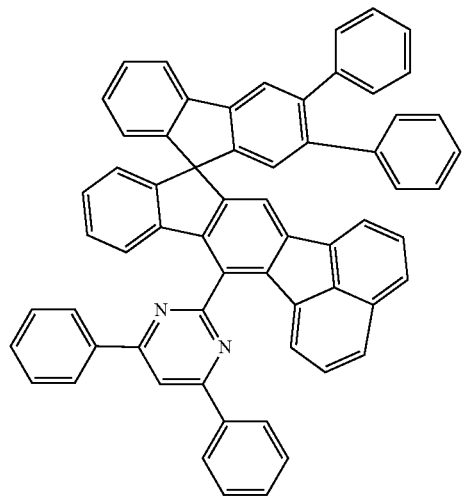
P146
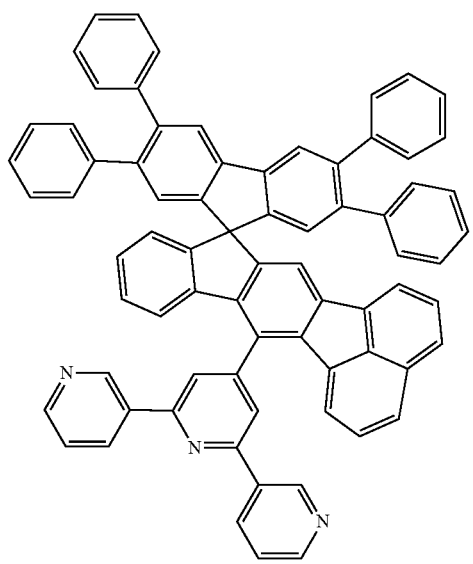
P147
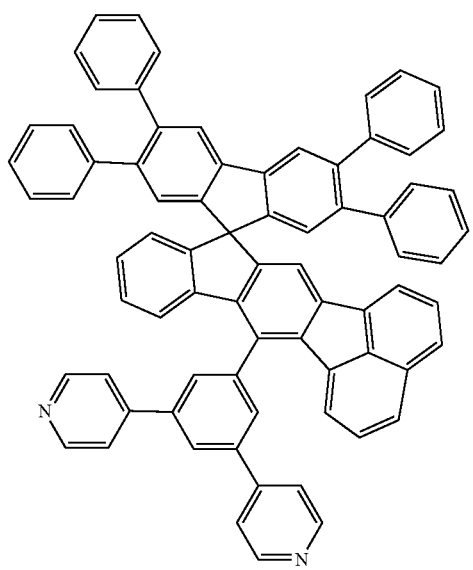
P148
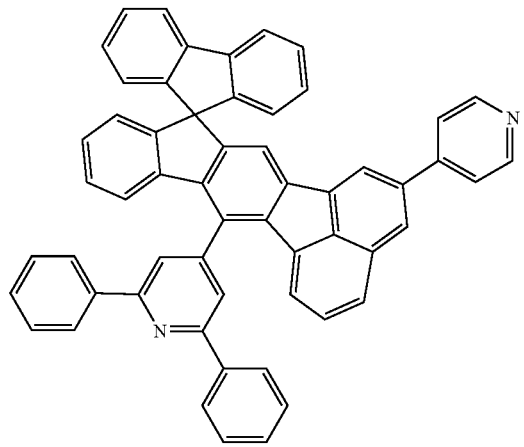
P149
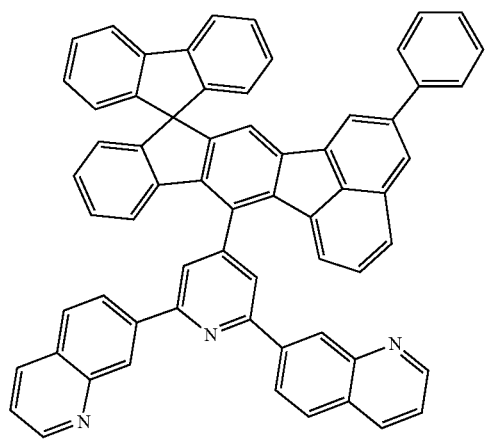
P149
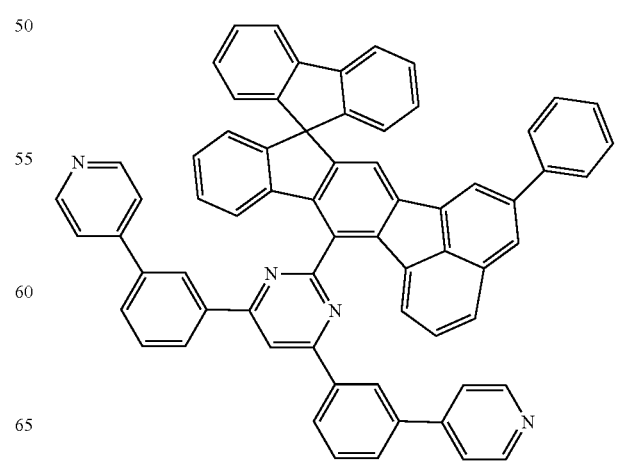

P150
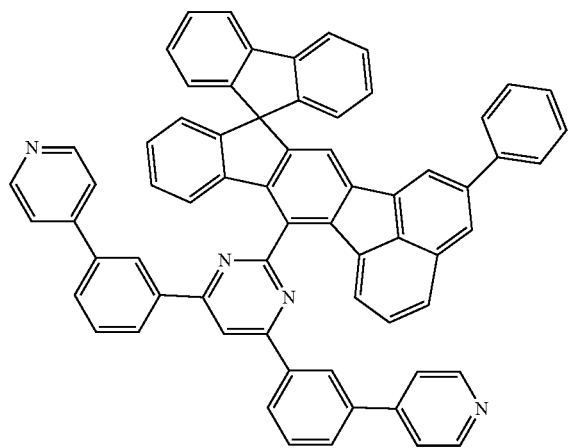
P153
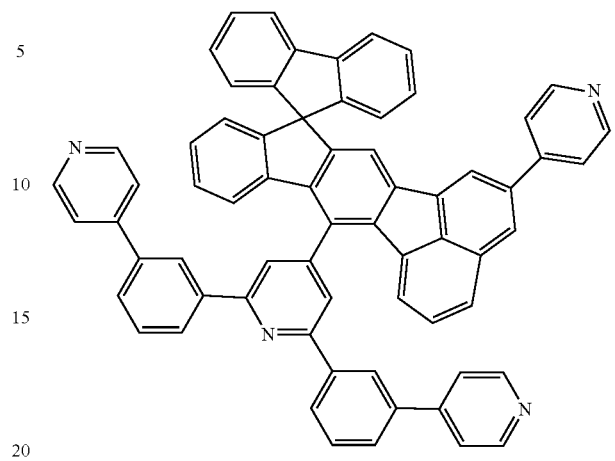
P151
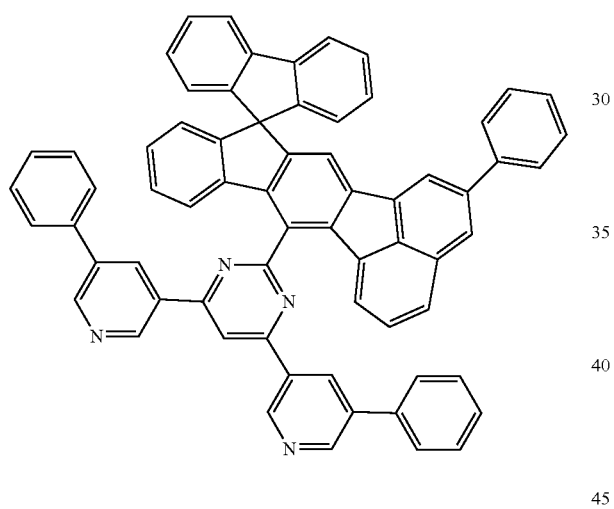
P154
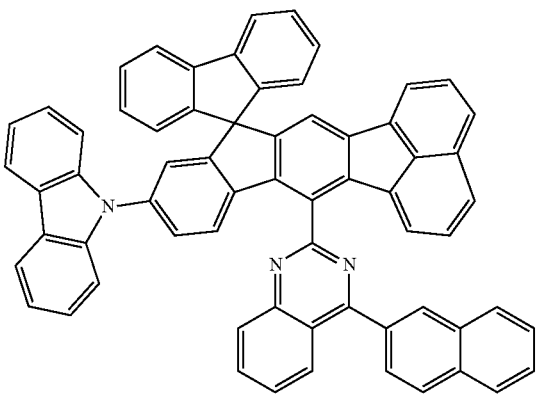
P152
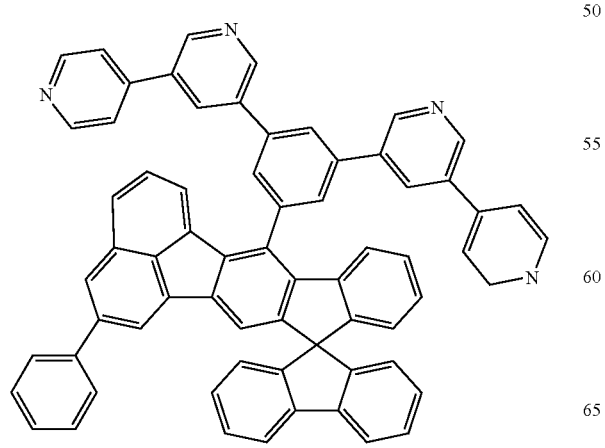
P155
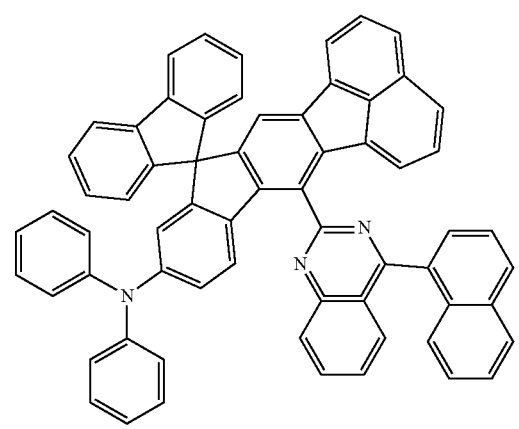

P156
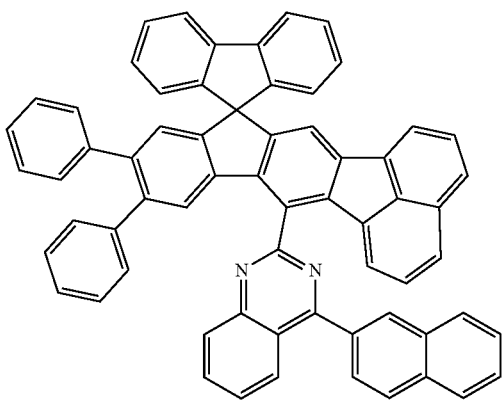
P157
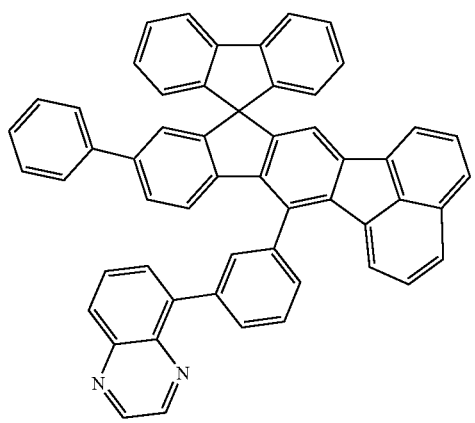
P158
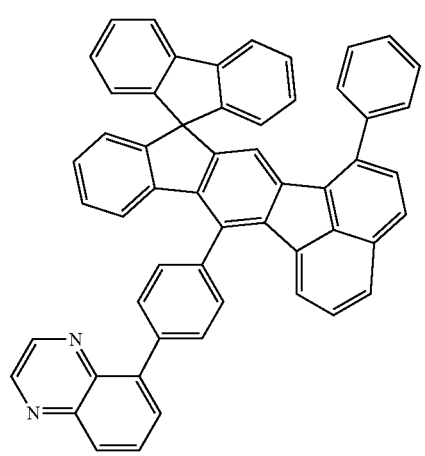
P159
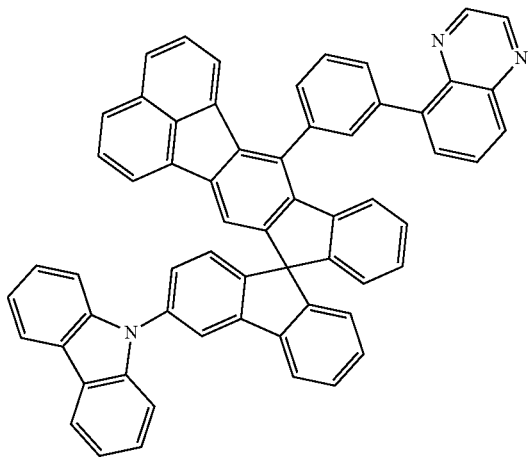
P160
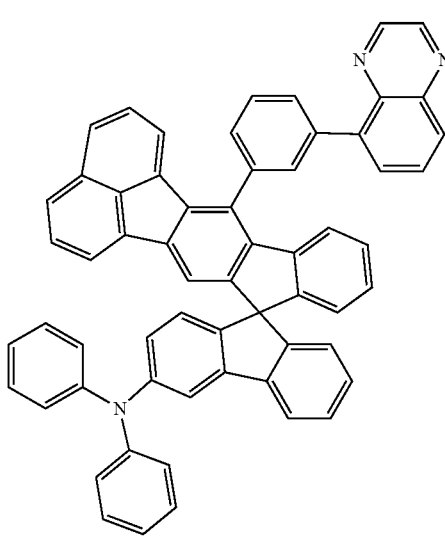

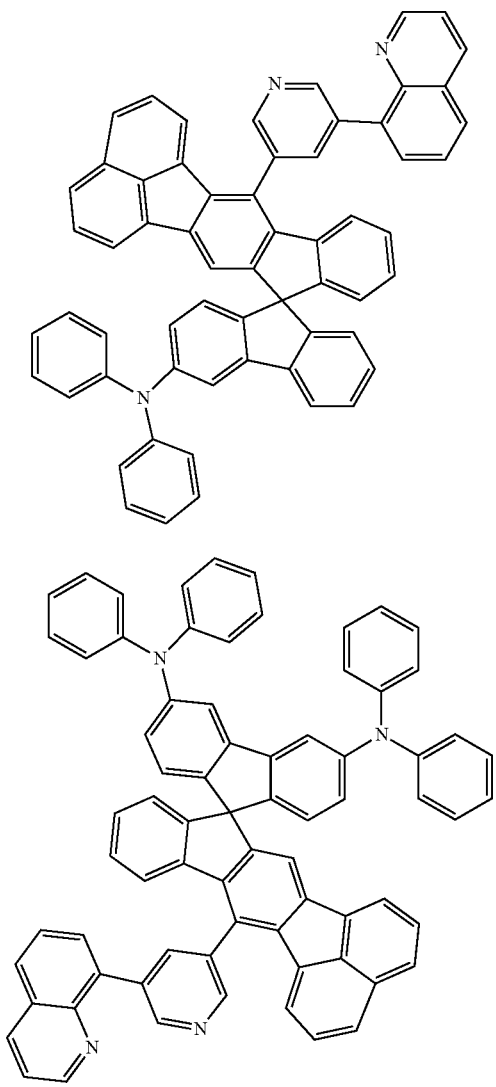

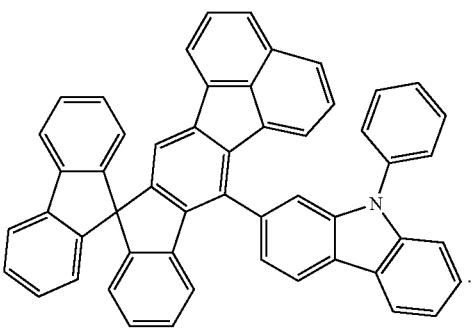

12. An organic light-emitting diode (OLED) device, comprising an anode, a cathode and an organic thin film layer disposed between the anode and the cathode, wherein the organic thin film layer comprises the organic compound according to claim 1.

13. The OLED device according to claim 12, wherein the organic thin film layer comprises a light-emitting layer which comprises the organic compound.

14. The OLED device according to claim 13, wherein each of the organic compounds is used as a green-light host material of the light-emitting layer.

15. The OLED device according to claim 12, wherein the organic thin film layer comprises an electron transport layer which comprises the organic compound.

16. The OLED device according to claim 12, wherein the organic thin film layer comprises a hole blocking layer which comprises the organic compound.

17. A display panel, comprising the OLED device according to claim 12.

18. An electronic apparatus, comprising at least one of the OLED device according to claim 12 or a display panel, wherein the display panel comprises the OLED device.

* * * * *